US012336380B2

(12) United States Patent
Park et al.

(10) Patent No.: US 12,336,380 B2
(45) Date of Patent: Jun. 17, 2025

(54) DISPLAY PANEL, DISPLAY DEVICE, AND METHOD OF MANUFACTURING THE DISPLAY DEVICE

(71) Applicant: SAMSUNG DISPLAY CO., LTD., Yongin-si (KR)

(72) Inventors: Junhyeong Park, Yongin-si (KR); Sangwoo Kim, Yongin-si (KR); Byeonghee Won, Yongin-si (KR); Kyungmin Kim, Yongin-si (KR); Jiyeon Seo, Yongin-si (KR); Jaemin Shin, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/432,425

(22) Filed: Feb. 5, 2024

(65) Prior Publication Data

US 2024/0179939 A1    May 30, 2024

Related U.S. Application Data

(63) Continuation of application No. 17/369,293, filed on Jul. 7, 2021, now Pat. No. 11,895,862.

(30) Foreign Application Priority Data

Nov. 6, 2020  (KR) .................. 10-2020-0147773

(51) Int. Cl.
*H10K 50/844* (2023.01)
*H10K 59/12* (2023.01)
(Continued)

(52) U.S. Cl.
CPC ......... *H10K 50/844* (2023.02); *H10K 59/122* (2023.02); *H10K 59/124* (2023.02);
(Continued)

(58) Field of Classification Search
CPC .. H10K 50/844; H10K 59/122; H10K 59/124; H10K 71/00; H10K 77/111;
(Continued)

(56) References Cited

U.S. PATENT DOCUMENTS 9,190,630 B2    11/2015  Kim et al.
10,644,087 B2    5/2020  Lee et al.
(Continued)

FOREIGN PATENT DOCUMENTS

EP    3926701 A1    12/2021
JP    2020098792 A    6/2020
(Continued)

*Primary Examiner* — J. E. Schoenholtz
(74) *Attorney, Agent, or Firm* — CANTOR COLBURN LLP

(57) ABSTRACT

A display panel including a corner includes: a substrate including a display area including a front display area, and a peripheral area outside the display area; an insulating layer on the substrate in the display area and the peripheral area, where an outer groove or an outer through hole is defined in the insulating layer in the peripheral area; an upper inorganic pattern layer on the insulating layer, where the upper inorganic pattern layer includes a protruding tip protruding toward a center of the outer groove or a center of the outer through hole; and a front display element on the insulating layer and overlapping the front display area. The upper inorganic pattern layer is apart from the front display element.

20 Claims, 42 Drawing Sheets

(51) Int. Cl.
  *H10K 59/122* (2023.01)
  *H10K 59/124* (2023.01)
  *H10K 71/00* (2023.01)
  *H10K 77/10* (2023.01)
  *H10K 102/00* (2023.01)

(52) U.S. Cl.
  CPC ........... *H10K 71/00* (2023.02); *H10K 77/111* (2023.02); *H10K 59/1201* (2023.02); *H10K 2102/311* (2023.02)

(58) Field of Classification Search
  CPC ......... H10K 59/1201; H10K 2102/311; H10K 59/131; H10K 59/8731; Y02E 10/549
  See application file for complete search history.

(56) References Cited

U.S. PATENT DOCUMENTS

| | | | |
|---|---|---|---|
| 10,978,672 | B2 | 4/2021 | Lee et al. |
| 11,355,728 | B2 | 6/2022 | Kim et al. |
| 11,528,812 | B2 | 12/2022 | Ahn et al. |
| 11,895,862 | B2 * | 2/2024 | Park .................... H10K 71/00 |
| 2016/0315284 | A1 | 10/2016 | Jeon |
| 2018/0097200 | A1 | 4/2018 | Park et al. |
| 2019/0081273 | A1 | 3/2019 | Sung et al. |
| 2019/0245015 | A1 | 8/2019 | Lee et al. |
| 2020/0168683 | A1 | 5/2020 | Son et al. |
| 2020/0328376 | A1 | 10/2020 | Seo et al. |
| 2022/0020957 | A1 | 1/2022 | Choi |
| 2022/0020958 | A1 | 1/2022 | Okabe et al. |

FOREIGN PATENT DOCUMENTS

| | | |
|---|---|---|
| KR | 101978783 B1 | 5/2019 |
| KR | 20190096467 A | 8/2019 |
| KR | 20200003336 A | 1/2020 |
| KR | 102083315 B1 | 2/2020 |
| KR | 1020200036158 A | 4/2020 |
| KR | 1020200060002 A | 5/2020 |
| KR | 20200063379 A | 6/2020 |
| KR | 20200067576 A | 6/2020 |
| WO | 2020166793 A1 | 8/2020 |
| WO | 2020174612 A1 | 9/2020 |

* cited by examiner

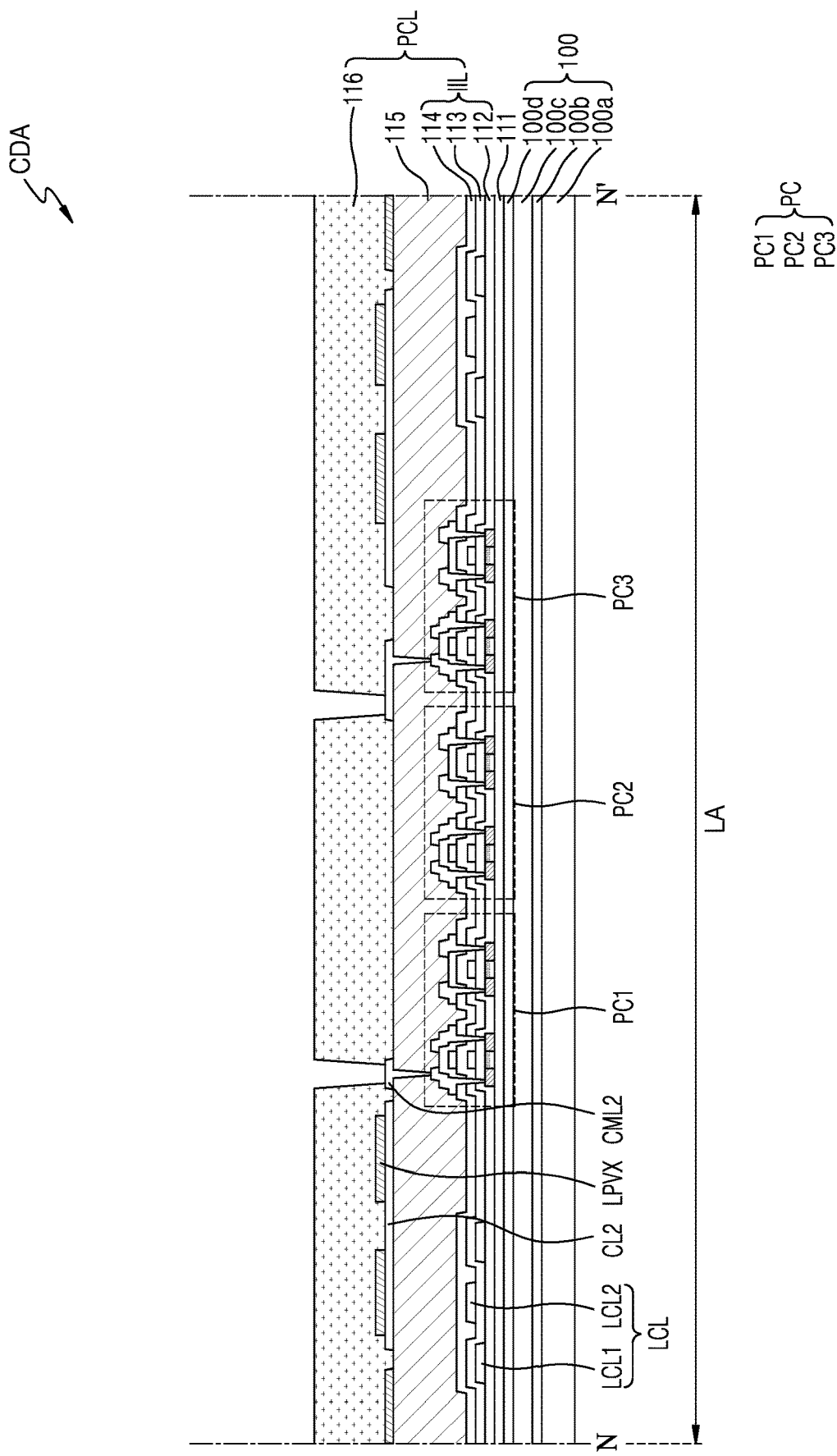

DISPLAY PANEL, DISPLAY DEVICE, AND METHOD OF MANUFACTURING THE DISPLAY DEVICE

This application is a continuation of U.S. patent application Ser. No. 17/369,293, filed on Jul. 7, 2021, which claims priority to Korean Patent Application No. 10-2020-0147773, filed on Nov. 6, 2020, and all the benefits accruing therefrom under 35 U.S.C. § 119, the content of which in its entirety is herein incorporated by reference.

BACKGROUND

1. Field

One or more embodiments relate to a display panel having an expanded display area, in which an image is displayed, a display device including the display panel, and a method of manufacturing the display device.

2. Description of Related Art

Mobile electronic devices are widely used. As mobile electronic devices, not only small electronic devices such as mobile phones but also tablet personal computers ("PC"s), have been widely used in recent years.

Such mobile electronic devices typically include display devices to provide various functions, for example, to provide visual information such as images or videos to users. Recently, as other parts for driving display devices are miniaturized, the relative size of a display area of the display devices in electronic devices has gradually been increasing. A structure that is bendable to have a certain angle in a flat state is also under development.

A display panel for displaying an image in a display device may have various curvatures, for example. Such a display panel may include, for example, a front display area, a first side display area that is bendable and extends from the front display area in a first direction, and a second side display area that is bendable and extends from the front display area in a second direction.

SUMMARY

One or more embodiments include a display panel having an expanded display area in which an image is displayed and having improved reliability, and a display device including the display panel.

One or more embodiments include a display panel and a display device, in which a bendable corner display area is arranged to correspond to a corner of the display panel and the reliability thereof is improved, and a method of manufacturing the display device.

According to one or more embodiments, a display panel including a corner includes: a substrate including a display area including a front display area, and a peripheral area outside the display area; an insulating layer on the display area and the peripheral area, where an outer groove or an outer through hole is defined in the insulating layer in the peripheral area; an upper inorganic pattern layer on the insulating layer, where the upper inorganic pattern layer includes a protruding tip protruding toward a center of the outer groove or a center of the outer through hole; and a front display element on the insulating layer and overlapping the front display area, where the upper inorganic pattern layer is apart from the front display element.

According to an embodiment, an upper opening may be defined through the upper inorganic pattern layer to overlap the front display area.

According to an embodiment, the upper inorganic pattern layer may include a first upper inorganic pattern layer and a second upper inorganic pattern layer, which are apart from each other, and a first protruding tip of the first upper inorganic pattern layer and a second protruding tip of the second upper inorganic pattern layer may face each other with the outer groove or the outer through hole therebetween.

According to an embodiment, the display panel may further include a lower insulating layer between the substrate and the insulating layer, a line between the lower insulating layer and the insulating layer, and a lower inorganic pattern layer on the line and overlapping the outer groove or the outer through hole.

According to an embodiment, the lower inorganic pattern layer may extend between the lower insulating layer and the insulating layer, and the lower inorganic pattern layer may be apart from the front display area.

According to an embodiment, the display panel may further include an organic pattern layer on the upper inorganic pattern layer and overlapping the peripheral area, and an encapsulation layer on the front display element, where the encapsulation layer may include an inorganic encapsulation layer and an organic encapsulation layer, where the inorganic encapsulation layer may extend from the front display area to the organic pattern layer and may be in contact with the protruding tip.

According to an embodiment, the display area may further include a corner display area at the corner and between the front display area and the peripheral area, and the upper inorganic pattern layer may extend between the front display area and the corner display area.

According to an embodiment, the display panel may further include a corner display element on the insulating layer and overlapping the corner display area, and a first corner inorganic pattern layer between the insulating layer and the corner display element.

According to an embodiment, a hole may be defined through the insulating layer to overlap the corner display area, the display panel may further include a second corner inorganic pattern layer apart from the first corner inorganic pattern layer on the insulating layer with the hole therebetween, and each of the first corner inorganic pattern layer and the second corner inorganic pattern layer may include a protruding tip protruding toward a center of the hole.

According to an embodiment, the substrate may include a first extension area and a second extension area, where each of the first extension area and the second extension area may overlap at least a portion of the corner display area and extend in a direction away from the front display area, and a penetrating portion penetrating through the display panel may be defined between the first extension area and the second extension area.

According to one or more embodiments, a display device includes a display panel including a corner, and a cover window on the display panel, where the display panel includes: a substrate including a display area including a front display area and a corner display area bent at the corner, and a peripheral area outside the display area; an insulating layer on the display area, where an outer groove or an outer through hole is defined in the insulating layer in the peripheral area; an upper inorganic pattern layer on the insulating layer, where the upper inorganic pattern layer includes a protruding tip protruding toward a center of the outer groove or a center of the outer through hole; a front display element on the insulating layer and overlapping the front display area; and a corner display element on the insulating layer and overlapping the corner display area, and the upper inorganic pattern layer extends between the front display area and the corner display area.

According to an embodiment, an upper opening may be defined through the upper inorganic pattern layer to overlap the front display area.

According to an embodiment, the upper inorganic pattern layer may include a first upper inorganic pattern layer and a second upper inorganic pattern layer, which are apart from each other, and a protruding tip of the first upper inorganic pattern layer and a protruding tip of the second upper inorganic pattern layer may face each other with the outer groove or the outer through hole therebetween.

According to an embodiment, the display panel may further include a lower insulating layer between the substrate and the insulating layer, a line between the lower insulating layer and the insulating layer, and a lower inorganic pattern layer on the line and overlapping the outer groove or the outer through hole.

According to an embodiment, the lower inorganic pattern layer may extend between the lower insulating layer and the insulating layer, and the lower inorganic pattern layer may be apart from the front display area.

According to an embodiment, the display panel may further include an organic pattern layer on the upper inorganic pattern layer and overlapping the peripheral area, and an encapsulation layer on the front display element, where the encapsulation layer includes an inorganic encapsulation layer and an organic encapsulation layer, and the inorganic encapsulation layer may extend from the front display element to the organic pattern layer and is in contact with the protruding tip.

According to an embodiment, the display panel may further include a first corner inorganic pattern layer between the insulating layer and the corner display element.

According to an embodiment, a hole may be defined through the insulating layer to overlap the corner display area, the display panel may further include a second corner inorganic pattern layer apart from the first corner inorganic pattern layer on the insulating layer with the hole therebetween, and each of the first corner inorganic pattern layer and the second corner inorganic pattern layer may include a protruding tip protruding toward a center of the hole.

According to an embodiment, the substrate may include a plurality of extension areas overlapping at least a portion of the corner display area and extending in a direction away from the front display area.

According to an embodiment, the display area may further include a first side display area connected to the front display area in a first direction and bent with a first radius of curvature, and a second side display area connected to the front display area in a second direction intersecting with the first direction and bent with a second radius of curvature, which is different from the first radius of curvature, the corner display area may be arranged to surround at least a portion of the front display area between the first side display area and the second side display area, and the upper inorganic pattern layer may surround at least a portion the front display area, the first side display area, and the second side display area.

According to one or more embodiments, a method of manufacturing a display device including a corner includes preparing a display substrate including a substrate and a line on the substrate, where the substrate includes: a display area including a front display area and a corner display area at the corner; and a peripheral area outside the display area, providing an insulating layer on the substrate to overlap the display area and the peripheral area and to cover the line, providing an upper inorganic pattern layer including a first upper inorganic pattern layer and a second upper inorganic pattern layer, which overlap the peripheral area and are apart from each other on the insulating layer, and forming an outer groove of the insulating layer or an outer through hole of the insulating layer between the first upper inorganic pattern layer and the second upper inorganic pattern layer, where the upper inorganic pattern layer surrounds the front display area.

According to an embodiment, the upper inorganic pattern layer may extend between the front display area and the corner display area from the peripheral area.

According to an embodiment, the forming the outer groove of the insulating layer or the outer through hole in the insulating layer may include providing a first organic pattern layer and a second organic pattern layer on the first upper inorganic pattern layer and the second upper inorganic pattern layer, respectively, providing a first protective layer and a second protective layer, which cover the first organic pattern layer and the second organic pattern layer, respectively, and are apart from each other, etching the insulating layer exposed between the first protective layer and the second protective layer, and removing the first protective layer and the second protective layer.

According to an embodiment, the providing the first protective layer and the second protective layer may include providing a front protective layer overlapping the front display area, and the removing the first protective layer and the second protective layer may include removing the front protective layer.

According to an embodiment, the method may further include providing an encapsulation layer on the substrate, where the encapsulation layer may include an inorganic encapsulation layer and an organic encapsulation layer, where the inorganic encapsulation layer may be in contact with at least one selected from the first upper inorganic pattern layer and the second upper inorganic pattern layer.

According to an embodiment, the method may further include providing a pixel electrode on the display area after the providing the first upper inorganic pattern layer and the second upper inorganic pattern layer.

According to an embodiment, the method may further include providing a first corner inorganic pattern layer and a second corner inorganic pattern layer, which overlap the corner display area and are apart from each other on the insulating layer, providing a pixel electrode on the first corner inorganic pattern layer, and forming a hole in the insulating layer between the first corner inorganic pattern layer and the second corner inorganic pattern layer.

According to an embodiment, the forming the hole in the insulating layer may include providing a pixel defining layer covering an edge of the pixel electrode and providing a corner organic pattern layer on the second corner inorganic pattern layer, providing a first corner protective layer and a second corner protective layer, which cover the pixel defining layer and the corner organic pattern layer, respectively, and are apart from each other, etching the insulating layer exposed between the first corner protective layer and the second corner protective layer, and removing the first corner protective layer and the second corner protective layer.

According to an embodiment, the first corner inorganic pattern layer and the second corner inorganic pattern layer may be formed simultaneously with the upper inorganic pattern layer.

According to an embodiment, the method may further include bending the corner display area overlapping the corner, and arranging a cover window on the corner display area.

According to one or more embodiments, a display panel includes a substrate including a front display area and a peripheral area outside the front display area, a pixel circuit on the substrate, where the pixel circuit includes a thin-film transistor overlapping the front display area, a line on the substrate and overlapping the peripheral area, a lower inorganic pattern layer on the line and apart from the thin-film transistor, an insulating layer arranged to cover the thin-film transistor, where an outer through hole is defined through the insulating layer to expose the lower inorganic pattern layer, an upper inorganic pattern layer on the insulating layer to be apart from the front display area, where the upper inorganic pattern layer includes a protruding tip protruding toward a center of the outer through hole, an outer dam on the upper inorganic pattern layer, where the outer dam includes a first organic pattern layer, and a display element on the insulating layer, where the display element includes a pixel electrode overlapping the front display area.

According to an embodiment, the lower inorganic pattern layer and the upper inorganic pattern layer may not overlap the front display area.

According to an embodiment, the display panel may further include an outer auxiliary dam on the upper inorganic pattern layer, where the outer auxiliary dam may include a second organic pattern layer apart from the first organic pattern layer, and the outer through hole may be between the outer dam and the outer auxiliary dam.

According to an embodiment, the display panel may further include a pixel defining layer covering an edge of the pixel electrode, where an opening may be defined through the pixel defining layer to expose a central portion of the pixel electrode, the display element may further include an emission layer and an opposite electrode on the pixel electrode, and the pixel defining layer may include a same material as the first organic pattern layer.

BRIEF DESCRIPTION OF THE DRAWINGS

The above and other features of the invention will be more apparent by describing in further detail embodiments thereof with reference to the accompanying drawings, in which:

FIGS. 18B to 18E are cross-sectional views illustrating a method of manufacturing a display device, according to an embodiment;

DETAILED DESCRIPTION

Figure 1:
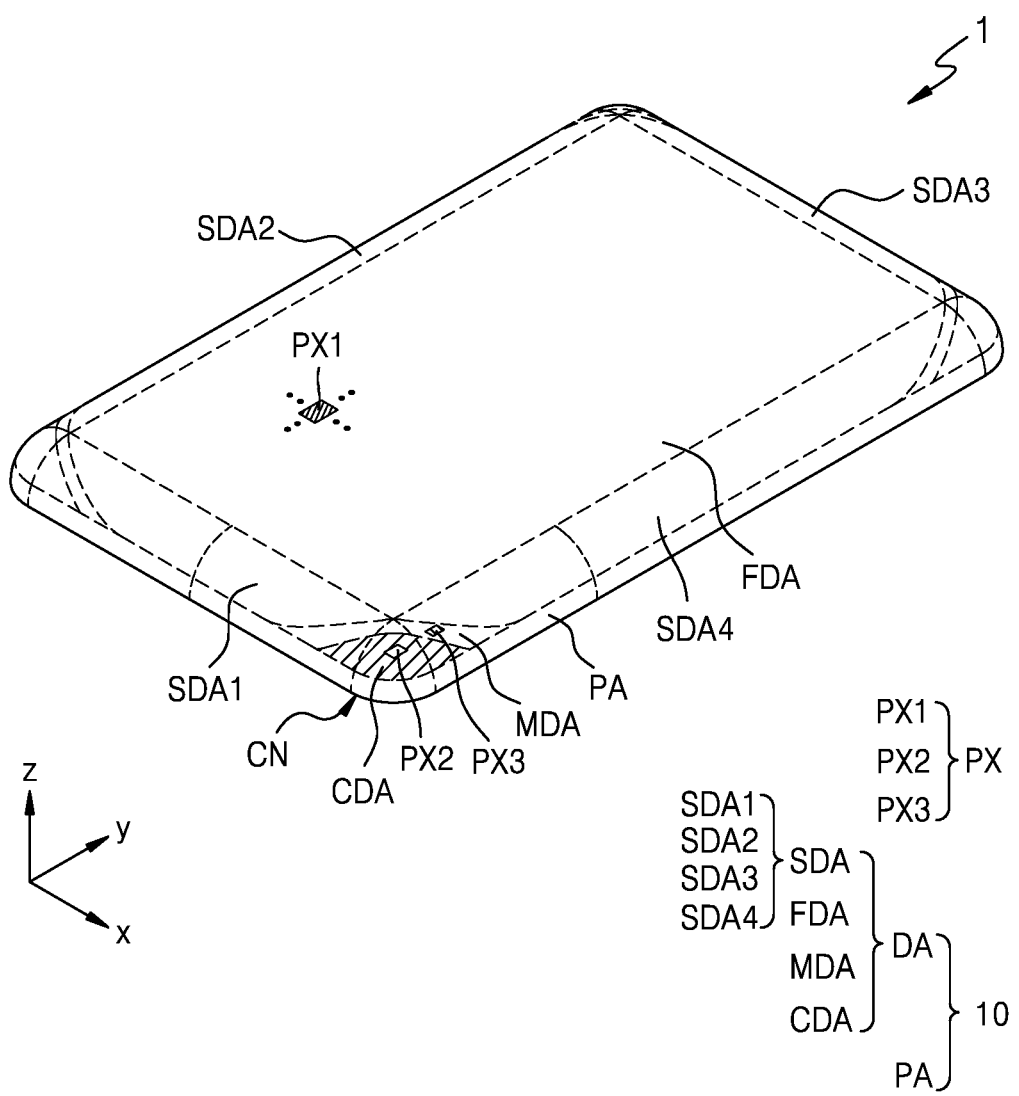
FIG. 1 is a schematic perspective view of a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

As the present description allows for various changes and numerous embodiments, certain embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

The embodiments of the disclosure will be described below in more detail with reference to the accompanying drawings. Those elements that are the same or are in correspondence with each other are rendered the same reference numeral regardless of the figure number, and redundant explanations are omitted.

It will be understood that although the terms "first," "second," etc. may be used herein to describe various elements, these elements should not be limited by these terms. These terms are only used to distinguish one element from another.

It will be understood that when an element is referred to as being "on" another element, it can be directly on the other element or intervening elements may be present therebetween. In contrast, when an element is referred to as being "directly on" another element, there are no intervening elements present.

Sizes of elements in the drawings may be exaggerated or reduced for convenience of explanation. For example, because sizes and thicknesses of elements in the drawings are arbitrarily illustrated for convenience of explanation, the disclosure is not limited thereto.

When a certain embodiment may be implemented differently, a specific process order may be performed differently from the described order. For example, two consecutively described processes may be performed substantially at the same time or performed in an order opposite to the described order.

It will be further understood that, when layers, regions, or components are referred to as being connected to each other, they may be directly connected to each other or indirectly connected to each other with intervening layers, regions, or components therebetween. For example, when layers, regions, or components are referred to as being electrically connected to each other, they may be directly electrically connected to each other or indirectly electrically connected to each other with intervening layers, regions, or components therebetween.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2A:
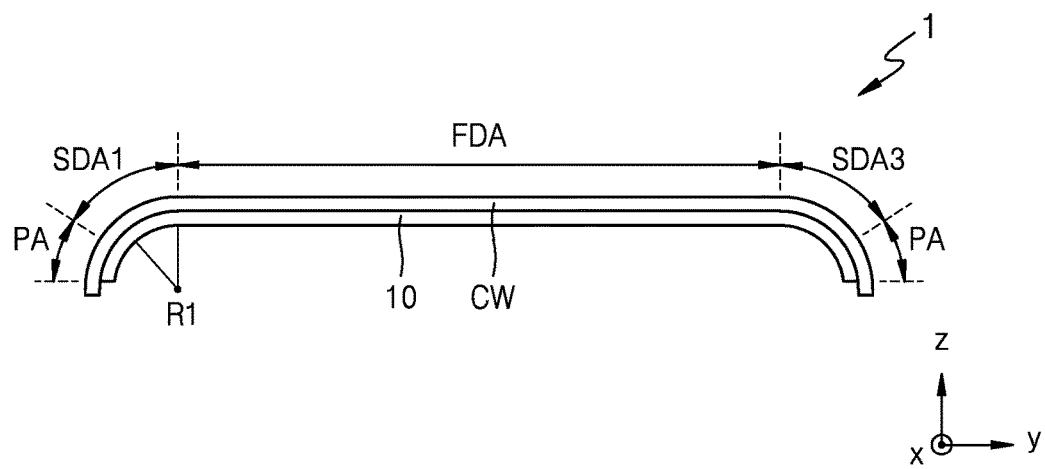
FIGS. 2A, 2B, and 2C are schematic cross-sectional views of the display device according to an embodiment.
Figure 2B:
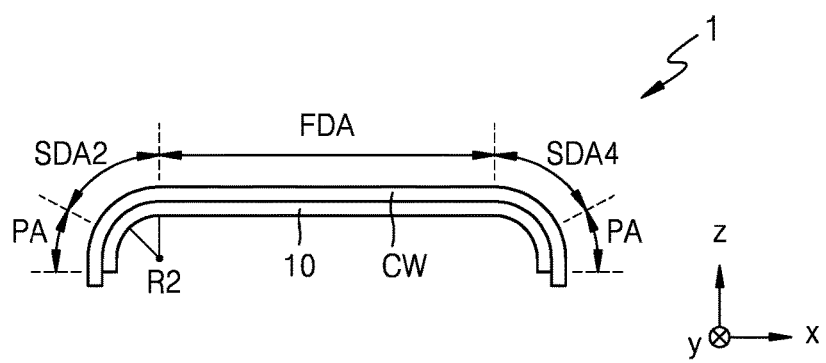
Figure 2C:
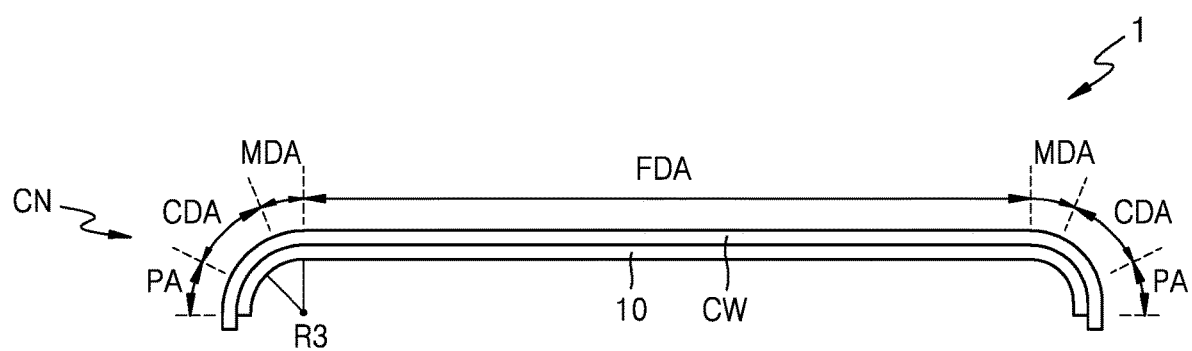

FIG. 1 is a schematic perspective view of a display device 1 according to an embodiment. FIGS. 2A, 2B, and 2C are schematic cross-sectional views of the display device 1 according to an embodiment. FIG. 2A is a cross-sectional view of the display device 1 in the y direction of FIG. 1. FIG. 2B is a cross-sectional view of the display device 1 in the x direction of FIG. 1. FIG. 2C is a cross-sectional view of a corner display area CDA on opposing sides of a front display area FDA in the display device 1.

Referring to FIGS. 1 and 2A to 2C, an embodiment of the display device 1 is configured to display a moving image or a still image and may defined a display screen for various products or devices, including not only portable electronic devices, such as mobile phones, smartphones, tablet personal computers ("PC"s), mobile communication terminals, electronic notebooks, e-books, portable multimedia players ("PMP"s), navigations, and ultra mobile PCs ("UMPC"s), and but also televisions ("TV"s), laptops, monitors, billboards, and internet of things ("IoT") devices. An embodiment of the display device 1 may also be used in wearable devices, such as smart watches, watch phones, glasses-type displays, or head mounted displays ("HMD"s). An embodiment of the display device 1 may also be used as dashboards of automobiles, center information displays ("CID"s) on the center fascia or dashboards of automobiles, room mirror displays that replace side mirrors of automobiles, and displays arranged on the rear sides of front seats to serve as entertainment devices for backseat passengers of automobiles.

According to an embodiment, the display device 1 may have a long side in a first direction and a short side in a second direction. The first direction and the second direction may intersect with each other. In one embodiment, for example, the first direction and the second direction may form an acute angle to each other. In one alternative embodiment, for example, the first direction and the second direction may form an obtuse angle or a right angle to each other. Hereinafter, for convenience of description, embodiments in which the first direction (e.g., y direction or −y direction) and the second direction (e.g., x direction and −x direction) form a right angle to each other will be described in detail.

According to an alternative embodiment, in the display device 1, a length of a side in the first direction (e.g., y direction or −y direction) may be equal to a length of a side in the second direction (e.g., x direction or −x direction). According to another alternative embodiment, the display device 1 may have a short side in the first direction (e.g., y direction or −y direction) and a long side in the second direction (e.g., x direction or −x direction).

A corner at which the long side in the first direction (e.g., y direction or −y direction) and the short side in the second direction (e.g., x direction or −x direction) meet may be round to have a certain curvature. Herein, a third direction (e.g., z direction or −z direction) may be a direction perpendicular to the first and second directions, and may be a thickness direction of the display device 1.

In an embodiment, the display device 1 may include a display panel 10 and a cover window CW. In such an embodiment, the cover window CW may protect the display panel 10.

The cover window CW may be flexible or include a flexible material. The cover window CW may protect the display panel 10 while being easily bent according to external force without generating cracks or the like. The cover window CW may include glass, sapphire, or plastic. In an embodiment, the cover window CW may include, for example, tempered glass (e.g., ultra thin glass ("UTG")) or colorless polyimide ("CPI"). According to an embodiment, the cover window CW may have a structure in which a flexible polymer layer is on one surface of a glass substrate, or may include only a polymer layer.

The display panel 10 may be below the cover window CW. In an embodiment, although not illustrated, the display panel 10 may be bonded to the cover window CW by a transparent adhesive member such as an optically clear adhesive ("OCA") film.

The display panel 10 may include a display area DA, in which an image is displayed, and a peripheral area PA surrounding the display area DA. A plurality of pixels PX may be arranged in the display area DA, and an image may be displayed through the pixels PX. Each of the pixels PX may include subpixels. In one embodiment, for example, each of the pixels PX may include a red subpixel, a green subpixel, and a blue subpixel. Alternatively, each of the pixels PX may include a red subpixel, a green subpixel, a blue subpixel, and a white subpixel.

In an embodiment, as shown in FIG. 1, the display area DA may include a front display area FDA, a side display area SDA, a corner display area CDA, and a middle display area MDA. The pixels PX arranged in the display area DA may display an image. According to an embodiment, the pixels PX of the front display area FDA, the side display area SDA, the corner display area CDA, and the middle display area MDA may provide independent images, respectively. According to an alternative embodiment, the pixels PX of the front display area FDA, the side display area SDA, the corner display area CDA, and the middle display area MDA may provide portions of one image, respectively.

The front display area FDA is a flat display area, and a first pixel PX1 including a display element may be arranged in the front display area FDA. According to an embodiment, the front display area FDA may have the greatest area and provide most of an image.

The pixel PX including a display element may be arranged in the side display area SDA. Therefore, the side display area SDA may display an image. According to an embodiment, the side display area SDA may include a first side display area SDA1, a second side display area SDA2, a third side display area SDA3, and a fourth side display area SDA4. According to some embodiments, at least one selected from the first side display area SDA1, the second side display area SDA2, the third side display area SDA3, and the fourth side display area SDA4 may be omitted.

The first side display area SDA1 and the third side display area SDA3 may be connected to the front display area FDA in the first direction (e.g., y direction or −y direction). In one embodiment, for example, the first side display area SDA1 may be connected in the −y direction from the front display area FDA, and the third side display area SDA3 may be connected in the y direction from the front display area FDA.

The first side display area SDA1 and the third side display area SDA3 may have a radius of curvature and may be bendable. According to an embodiment, the first side display area SDA1 and the third side display area SDA3 may have different radii of curvature from each other. According to an alternative embodiment, the first side display area SDA1 and the third side display area SDA3 may have the same radius of curvature as each other. Hereinafter, for convenience of description, embodiments where the first side display area SDA1 and the third side display area SDA3 have the same radius of curvature as each other, that is, the first radius R1 of curvature, will be described in detail. Also, because the first side display area SDA1 and the third side display area SDA3 are identical to or similar to each other, the first side display area SDA1 will hereinafter be mainly described, and any repetitive detailed description of the third side display area SDA3 will be simplified or omitted.

The second side display area SDA2 and the fourth side display area SDA4 may be connected to the front display area FDA in the second direction (e.g., x direction or −x direction). In one embodiment, for example, the second side display area SDA2 may be connected in the −x direction from the front display area FDA, and the fourth side display area SDA4 may be connected in the y direction from the front display area FDA.

The second side display area SDA2 and the fourth side display area SDA4 may have a radius of curvature and may be bendable. According to an embodiment, the second side display area SDA2 and the fourth side display area SDA4 may have different radii of curvature from each other. According to an alternative embodiment, the second side display area SDA2 and the fourth side display area SDA4 may have the same radius of curvature as each other. Hereinafter, for convenience of description, embodiments where the second side display area SDA2 and the fourth side display area SDA4 have the same radius of curvature as each other, that is, the second radius R2 of curvature, will be described. Also, because the second side display area SDA2 and the fourth side display area SDA4 are identical to or similar to each other, the second side display area SDA2 will hereinafter be mainly described, and any repetitive detailed description of the fourth side display area SDA4 will be simplified or omitted.

According to an embodiment, the first radius R1 of curvature of the first side display area SDA1 may be different from the second radius R2 of curvature of the second side display area SDA2. In one embodiment, for example, the first radius R1 of curvature may be less than the second radius R2 of curvature. In one alternative embodiment, for example, the first radius R1 of curvature may be greater than the second radius R2 of curvature. According to another alternative embodiment, the first radius R1 of curvature of the first side display area SDA1 may be equal to the second radius R2 of curvature of the second side display area SDA2. Hereinafter, embodiments where the first radius R1 of curvature is greater than the second radius R2 of curvature will be mainly described, but not being limited thereto.

The corner display area CDA may be arranged at a corner CN of the display panel 10 and may be bendable. That is, the corner display area CDA may be arranged to correspond to the corner CN. The corner CN may be a portion in which a long side of the display device 1 and/or the display panel 10 in the first direction (e.g., y direction or −y direction) and a short side of the display device 1 and/or the display panel 10 in the second direction (e.g., x direction or −x direction) meet each other. The corner display area CDA may be between the neighboring side display areas SDA. In one embodiment, for example, the corner display area CDA may be between the first side display area SDA1 and the second side display area SDA2. In such an embodiment, the corner display area CDA may be between the second side display area SDA2 and the third side display area SDA3, between the third side display area SDA3 and the fourth side display area SDA4, or between the fourth side display area SDA4 and the first side display area SDA1. In such embodiments, the side display area SDA and the corner display area CDA may surround at least a portion of the front display area FDA and may be bendable.

A second pixel PX2 including a display element may be arranged in the corner display area CDA. Therefore, the corner display area CDA may display an image.

In an embodiment, where the first radius R1 of curvature of the first side display area SDA1 and the second radius R2 of curvature of the second side display area SDA2 are different from each other, the radius of curvature of the corner display area CDA may gradually change. According to an embodiment, where the first radius R1 of curvature of the first side display area SDA1 is greater than the second radius R2 of curvature of the second side display area SDA2, the radius of curvature of the corner display area CDA may gradually decrease in a direction from the first side display area SDA1 to the second side display area SDA2. In one embodiment, for example, the third radius R3 of curvature of the corner display area CDA may be less than the first radius R1 of curvature and greater than the second radius R2 of curvature.

The middle display area MDA may be between the corner display area CDA and the front display area FDA. According to an embodiment, the middle display area MDA may extend between the side display area SDA and the corner display area CDA. In one embodiment, for example, the middle display area MDA may extend between the first side display area SDA1 and the corner display area CDA. In such an embodiment, the middle display area MDA may extend between the second side display area SDA2 and the corner display area CDA.

The middle display area MDA may include a third pixel PX3. In an embodiment, a driving circuit configured to provide an electrical signal and/or a power line configured to provide power may be arranged in the middle display area MDA, and the third pixel PX3 may overlap the driving circuit and/or the power line. In such an embodiment, the display element of the third pixel PX3 may be above the driving circuit and/or the power line. According to an alternative embodiment, the driving circuit and/or the power line may be arranged in the peripheral area PA, and the third pixel PX3 may not overlap the driving circuit or the power line.

In such an embodiment, the display device 1 may display an image not only in the front display area FDA but also in the side display area SDA, the corner display area CDA, and the middle display area MDA. Therefore, the proportion occupied by the display area DA in the display device 1 may increase. In such an embodiment, because the display device 1 includes the corner display area CDA that is bendable at the corner and displays an image, the aesthetic sense may be improved.

Figure 3:
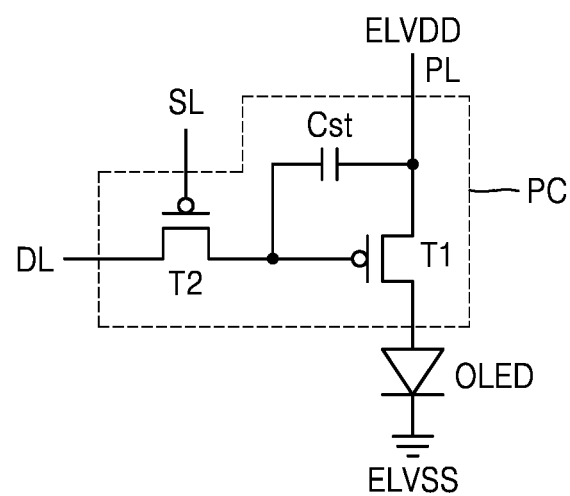
FIG. 3 is a schematic equivalent circuit diagram of an embodiment of a pixel circuit in a display panel.

FIG. 3 is a schematic equivalent circuit diagram of an embodiment of a pixel circuit PC in a display panel.

Referring to FIG. 3, in an embodiment, the pixel circuit PC may be connected to a display element, for example, an organic light-emitting diode OLED.

An embodiment of the pixel circuit PC may include a driving thin-film transistor T1, a switching thin-film transistor T2, and a storage capacitor Cst. The organic light-emitting diode OLED may emit red light, green light, or blue light, or may emit red light, green light, blue light, or white light.

The switching thin-film transistor T2 may be connected to a scan line SL and a data line DL and may be configured to transmit, to the driving thin-film transistor T1, a data voltage or a data voltage input from the data line DL, based on a scan signal or a switching voltage input thereto through the scan line SL. The storage capacitor Cst may be connected to the switching thin-film transistor T2 and a driving voltage line PL and may be configured to store a voltage corresponding to a difference between a voltage received from the switching thin-film transistor T2 and a first power supply voltage ELVDD supplied thereto through the driving voltage line PL.

The driving thin-film transistor T1 may be connected to the driving voltage line PL and the storage capacitor Cst and may be configured to control a driving current flowing from the driving voltage line PL to the organic light-emitting diode OLED in response to a voltage value stored in the storage capacitor Cst. The organic light-emitting diode OLED may emit light having a luminance corresponding to the driving current. An opposite electrode of the organic light-emitting diode OLED may be configured to receive a second power supply voltage ELVSS.

FIG. 3 illustrates an embodiment where the pixel circuit PC includes two thin-film transistors and a single storage capacitor, but not being limited thereto. Alternatively, the pixel circuit PC may include three or more thin-film transistors.

Figure 4:
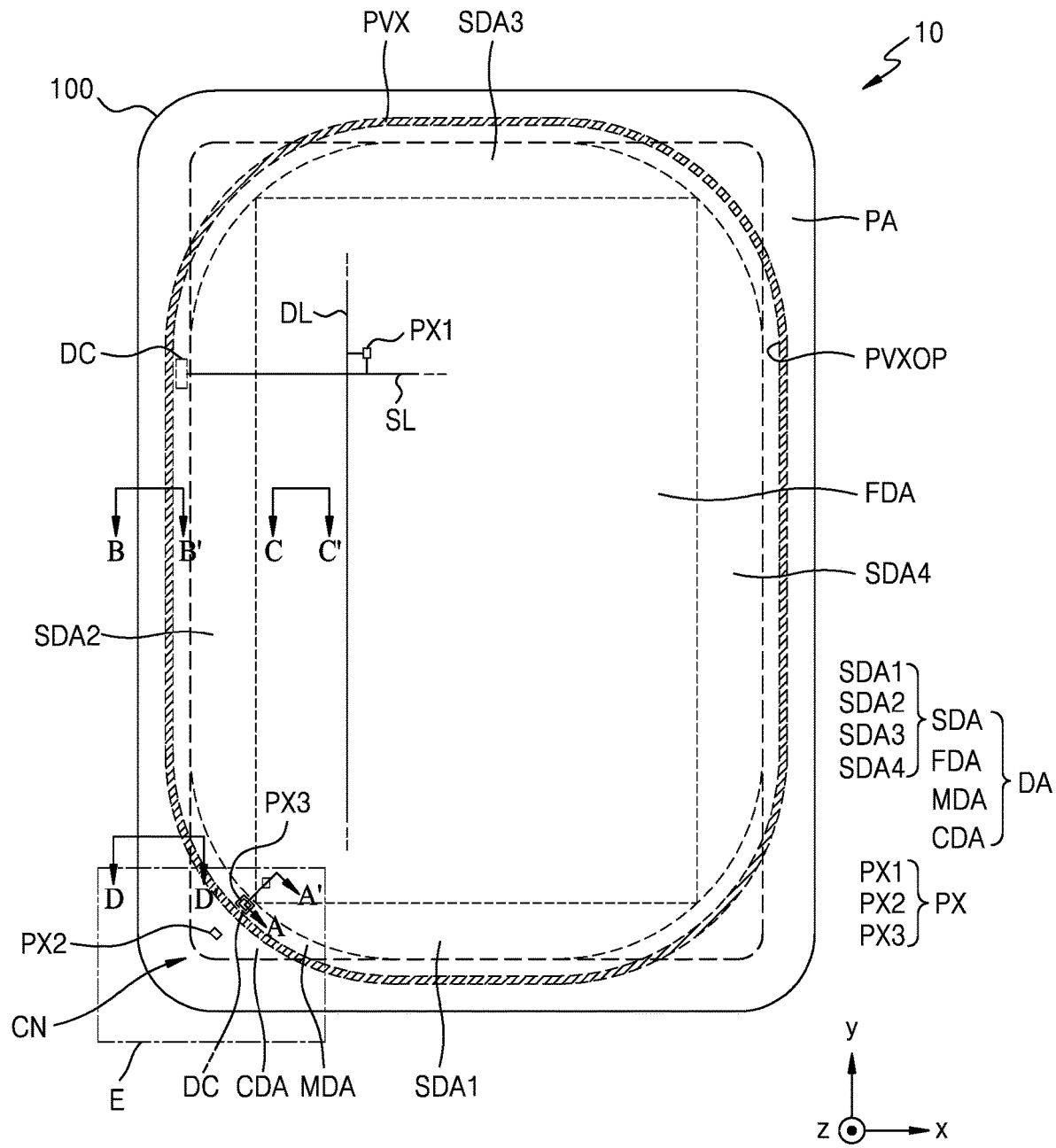
FIG. 4 is a schematic plan view of a display panel according to an embodiment.

FIG. 4 is a schematic plan view of the display panel 10 according to an embodiment. FIG. 4 is a plan view schematically illustrating a shape of the display panel 10 before the corner display area CDA is bent, that is, an unbend shape of the display panel 10.

Referring to FIG. 4, an embodiment of the display panel 10 may include a display element. In such an embodiment, the display panel 10 may be an organic light-emitting display panel using an organic light-emitting diode including an organic emission layer, a micro light-emitting diode ("LED") display panel using a micro LED, a quantum dot light-emitting display panel using a quantum dot light-emitting diode including a quantum dot emission layer, or an inorganic light-emitting display panel using an inorganic light-emitting element including inorganic semiconductor, for example. Hereinafter, for convenience of description, embodiments where the display panel 10 is an organic light-emitting display panel using an organic light-emitting diode as a display element will be described in detail.

The display panel 10 may include a display area DA and a peripheral area PA. The display area DA is an area in which a plurality of pixels PX display an image, and the peripheral area PA is an area that surrounds at least a portion of the display area DA. According to an embodiment, the peripheral area PA may entirely surround the display area DA. The display area DA may include a front display area FDA, a side display area SDA, a corner display area CDA, and a middle display area MDA.

Each of the pixels PX may include subpixels, and the subpixels may emit light of a certain color using an organic light-emitting diode as a display element. The subpixel as used herein refers to an emission area as the minimum unit for displaying an image. In an embodiment where an organic light-emitting diode is used as a display element, the emission area may be defined by an opening of a pixel defining layer, which will be described later in detail.

The organic light-emitting diode may emit, for example, red light, green light, or blue light. The organic light-emitting diode may be connected to a pixel circuit including a thin-film transistor and a storage capacitor.

In an embodiment, the display panel 10 may include a substrate 100 and a multilayer film on the substrate 100. In such an embodiment, the display area DA and the peripheral area PA may be defined in the substrate 100 and/or the multilayer film. That is, it may be understood that the substrate 100 and/or the multilayer film may include the front display area FDA, the side display area SDA, the corner display area CDA, the middle display area MDA, and the peripheral area PA. Hereinafter, embodiments where the front display area FDA, the side display area SDA, the corner display area CDA, the middle display area MDA, and the peripheral area PA are defined in the substrate 100 will be described in detail.

The substrate 100 may include glass or a polymer resin such as polyethersulfone, polyarylate, polyetherimide, polyethylene naphthalate, polyethylene terephthalate, polyphenylene sulfide, polyimide, polycarbonate, cellulose triacetate, or cellulose acetate propionate. The substrate 100 including the polymer resin may be flexible, rollable, or bendable. The substrate 100 may have a multilayer structure including a barrier layer and a base layer including at least one selected from the above-described polymer resin.

The peripheral area PA is a non-display area that does not provide an image. A driving circuit DC configured to provide electrical signals to the pixels PX, or a power line configured to provide power to the pixels PX may be arranged in the peripheral area PA. In one embodiment, for example, the driving circuit DC may include a scan driving circuit configured to provide a scan signal to each pixel PX through a scan line SL. Alternatively, the driving circuit DC may include a data driving circuit configured to provide a data signal to each pixel PX through a data line DL. According to an embodiment, the data driving circuit may be adjacent to one side of the display panel 10. In one embodiment, for example, the data driving circuit in the peripheral area PA may be arranged to correspond to the first side display area SDA1.

The peripheral area PA may include a pad portion (not illustrated) to which an electronic element or a printed circuit board may be electrically connected. The pad portion may be exposed by not being covered with an insulating layer and may be electrically connected to a flexible printed circuit board ("FPCB"). The FPCB may electrically connect a controller to a pad portion and may supply a signal or power transmitted from the controller. According to an embodiment, the data driving circuit may be on the FPCB.

A first pixel PX1 including a display element may be arranged in the front display area FDA. The front display area FDA may be a flat portion. According to an embodiment, the front display area FDA may provide most of an image.

A pixel PX including a display element may be arranged in the side display area SDA and may be bendable. In an embodiment, as described above with reference to FIG. 1, the side display area SDA may be an area that is bent from the front display area FDA. The side display area SDA may include a first side display area SDA1, a second side display area SDA2, a third side display area SDA3, and a fourth side display area SDA4.

In an embodiment, the first side display area SDA1 and the third side display area SDA3 may extend from the front display area FDA in the first direction (e.g., y direction or −y direction). In such an embodiment, the second side display area SDA2 and the fourth side display area SDA4 may extend from the front display area FDA in the second direction (e.g., x direction or −x direction).

In an embodiment, the first side display area SDA1 and the third side display area SDA3 may be connected to the front display area FDA in the first direction (e.g., y direction or −y direction). In such an embodiment, the second side display area SDA2 and the fourth side display area SDA4 may be connected to the front display area FDA in the second direction (e.g., x direction or −x direction).

The corner display area CDA may be arranged at a corner CN of the display panel 10. The corner CN of the display panel 10 may be a portion in which a long side of the display panel 10 in the first direction (e.g., y direction or −y direction) and a short side of the display panel 10 in the second direction (e.g., x direction or −x direction) meet each other.

The corner display area CDA may be between the neighboring side display areas SDA. In one embodiment, for example, the corner display area CDA may be between the first side display area SDA1 and the second side display area SDA2. Alternatively, the corner display area CDA may be between the second side display area SDA2 and the third side display area SDA3, between the third side display area SDA3 and the fourth side display area SDA4, or between the fourth side display area SDA4 and the first side display area SDA1. Hereinafter, the corner display area CDA between the first side display area SDA1 and the second side display area SDA2 will be described in detail.

The corner display area CDA may surround at least a portion of the front display area FDA. In one embodiment, for example, the corner display area CDA may be between the first side display area SDA1 and the second side display area SDA2 and may surround at least a portion of the front display area FDA.

A second pixel PX2 including a display element may be arranged in the corner display area CDA, and the corner display area CDA may be bendable. In such an embodiment, as described above with reference to FIG. 1, the corner display area CDA may be an area that is arranged to correspond to the corner CN and is bent from the front display area FDA.

The middle display area MDA may be between the front display area FDA and the corner display area CDA. According to an embodiment, the middle display area MDA may extend between the side display area SDA and the corner display area CDA. In one embodiment, for example, the middle display area MDA may extend between the first side display area SDA1 and the corner display area CDA and/or between the second side display area SDA2 and the corner display area CDA. According to an embodiment, the middle display area MDA may be bendable.

A third pixel PX3 including a display element may be arranged in the middle display area MDA. In an embodiment, a driving circuit DC configured to provide electrical signals, or a power line (not illustrated) configured to provide a voltage may be arranged in the middle display area MDA. According to an embodiment, the driving circuit DC may be arranged along the middle display area MDA and/or the peripheral area PA. In such an embodiment, the third pixel PX3 in the middle display area MDA may overlap the driving circuit DC or the power line. According to an alternative embodiment, the third pixel PX3 may not overlap the driving circuit DC or the power line. In such an embodiment, the driving circuit DC may be arranged along the peripheral area PA.

The display panel 10 may include an inorganic pattern layer PVX. According to an embodiment, the inorganic pattern layer PVX may surround at least a portion of the front display area FDA. In one embodiment, for example, the inorganic pattern layer PVX may entirely surround the front display area FDA. According to an embodiment, an opening PVXOP may be defined through the inorganic pattern layer PVX (shown in FIG. 6A or FIG. 6B) to overlap the front display area FDA.

According to an embodiment, the inorganic pattern layer PVX may entirely surround the front display area FDA and the side display area SDA. In an embodiment, an opening PVXOP may be defined through the inorganic pattern layer PVX to overlap the front display area FDA and the side display area SDA.

According to an embodiment, the inorganic pattern layer PVX may extend between the front display area FDA and the corner display area CDA. At least a portion of the inorganic pattern layer PVX may be arranged in the peripheral area PA while facing the side display area SDA. At least a portion of the inorganic pattern layer PVX may be between the front display area FDA and the corner display area CDA. The inorganic pattern layer PVX may include a single-layer film or a multilayer film including an inorganic material such as silicon nitride ($SiN_x$), silicon oxide ($SiO_2$), and/or silicon oxynitride (SiON).

The inorganic pattern layer PVX surrounding the front display area FDA may prevent or reduce infiltration of moisture and/or oxygen from the peripheral area PA outside the inorganic pattern layer PVX to the front display area FDA. This will be described later in detail.

In an embodiment, at least one selected from the side display area SDA, the corner display area CDA, and the middle display area MDA may be bendable. In one embodiment, for example, the first side display area SDA1 of the side display area SDA may have a first radius of curvature and may be bendable, and the second side display area SDA2 of the side display area SDA may have a second radius of curvature and may be bendable. In an embodiment where the first radius of curvature is greater than the second radius of curvature, the radius of curvature at which the corner display area CDA is bent may gradually decrease in a direction from the first side display area SDA1 to the second side display area SDA2.

In a case where the corner display area CDA is bent, a compressive strain may be greater than a tensile strain in the corner display area CDA. In such an embodiment, it is desired to apply a shrinkable substrate and a multilayer structure to the corner display area CDA. Therefore, the structure of the multilayer film or the shape of the substrate 100 arranged in the corner display area CDA may be different from the multilayer structure or the shape of the substrate 100 arranged in the front display area FDA. According to an embodiment, the substrate 100 may include a plurality of extension areas (not illustrated) that overlap at least a portion of the corner display area CDA and extend in a direction away from the front display area FDA. A penetration or opening portion (not illustrated) penetrating or defined through the display panel 10 may be provided between the neighboring extension areas.

Figure 5:
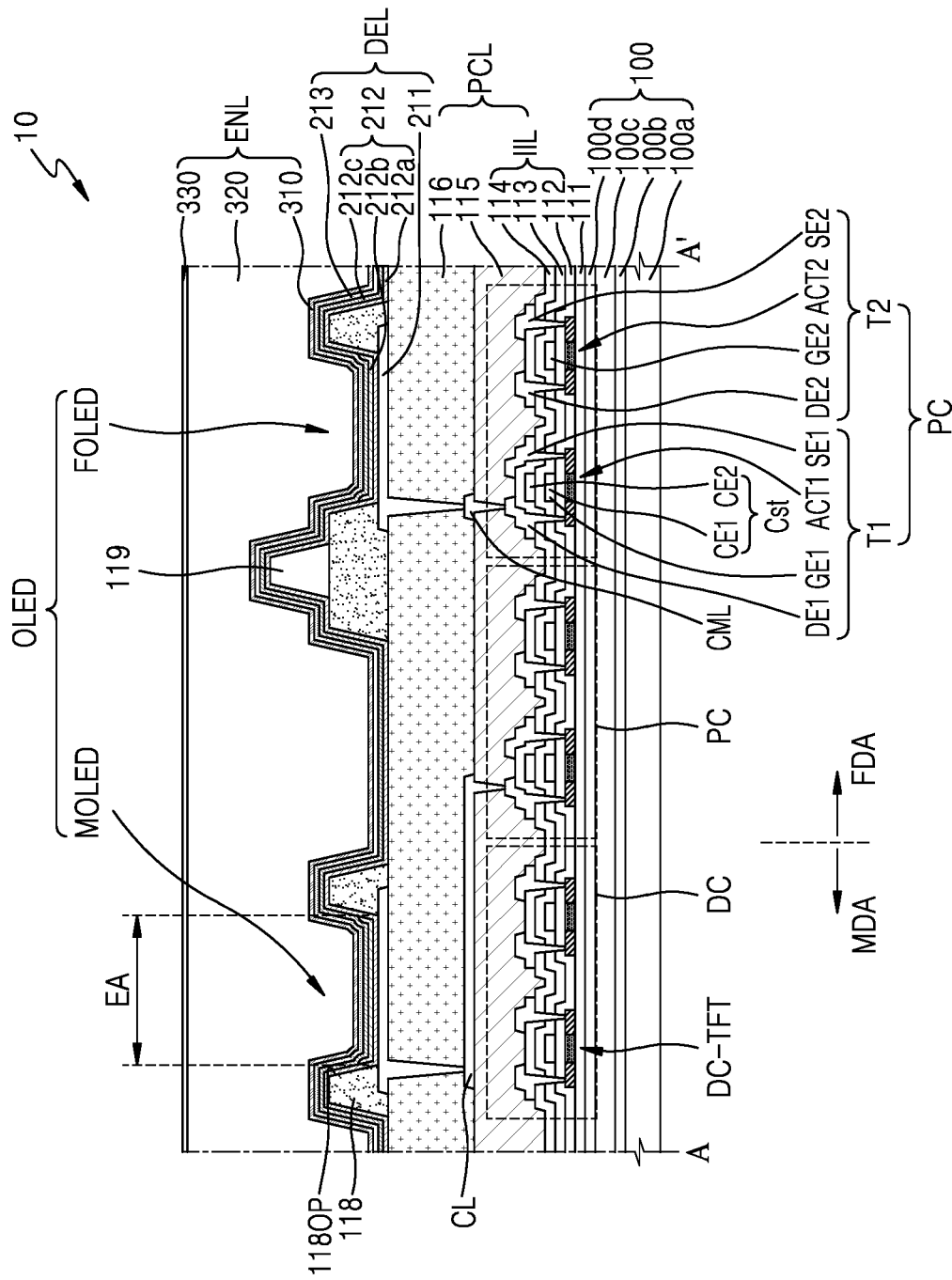
FIG. 5 is a schematic cross-sectional view of the display panel taken along line A-A' of FIG. 4.

FIG. 5 is a schematic cross-sectional view of the display panel 10 taken along line A-A' of FIG. 4.

Referring to FIG. 5, an embodiment of the display panel 10 may include a substrate 100, a buffer layer 111, a pixel circuit layer PCL, a display element layer DEL, and an encapsulation layer ENL.

According to an embodiment, the substrate 100 may have a multilayer structure including a first base layer 100a, a first barrier layer 100b, a second base layer 100c, and a second barrier layer 100d. According to an embodiment, the first base layer 100a, the first barrier layer 100b, the second base layer 100c, and the second barrier layer 100d may be sequentially stacked one on another and provided in the substrate 100. According to an alternative embodiment, the substrate 100 may include glass.

At least one selected from the first base layer 100a and the second base layer 100c may include a polymer resin such as polyethersulfone, polyarylate, polyetherimide, polyethylene naphthalate, polyethylene terephthalate, polyphenylene sulfide, polyimide, polycarbonate, cellulose triacetate, or cellulose acetate propionate.

The first barrier layer 100b and the second barrier layer 100d may be barrier layers that prevent infiltration of external foreign matter, and may have a single layer structure or a multilayer structure, each layer including an inorganic material such as silicon nitride ($SiN_x$), silicon oxide ($SiO_2$), and/or silicon oxynitride (SiON).

The buffer layer 111 may be on the substrate 100. The buffer layer 111 may include an inorganic insulating material such as silicon nitride ($SiN_x$), silicon oxynitride (SiON), and silicon oxide ($SiO_2$), and may have a single layer structure or a multilayer structure, each layer including the above-described inorganic insulating material.

The pixel circuit layer PCL may be on the buffer layer 111. The pixel circuit layer PCL may include a driving circuit DC and a pixel circuit PC. According to an embodiment, the driving circuit DC may be arranged in the middle display area MDA. According to an embodiment, the driving circuit DC may not be arranged in the middle display area MDA. In such an embodiment, the driving circuit DC may be arranged in the peripheral area PA. Hereinafter, embodiments in which the driving circuit DC is arranged in the middle display area MDA will be described in detail.

The pixel circuit PC may be on the front display area FDA. According to an embodiment, the pixel circuit PC may be apart from the middle display area MDA. According to an embodiment, the pixel circuit PC may overlap the middle display area MDA. Hereinafter, embodiments in which the driving circuit DC is apart from the middle display area MDA will be described in detail.

The driving circuit DC may include a driving circuit thin-film transistor DC-TFT. According to an embodiment, the driving circuit DC may be connected to the scan line. The pixel circuit PC may include at least one thin-film transistor. According to an embodiment, the pixel circuit PC may include a driving thin-film transistor T1, a switching thin-film transistor T2, and a storage capacitor Cst.

The pixel circuit layer PCL may include an inorganic insulating layer IIL, a lower insulating layer 115, and an insulating layer 116 below and/or above the elements of the driving thin-film transistor T1. The inorganic insulating layer IIL may include a first gate insulating layer 112, a second gate insulating layer 113, and an interlayer insulating layer 114. The driving thin-film transistor T1 may include a first semiconductor layer ACT1, a first gate electrode GE1, a first source electrode SE1, and a first drain electrode DE1.

In an embodiment, the first semiconductor layer ACT1 may include polysilicon. Alternatively, the first semiconductor layer ACT1 may include amorphous silicon, an oxide semiconductor, or an organic semiconductor. The first semiconductor layer ACT1 may include a channel region, and a drain region and a source region on both sides of the channel region. The first gate electrode GE1 may overlap the channel region.

The first gate electrode GE1 may include a low resistance metal material. The first gate electrode GE1 may include a conductive material including molybdenum (Mo), aluminum (Al), copper (Cu), titanium (Ti) or the like, and may have a single layer structure or a multilayer structure, each layer including at least one selected from the above-described materials.

The first gate insulating layer 112 between the first semiconductor layer ACT1 and the first gate electrode GE1 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

The second gate insulating layer 113 may be arranged to cover the first gate electrode GE1. Similar to the first gate insulating layer 112, the second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

An upper electrode CE2 of the storage capacitor Cst may be on the second gate insulating layer 113. The upper electrode CE2 may overlap the first gate electrode GE1 therebelow. In an embodiment, the first gate electrode GE1 of the driving thin-film transistor T1 and the upper electrode CE2 overlapping each other with the second gate insulating layer 113 therebetween may form the storage capacitor Cst. In such an embodiment, the first gate electrode GE1 of the driving thin-film transistor T1 may function as a lower electrode CE1 of the storage capacitor Cst.

In an embodiment, as described above, the storage capacitor Cst and the driving thin-film transistor T1 may overlap each other. According to an alternative embodiment, the storage capacitor Cst may not overlap the driving thin-film transistor T1.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single layer structure or a multilayer structure, each layer including at least one selected from the above-described materials.

The interlayer insulating layer 114 may cover the upper electrode CE2. The interlayer insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The interlayer insulating layer 114 may have a single layer structure or a multilayer structure, each layer including at least one selected from the above-described inorganic insulating materials.

The first drain electrode DE1 and the first source electrode SE1 may be on the interlayer insulating layer 114. The first drain electrode DE1 and the first source electrode SE1 may include a material having high conductivity. The first drain electrode DE1 and the first source electrode SE1 may include a conductive material including molybdenum (Mo), aluminum (Al), copper (Cu), titanium (Ti) or the like, and may have a single layer structure or a multilayer structure, each layer including at least one selected from the above-described materials. According to an embodiment, the first drain electrode DE1 and the first source electrode SE1 may have a multilayer structure of Ti/Al/Ti.

The switching thin-film transistor T2 may include a second semiconductor layer ACT2, a second gate electrode GE2, a second drain electrode DE2, and a second source electrode SE2. Because the second semiconductor layer ACT2, the second gate electrode GE2, the second drain electrode DE2, and the second source electrode SE2 are similar to the first semiconductor layer ACT1, the first gate electrode GE1, the first drain electrode DE1, and the first source electrode SE1, any repetitive detailed descriptions thereof will be omitted.

Similar to the switching thin-film transistor T2, the driving circuit thin-film transistor DC-TFT may include a driving circuit semiconductor layer, a driving circuit gate electrode, a driving circuit source electrode, and a driving circuit drain electrode.

The lower insulating layer 115 may be on at least one thin-film transistor. According to an embodiment, the lower insulating layer 115 may be arranged to cover the first drain electrode DE1 and the first source electrode SE1. The lower insulating layer 115 may include an organic material. In one embodiment, for example, the lower insulating layer 115 may include an organic insulating material such as a general-purpose polymer (e.g., polymethylmethacrylate ("PMMA") or polystyrene ("PS")), a polymer derivative having a phenol-based group, an acrylic polymer, an imide-based polymer, an aryl ether-based polymer, an amide-based polymer, a fluorine-based polymer, a p-xylene-based polymer, a vinyl alcohol-based polymer, and a blend thereof.

A connection electrode CML and a connection line CL may be on the lower insulating layer 115. In this case, the connection electrode CML and the connection line CL may be respectively connected to the first drain electrode DE1 or the first source electrode SE1 through contact holes of the lower insulating layer 115. The connection electrode CML and the connection line CL may include a material having good conductivity. The connection electrode CML and the connection line CL may include a conductive material including molybdenum (Mo), aluminum (Al), copper (Cu), titanium (Ti) or the like, and may have a single layer structure or a multilayer structure, each layer including at least one selected from the above-described materials. According to an embodiment, the connection electrode CML and the connection line CL may have a multilayer structure of Ti/Al/Ti.

In an embodiment, as illustrated in FIG. 5, the connection line CL may extend from the front display area FDA to the middle display area MDA. According to an alternative embodiment, the connection line CL may extend from the peripheral area or the corner display area to the middle display area MDA. According to another alternative embodiment, the connection line CL may extend from the side display area to the middle display area MDA. The connection line CL may overlap the driving circuit thin-film transistor DC-TFT.

The insulating layer 116 may be arranged to cover the connection electrode CML and the connection line CL. According to an embodiment, the insulating layer 116 may be on at least one thin-film transistor of the pixel circuit PC. The insulating layer 116 may include an organic insulating layer. The insulating layer 116 may include an organic insulating material such as a general-purpose polymer (e.g., PMMA or PS), a polymer derivative having a phenol-based group, an acrylic polymer, an imide-based polymer, an aryl ether-based polymer, an amide-based polymer, a fluorine-based polymer, a p-xylene-based polymer, a vinyl alcohol-based polymer, and a blend thereof.

The display element layer DEL may be on the pixel circuit layer PCL. The display element layer DEL may include an organic light-emitting diode OLED. The display element layer DEL may include a front organic light-emitting diode FOLED in the front display area FDA and a middle organic light-emitting diode MOLED in the middle display area MDA. The middle organic light-emitting diode MOLED may overlap the driving circuit DC. Therefore, in such an embodiment, an image may be displayed even in the middle display area MDA in which the driving circuit DC is arranged.

A pixel electrode 211 of the front organic light-emitting diode FOLED may be electrically connected to the connection electrode CML through a contact hole of the insulating layer 116. A pixel electrode 211 of the middle organic light-emitting diode MOLED may be electrically connected to the connection line CL through the contact hole of the insulating layer 116.

In an embodiment, the pixel electrode 211 may include conductive oxide such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). According to an alternative embodiment, the pixel electrode 211 may include a reflective layer including silver (Ag), magnesium (Mg), aluminum (Al), platinum (Pt), palladium (Pd), gold (Au), nickel (Ni), neodymium (Nd), Iridium (Ir), chromium (Cr), or any compound thereof. According to another alternative embodiment, the pixel electrode 211 may further include a layer including ITO, IZO, ZnO, or $In_2O_3$ above/below the reflective layer.

A pixel defining layer 118 may be on the pixel electrode 211, and an opening 1180P may be defined through the pixel defining layer 118 to expose the central portion of the pixel electrode 211. The pixel defining layer 118 may include an organic insulating material and/or an inorganic insulating material. The opening 1180P may define an emission area EA of light emitted from the organic light-emitting diode OLED. In one embodiment, for example, the width of the opening 1180P may correspond to the width of the emission area EA. In such an embodiment, the width of the opening 1180P may correspond to the width of the subpixel.

A spacer 119 may be on the pixel defining layer 118. The spacer 119 may prevent damage to the substrate 100 and/or the multilayer film on the substrate 100 in a process of manufacturing the display device. In the process of manufacturing the display panel, a mask sheet may be used. In such a process, the mask sheet may enter the opening 1180P of the pixel defining layer 118, or may come into close contact with the pixel defining layer 118. The spacer 119 may prevent a portion of the substrate 100 and the multilayer film from being damaged or broken by the mask sheet when a deposition material is deposited on the substrate 100.

In an embodiment, the spacer 119 may include an organic material such as polyimide. Alternatively, the spacer 119 may include an inorganic insulating material such as silicon nitride ($SiN_x$) or silicon oxide ($SiO_2$), or may include an organic insulating material and an inorganic insulating material.

According to an embodiment, the spacer 119 may include a material different from that of the pixel defining layer 118. In an alternative embodiment, the spacer 119 may include a same material as that of the pixel defining layer 118. In such an embodiment, the pixel defining layer 118 and the spacer 119 may be formed together in a mask process using a halftone mask or the like.

An intermediate layer 212 may be on the pixel defining layer 118. The intermediate layer 212 may include an emission layer 212b arranged in the opening 1180P of the pixel defining layer 118. The emission layer 212b may include a high molecular weight organic material or a low molecular weight organic material that emits light of a certain color.

A first functional layer 212a and a second functional layer 212c may be above and/or below the emission layer 212b. The first functional layer 212a may include, for example, a hole transport layer ("HTL"), or may include an HTL and a hole injection layer ("HIL"). The second functional layer 212c may be an optional element that is on the emission layer 212b. The second functional layer 212c may include an electron transport layer ("ETL") and/or an electron injection layer ("EIL"). Like an opposite electrode 213 to be described later, the first functional layer 212a and/or the second functional layer 212c may be a common layer entirely covering the substrate 100.

The opposite electrode 213 may include a conductive material having a low work function. In one embodiment, for example, the opposite electrode 213 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 213 may further include a layer such as ITO, IZO, ZnO, or $In_2O_3$ on the (semi)transparent layer including at least one selected from the above-described materials.

According to an embodiment, a capping layer (not illustrated) may be further on the opposite electrode 213. The capping layer may include LiF, an inorganic material, or/and an organic material.

An encapsulation layer ENL may be on the opposite electrode 213. According to an embodiment, the encapsulation layer ENL may include at least one inorganic encapsulation layer and at least one organic encapsulation layer. According to an embodiment, as shown in FIG. 5, the encapsulation layer ENL includes a first inorganic encapsulation layer 310, an organic encapsulation layer 320, and a second inorganic encapsulation layer 330, which are sequentially stacked one on another.

The first inorganic encapsulation layer 310 and the second inorganic encapsulation layer 330 may include at least one inorganic material selected from aluminum oxide ($Al_2O_3$), titanium oxide ($TiO_2$), tantalum oxide ($Ta_2O_5$), hafnium oxide ($HfO_2$), zinc oxide (ZnO), and silicon oxide. ($SiO_2$), silicon nitride ($SiN_x$), and silicon oxynitride (SiON). The organic encapsulation layer 320 may include a polymer-based material. The polymer-based material may include an acrylic resin, an epoxy-based resin, polyimide, polyethylene, or the like. According to an embodiment, the organic encapsulation layer 320 may include acrylate.

Although not illustrated, a touch electrode layer may be on the encapsulation layer ENL, and an optical functional layer may be on the touch electrode layer. The touch electrode layer may obtain coordinate information corresponding to an external input, for example, a touch event. The optical functional layer may reduce the reflectance of light (external light) incident from the outside toward the display device, and/or may improve color purity of light emitted from the display device. According to an embodiment, the optical functional layer may include a retarder and a polarizer. The retarder may be a film-type retarder or a liquid crystal coating-type retarder and may include a λ/2 retarder and/or a λ/4 retarder. In an embodiment, the polarizer may be a film-type polarizer or a liquid crystal coating-type polarizer. The film-type polarizer may include a stretched synthetic resin film, and the liquid crystal coating-type polarizer may include liquid crystals arranged in a certain array. Each of the retarder and the polarizer may further include a protective film.

According to an alternative embodiment, the optical functional layer may include a black matrix and color filters. The color filters may be arranged considering the color of light emitted from each pixel of the display device. Each of the color filters may include a red, green, or blue pigment or dye. Alternatively, each of the color filters may further include, in addition to the pigment or dye, quantum dots. Alternatively, some color filters may not include the pigment or dye and may include scattering particles such as titanium oxide.

According to an alternative embodiment, the optical functional layer may include a destructive interference structure. The destructive interference structure may include a first reflective layer and a second reflective layer, which are on different layers from each other. First reflected light and second reflected light, which are respectively reflected from the first reflective layer and the second reflective layer, may destructively interfere with each other. Thus, the reflectance of external light is reduced.

An adhesive member may be between the touch electrode layer and the optical functional layer. In an embodiment, any general members known in the art may be used as the adhesive member without limitation. The adhesive member may include a pressure sensitive adhesive ("PSA").

Figure 6A:
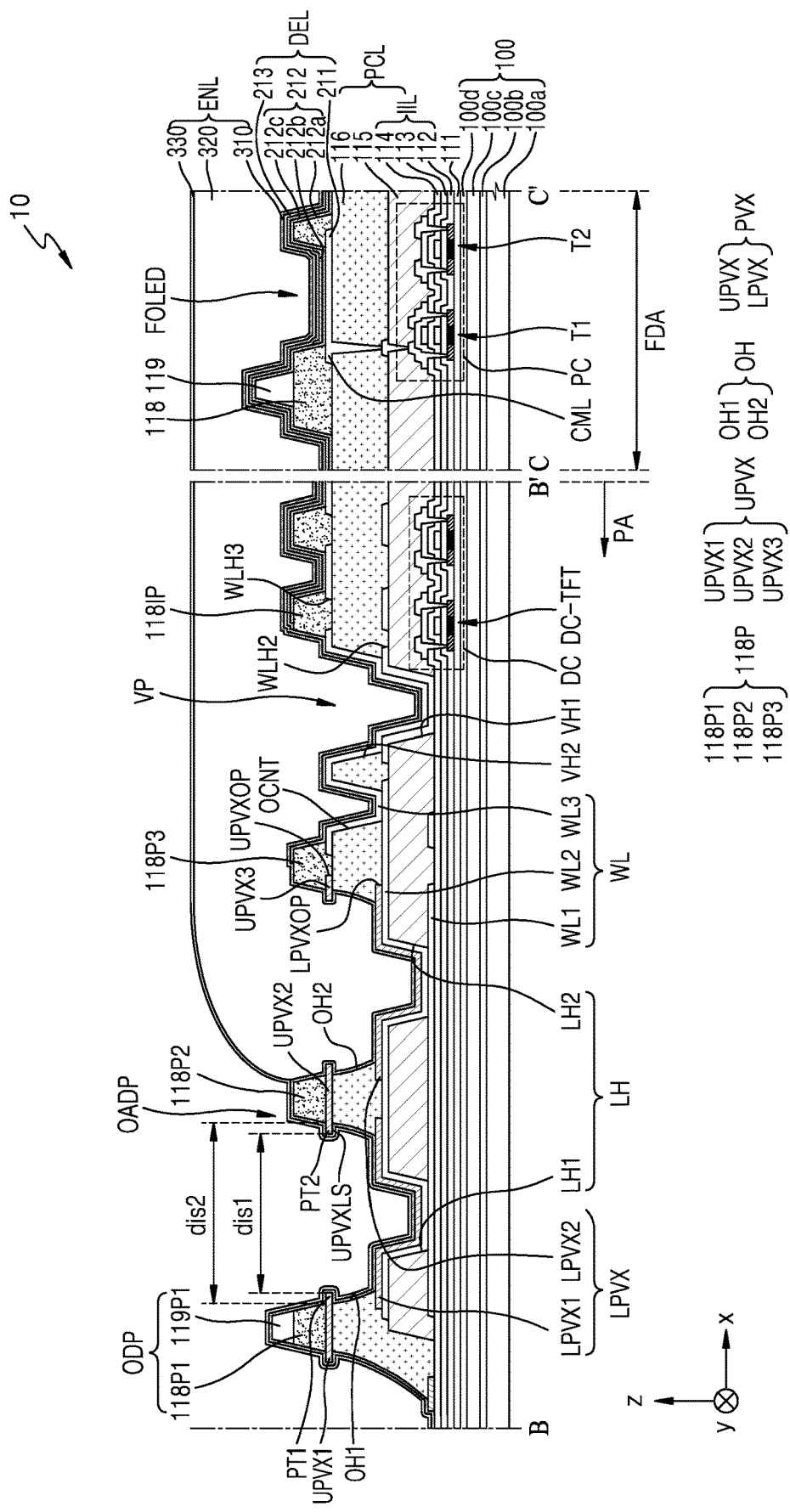
FIGS. 6A and 6B are schematic cross-sectional views of the display panel taken along lines B-B' and C-C' of FIG. 4.
Figure 6B:
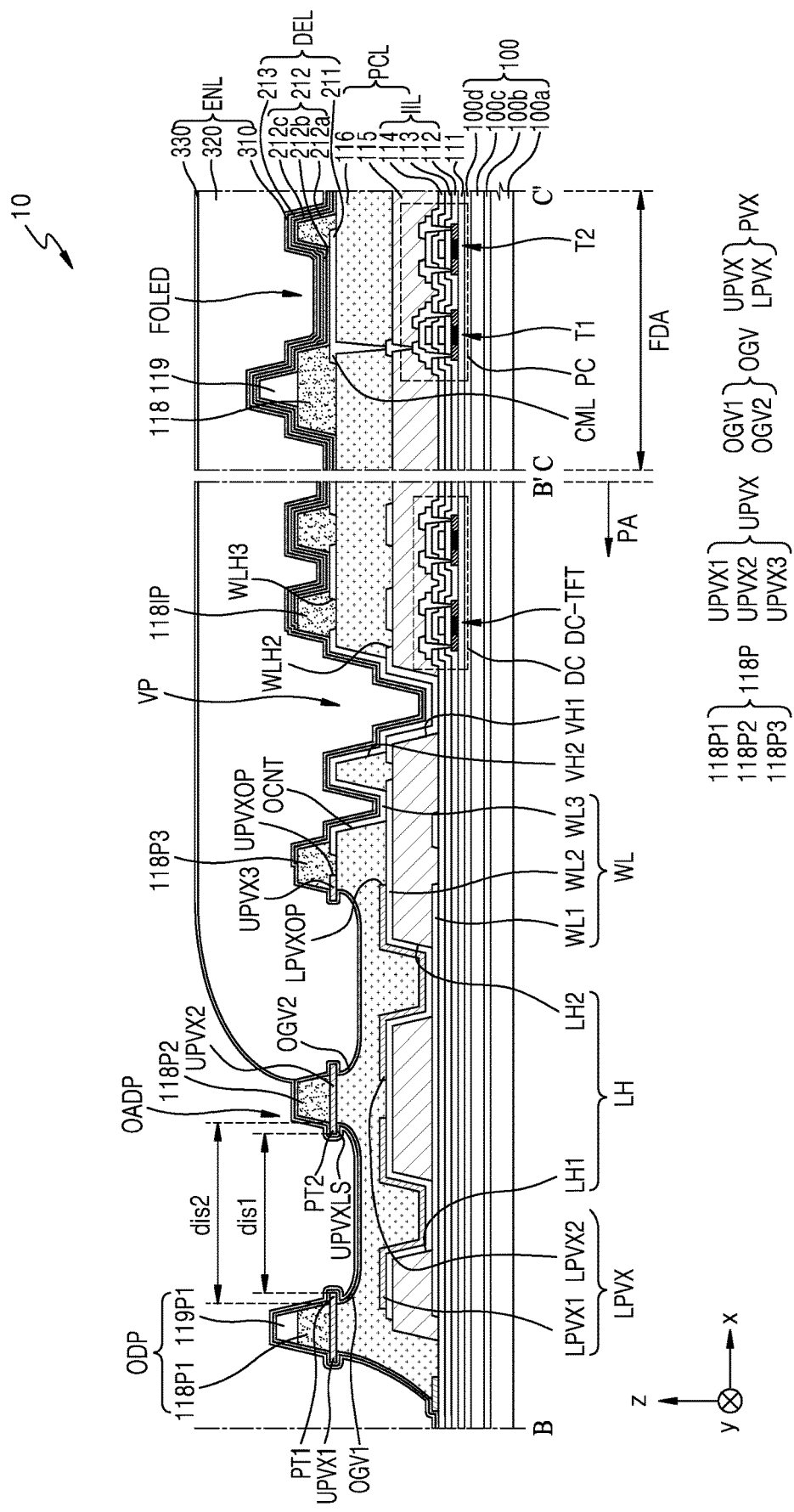

FIGS. 6A and 6B are schematic cross-sectional views of the display panel 10 taken along lines B-B' and C-C' of FIG. 4. In FIGS. 6A and 6B, the same reference numerals as those in FIG. 5 denote the same members, and any repetitive detailed descriptions thereof will be omitted.

Referring to FIGS. 6A and 6B, an embodiment of the display panel 10 may include a substrate 100, a buffer layer 111, a pixel circuit layer PCL, an inorganic pattern layer PVX, a display element layer DEL, and an encapsulation layer ENL.

The pixel circuit layer PCL may include a line WL, a driving circuit DC, a pixel circuit PC, an inorganic insulating layer IIL, a lower insulating layer 115, and an insulating layer 116. According to an embodiment, the inorganic insulating layer IIL may include a first gate insulating layer 112, a second gate insulating layer 113, and an interlayer insulating layer 114. According to an embodiment, the line WL may include a first line WL1, a second line WL2, and a third line WL3. According to an embodiment, the line WL may overlap a peripheral area PA.

According to an embodiment, the inorganic pattern layer PVX may include a lower inorganic pattern layer LPVX and an upper inorganic pattern layer UPVX. According to an alternative embodiment, the lower inorganic pattern layer LPVX may be omitted.

The substrate 100 may include a front display area FDA and the peripheral area PA outside the front display area FDA. The driving circuit DC including a buffer layer 111, an inorganic insulating layer IIL, and a driving circuit thin-film transistor DC-TFT may be on the peripheral area PA.

The first line WL1 may be on the inorganic insulating layer IIL. The first line WL1 may be between the inorganic insulating layer IIL and the lower insulating layer 115. The first line WL1 may transmit a power supply voltage and/or a signal to the front organic light-emitting diode FOLED. The first line WL1 may include a conductive material including molybdenum (Mo), aluminum (Al), copper (Cu), titanium (Ti) or the like, and may have a single layer structure or a multilayer structure, each layer including at least one selected from the above-described materials. According to an embodiment, the first line WL1 may have a multilayer structure of Ti/Al/Ti.

The lower insulating layer 115 may be arranged in the peripheral area PA. The lower insulating layer 115 may cover the first line WL1. The lower insulating layer 115 may overlap a driving circuit thin-film transistor DC-TFT.

In an embodiment, a lower hole LH may be defined through the lower insulating layer 115 to expose at least a portion of the first line WL1. According to an embodiment, a plurality of lower holes LH may be defined through the lower insulating layer 115. In one embodiment, for example, the lower holes LH may include a first lower hole LH1 and a second lower hole LH2. The first lower hole LH1 may be farther away from the front display area FDA than the second lower hole LH2.

The lower insulating layer 115 may be separated by a valley portion VP. According to an embodiment, a first valley hole VH1 may be defined through the lower insulating layer 115. The first valley hole VH1 may be closer to the front display area FDA than the lower hole LH. The first valley hole VH1 may prevent or reduce infiltration of foreign matter or moisture generated in the outer area into the front display area FDA through the lower insulating layer 115.

The second line WL2 may be on the lower insulating layer 115. The second line WL2 may be between the lower insulating layer 115 and the insulating layer 116. The second line WL2 may extend from the peripheral area PA to the front display area FDA. According to an embodiment, the second line WL2 may overlap the first valley hole VH1. According to an embodiment, the second line WL2 may come in contact with the inorganic insulating layer IIL in the first valley hole VH1.

In an embodiment, a second line hole WLH2 may be defined through the second line WL2 to expose at least a portion of the lower insulating layer 115. According to an embodiment, a plurality of second line holes WLH2 may be defined through the second line WL2. The second line holes WLH2 may serve as passages for discharging gas generated from the lower insulating layer 115 when the display panel 10 is manufactured. Therefore, deterioration of the quality of an image displayed in the front display area FDA by the gas that is generated from the lower insulating layer 115 and infiltrates into the front display area FDA may be effectively prevented or reduced.

The second line WL2 may be electrically connected to the first line WL1. The second line WL2 may be connected to the first line WL1 through the lower hole LH. The second line WL2 may overlap the lower hole LH, and the second line WL2 may be electrically connected to the first line WL1 through the lower hole LH. In one embodiment, for example, the second line WL2 may be electrically connected to the first line WL1 through at least one selected from the first lower hole LH1 and the second lower hole LH2. The second line WL2 may include a conductive material including molybdenum (Mo), aluminum (Al), copper (Cu), titanium (Ti) or the like, and may have a single layer structure or a multilayer structure, each layer including at least one selected from the above-described materials. According to an embodiment, the second line WL2 may have a multilayer structure of Ti/Al/Ti. The second line WL2 may include a same material as that of the connection electrode CML.

The lower inorganic pattern layer LPVX may be on the peripheral area PA. The lower inorganic pattern layer LPVX may be between the substrate 100 and the insulating layer

116. According to an embodiment, the lower inorganic pattern layer LPVX may be on the second line WL2. The lower inorganic pattern layer LPVX may overlap the lower hole LH. The lower inorganic pattern layer LPVX may extend between the lower insulating layer 115 and the insulating layer 116.

The lower inorganic pattern layer LPVX may be apart from the front display area FDA. According to an embodiment, the lower inorganic pattern layer LPVX may surround the front display area FDA. In such an embodiment, a lower opening LPVXOP may be defined through the lower inorganic pattern layer LPVX to overlap the front display area FDA. Alternatively, the lower inorganic pattern layer LPVX may not overlap the front display area FDA. Therefore, the lower inorganic pattern layer LPVX may be apart from at least one thin-film transistor.

According to an embodiment, the lower inorganic pattern layer LPVX may include a first lower inorganic pattern layer LPVX1 and a second lower inorganic pattern layer LPVX2. The first lower inorganic pattern layer LPVX1 may be farther away from the front display area FDA than the second lower inorganic pattern layer LPVX2. According to an embodiment, the first lower inorganic pattern layer LPVX1 may overlap the first lower hole LH1. In such an embodiment, the second lower inorganic pattern layer LPVX2 may overlap the second lower hole LH2.

According to an embodiment, the first lower inorganic pattern layer LPVX1 and the second lower inorganic pattern layer LPVX2 may be apart from each other. According to an alternative embodiment, the first lower inorganic pattern layer LPVX1 and the second lower inorganic pattern layer LPVX2 may be integrally formed with each other as a single unitary unit.

The insulating layer 116 may be on the front display area FDA and the peripheral area PA. The insulating layer 116 may be on the lower insulating layer 115. The insulating layer 116 may cover an edge of the second line WL2. Therefore, the insulating layer 116 may prevent or reduce deterioration of the side surface of the second line WL2. According to an embodiment, the insulating layer 116 may cover an edge of the lower inorganic pattern layer LPVX. In an embodiment, an outer groove or an outer through hole may be defined in the insulating layer 116.

Referring to FIG. 6A, an outer through hole OH may be defined through the insulating layer 116. The outer through hole OH may penetrate through the insulating layer 116. The outer through hole OH may expose the lower inorganic pattern layer LPVX. According to an embodiment, the outer through hole OH may expose a central portion of the lower inorganic pattern layer LPVX. The outer through hole OH may be formed by etching the insulating layer 116, and the lower inorganic pattern layer LPVX may prevent the second line WL2 below the lower inorganic pattern layer LPVX from being over-etched. Therefore, the lower inorganic pattern layer LPVX may prevent or reduce a resistance from increasing due to over-etching of the second line WL2.

According to an embodiment, a plurality of outer through holes OH is defined through the insulating layer 116. In one embodiment, for example, the outer through holes OH may include a first outer through hole OH1 and a second outer through hole OH2. The first outer through hole OH1 may be farther away from the front display area FDA than the second outer through hole OH2.

The outer through hole OH may overlap the lower hole LH. In one embodiment, for example, the first outer through hole OH1 may overlap the first lower hole LH1, and the second outer through hole OH2 may overlap the second lower hole LH2 in the third direction.

FIG. 6B shows a first portion of the peripheral area PA outside the front display area FDA. Referring to FIG. 6B, the insulating layer 116 may include an outer groove OGV. The outer groove OGV may be formed by recessing the insulating layer 116 in the depth direction or the third direction. In one embodiment, for example, in FIG. 6B, the outer groove OGV may be formed by recessing the insulating layer 116 in the −z direction. According to an embodiment, the insulating layer 116 may include a plurality of outer grooves OGV. In one embodiment, for example, the outer grooves OGV may include a first outer groove OGV1 and a second outer groove OGV2. The first outer groove OGV1 may be farther away from the front display area FDA than the second outer groove OGV2.

The outer groove OGV may overlap the lower hole LH. In one embodiment, for example, the first outer groove OGV1 may overlap the first lower hole LH1, and the second outer groove OGV2 may overlap the second lower hole LH2. In an embodiment, where the insulating layer 116 includes the outer groove OGV, the lower inorganic pattern layer LPVX may be omitted.

In an embodiment, an outer contact hole OCNT may be defined through the insulating layer 116. The outer contact hole OCNT may expose at least a portion of the second line WL2. The second line WL2 may be electrically connected to the third line WL3 through the outer contact hole OCNT.

The insulating layer 116 may be separated by a valley portion VP. According to an embodiment, a second valley hole VH2 may be defined through the insulating layer 116. The second valley hole VH2 may be closer to the front display area FDA than the outer through hole or the outer groove. The second valley hole VH2 may overlap the first valley hole VH1. The second valley hole VH2 may prevent or reduce infiltration of foreign matter or moisture generated in the outer area into the front display area FDA through the insulating layer 116.

The third line WL3 may be on the insulating layer 116. The third line WL3 may extend from the peripheral area PA to the front display area FDA. According to an embodiment, the third line WL3 may be electrically connected to the second line WL2 through the outer contact hole OCNT. The third line WL3 may overlap the first valley hole VH1 and the second valley hole VH2. According to an embodiment, the third line WL3 may be electrically connected to the second line WL2 through the first valley hole VH1 and the second valley hole VH2.

In an embodiment, a third line hole WLH3 is defined through the third line WL3 to expose at least a portion of the insulating layer 116. According to an embodiment, a plurality of third line holes WLH3 may be defined through the third line WL3. The third line holes WLH3 may serve as passages for discharging gas generated from at least one of (or at least one selected from) the lower insulating layer 115 and the insulating layer 116 when the display panel 10 is manufactured. Therefore, deterioration of the quality of an image displayed in the front display area FDA by the gas that is generated from at least one of the lower insulating layer 115 and the insulating layer 116 and infiltrates into the front display area FDA may be prevented or reduced.

In an embodiment, the third line WL3 may include conductive oxide such as ITO, IZO, ZnO, $In_2O_3$, IGO, or AZO. According to an alternative embodiment, the third line WL3 may include a reflective layer including silver (Ag), magnesium (Mg), aluminum (Al), platinum (Pt), palladium (Pd), gold (Au), nickel (Ni), neodymium (Nd), Iridium (Ir), chromium (Cr), or any compound thereof. According to another alternative embodiment, the third line WL3 may further include a layer including ITO, IZO, ZnO, or In$_2$O$_3$ above/below the reflective layer. According to an embodiment, the third line WL3 may include a same material as that of the pixel electrode 211.

The upper inorganic pattern layer UPVX may be on the peripheral area PA. The upper inorganic pattern layer UPVX may be on the insulating layer 116. The upper inorganic pattern layer UPVX may be between the insulating layer 116 and the organic pattern layer 118P.

The upper inorganic pattern layer UPVX may be apart from the front display area FDA. According to an embodiment, the upper inorganic pattern layer UPVX may surround the front display area FDA. In such an embodiment, the upper inorganic pattern layer UPVX may include an upper opening UPVXOP overlapping the front display area FDA. Alternatively, the upper inorganic pattern layer UPVX may not overlap the front display area FDA.

A plurality of upper inorganic pattern layers UPVX may be provided. The upper inorganic pattern layers UPVX may be apart from each other. In one embodiment, for example, the upper inorganic pattern layer UPVX may include a first upper inorganic pattern layer UPVX1, a second upper inorganic pattern layer UPVX2, and a third upper inorganic pattern layer UPVX3. The first upper inorganic pattern layer UPVX1 may be between the insulating layer 116 and the first organic pattern layer 118P1. The second upper inorganic pattern layer UPVX2 may be between the insulating layer 116 and the second organic pattern layer 118P2. The third upper inorganic pattern layer UPVX3 may be between the insulating layer 116 and the third organic pattern layer 118P3.

Referring to FIG. 6A, the upper inorganic pattern layer UPVX may include a protruding tip protruding toward the center of the outer through hole OH. The direction toward the center of the outer through hole OH may be a direction from the inner surface of the insulating layer 116 defining the outer through hole OH to the central axis of the outer through hole OH. Therefore, the lower surface of the protruding tip may be exposed through the outer through hole OH. In such an embodiment, the outer through hole OH of the insulating layer 116 may have an undercut structure.

According to an embodiment, the first upper inorganic pattern layer UPVX1 may include a first protruding tip PT1 protruding toward the center of the first outer through hole OH1. The second upper inorganic pattern layer UPVX2 may include a second protruding tip PT2 protruding toward the center of the first outer through hole OH1. The first protruding tip PT1 and the second protruding tip PT2 may face each other with the first outer through hole OH1 therebetween. The lower surface of the first protruding tip PT1 and the lower surface of the second protruding tip PT2 may overlap the first outer through hole OH1.

According to an embodiment, a first distance dis1 between the first protruding tip PT1 and the second protruding tip PT2 may be less than a second distance dis2 between the insulating layers 116 facing each other in the first outer through hole OH1. The second distance dis2 may be defined as a distance between the upper surfaces of the insulating layer 116 that meets the lower surface of the upper inorganic pattern layer UPVX with the first outer through hole OH1 therebetween. Therefore, the lower surface of the first protruding tip PT1 and the lower surface of the second protruding tip PT2 may overlap the first outer through hole OH1.

Referring to FIG. 6B, the upper inorganic pattern layer UPVX may include a protruding tip protruding toward the center of the outer groove OGV. The direction toward the center of the outer groove OGV may be a direction from the inner surface of the insulating layer 116 defining the outer groove OGV to the central axis of the outer groove OGV. Therefore, the lower surface of the protruding tip may be exposed through the outer groove OGV. In such an embodiment, the outer groove OGV of the insulating layer 116 may have an undercut structure.

The first upper inorganic pattern layer UPVX1 may include a first protruding tip PT1 protruding toward the center of the first outer groove OGV1. The second upper inorganic pattern layer UPVX2 may include a second protruding tip PT2 protruding toward the center of the first outer groove OGV1. The first protruding tip PT1 and the second protruding tip PT2 may face each other with the first outer groove OGV1 therebetween. The lower surface of the first protruding tip PT1 and the lower surface of the second protruding tip PT2 may overlap the first outer groove OGV1.

According to an embodiment, a first distance dis1 between the first protruding tip PT1 and the second protruding tip PT2 may be less than a second distance dis2 between the insulating layers 116 facing each other in the first outer groove OGV1. The second distance dis2 may be defined as a distance between the upper surfaces of the insulating layer 116 that meets the lower surface of the upper inorganic pattern layer UPVX with the first outer groove OGV1 therebetween. Therefore, the lower surface of the first protruding tip PT1 and the lower surface of the second protruding tip PT2 may be exposed in the first outer groove OGV1. Hereinafter, embodiments in which the insulating layer 116 includes the outer through hole OH as illustrated in FIG. 6A will be described in detail.

The organic pattern layer 118P may be arranged in the peripheral area PA. The organic pattern layer 118P may be on the insulating layer 116. According to an embodiment, the organic pattern layer 118P may be on the organic inorganic pattern layer UPVX. According to an embodiment, a plurality of organic pattern layers 118P may be provided. In one embodiment, for example, the organic pattern layer 118P may include a first organic pattern layer 118P1, a second organic pattern layer 118P2, and a third organic pattern layer 118P3, which are apart from each other. The first organic pattern layer 118P1 may be farther away from the front display area FDA than the second organic pattern layer 118P2 and the third organic pattern layer 118P3. The second organic pattern layer 118P2 may be farther away from the front display area FDA than the third organic pattern layer 118P3.

An inner organic pattern layer 1181P may be on the insulating layer 116. The inner organic pattern layer 1181P may overlap the peripheral area PA. The inner organic pattern layer 1181P may be closer to the front display area FDA than the organic pattern layer 118P. According to an embodiment, a plurality of inner organic pattern layers 1181P may be provided, and the inner organic pattern layers 1181P may be apart from each other. The inner organic pattern layer 1181P may cover the edge of the third line WL3. The inner organic pattern layer 1181P may prevent or reduce deterioration of the side surface of the third line WL3. According to an embodiment, the inner organic pattern layer 1181P may include an organic insulating material. According to an embodiment, the inner organic pattern layer 1181P may include a same material as that of the pixel defining layer 118.

A first upper organic pattern layer 119P1 may be on the first organic pattern layer 118P1. The first upper organic pattern layer 119P1 may include a same material as that of the spacer 119. The first upper organic pattern layer 119P1 may be apart from the spacer 119. The first organic pattern layer 118P1 and the first upper organic pattern layer 119P1 may be a portion of an outer dam ODP. In such an embodiment, the outer dam ODP may be on the first upper inorganic pattern layer UPVX1, and the outer dam ODP includes a first organic pattern layer 118P1 and a first upper organic pattern layer 119P1. The outer dam ODP may be farther away from the display area DA than the outer through hole OH or the outer groove OGV.

The second organic pattern layer 118P2 may be a portion of an outer auxiliary dam OADP. In such an embodiment, the outer auxiliary dam OADP may be on the second upper inorganic pattern layer UPVX2, and the outer dam ODP may include a second organic pattern layer 118P2. According to an embodiment, a first outer through hole OH1 or a first outer groove OGV1 may be between the outer dam ODP and the outer auxiliary dam OADP.

FIGS. 6A and 6B illustrate an embodiment of the display panel 10 including one outer dam ODP and one outer auxiliary dam OADP, but not being limited thereto. In an alternative embodiment, a plurality of outer dams ODP are provided. According to an alternative embodiment, a plurality of outer auxiliary dams OADP may be provided. According to another alternative embodiment, the outer auxiliary dam OADP may be omitted.

The upper inorganic pattern layer UPVX as described above may be an element for improving the reliability of the display panel 10. According to an embodiment, a first functional layer 212a and a second functional layer 212c may be formed in a portion of the front display area FDA and the peripheral area PA. The first functional layer 212a and the second functional layer 212c may include an organic material, and external oxygen or moisture, or the like may flow into the display area through at least one of the first functional layer 212a and the second functional layer 212c. Such oxygen or moisture may damage the organic light-emitting diode arranged in the display area. The upper inorganic pattern layer UPVX may have a protruding tip protruding toward the center of the outer groove OGV or the outer through hole OH to disconnect each of the first functional layer 212a and the second functional layer 212c, and thus, infiltration of moisture and oxygen from the outside to the organic light-emitting diode may be prevented or reduced. Therefore, the reliability of the display panel may be improved.

In such an embodiment, the width of the peripheral area PA of the display panel may be reduced due to the upper inorganic pattern layer UPVX. According to an embodiment, the first functional layer 212a and the second functional layer 212c may be disposed in a portion of the front display area FDA and the peripheral area PA. If the upper inorganic pattern layer UPVX is omitted, external oxygen or moisture may be introduced from the end of the first functional layer 212a and the end of the second functional layer 212c. Therefore, it is desired to adjust the areas in which the first functional layer 212a and the second functional layer 212c are formed. However, such adjustment may increase the area of the peripheral area PA. According to an embodiment, the upper inorganic pattern layer UPVX may have a protruding tip protruding toward the center of the outer groove OGV or the outer through hole OH to disconnect each of the first functional layer 212a and the second functional layer 212c, and thus, infiltration of moisture and oxygen from the outside to the organic light-emitting diode may be prevented or reduced. Therefore, in such an embodiment, the areas, in which the first functional layer 212a and the second functional layer 212c are formed, may not be adjusted, such that the area of the non-display area of the display panel may be reduced.

According to an embodiment, the opposite electrode 213 may extend from the front display area FDA to the first valley hole VH1 and the second valley hole VH2. According to an embodiment, the opposite electrode 213 may be electrically connected to the third line WL3 through the first valley hole VH1 and the second valley hole VH2.

According to an embodiment, the opposite electrode 213 may extend to the outer contact hole OCNT. According to an embodiment, the opposite electrode 213 may be electrically connected to the third line WL3 through the outer contact hole OCNT.

The encapsulation layer ENL may be arranged in the front display area FDA and the peripheral area PA. The first inorganic encapsulation layer 310 and the second inorganic encapsulation layer 330 may extend from the front display area FDA to the peripheral area PA. The first inorganic encapsulation layer 310 and the second inorganic encapsulation layer 330 may extend to the outer dam ODP. According to an embodiment, the first inorganic encapsulation layer 310 and the second inorganic encapsulation layer 330 may extend from the front organic light-emitting diode FOLED to the organic pattern layer 118P.

The first inorganic encapsulation layer 310 may be in contact with the protruding tip of the upper inorganic pattern layer UPVX. In one embodiment, for example, the first inorganic encapsulation layer 310 may be in contact with the first protruding tip PT1 of the first upper inorganic pattern layer UPVX1 and the second protruding tip PT2 of the second upper inorganic pattern layer UPVX2. According to an embodiment, the first inorganic encapsulation layer 310 may be in contact with the lower surface UPVXLS of the upper inorganic pattern layer UPVX overlapping the outer through hole or the outer groove.

According to an embodiment, the first inorganic encapsulation layer 310 may be in contact with the lower inorganic pattern layer LPVX. In one embodiment, for example, the first inorganic encapsulation layer 310 may be in contact with the first lower inorganic pattern layer LPVX1 and the second lower inorganic pattern layer LPVX2. In an embodiment, the first inorganic encapsulation layer 310 may be in contact with the inorganic insulating layer IIL.

In an embodiment, as described above, the first inorganic encapsulation layer 310 may be in contact with the inorganic insulating layer IIL, the lower inorganic pattern layer LPVX, and the upper inorganic pattern layer UPVX in the peripheral area PA. Therefore, infiltration of moisture and oxygen from the outside to the organic light-emitting diode may be prevented or reduced.

The organic encapsulation layer 320 may extend from the front display area FDA to the peripheral area PA. The organic encapsulation layer 320 may fill the valley portion VP. In such an embodiment, the organic encapsulation layer 320 may overlap the first valley hole VH1 and the second valley hole VH2. According to an embodiment, the organic encapsulation layer 320 may extend to the third organic pattern layer 118P3. According to an embodiment, the organic encapsulation layer 320 may extend to the outer auxiliary dam OADP. According to an embodiment, the organic encapsulation layer 320 may extend to the outer dam ODP. The third organic pattern layer 118P3, the outer auxiliary dam OADP, and the outer dam ODP may control the flow of the organic material forming the organic encapsulation layer 320.

The second inorganic encapsulation layer 330 may be in contact with the first inorganic encapsulation layer 310 on at least one of the outer dam ODP and the outer auxiliary dam OADP.

Figure 7:
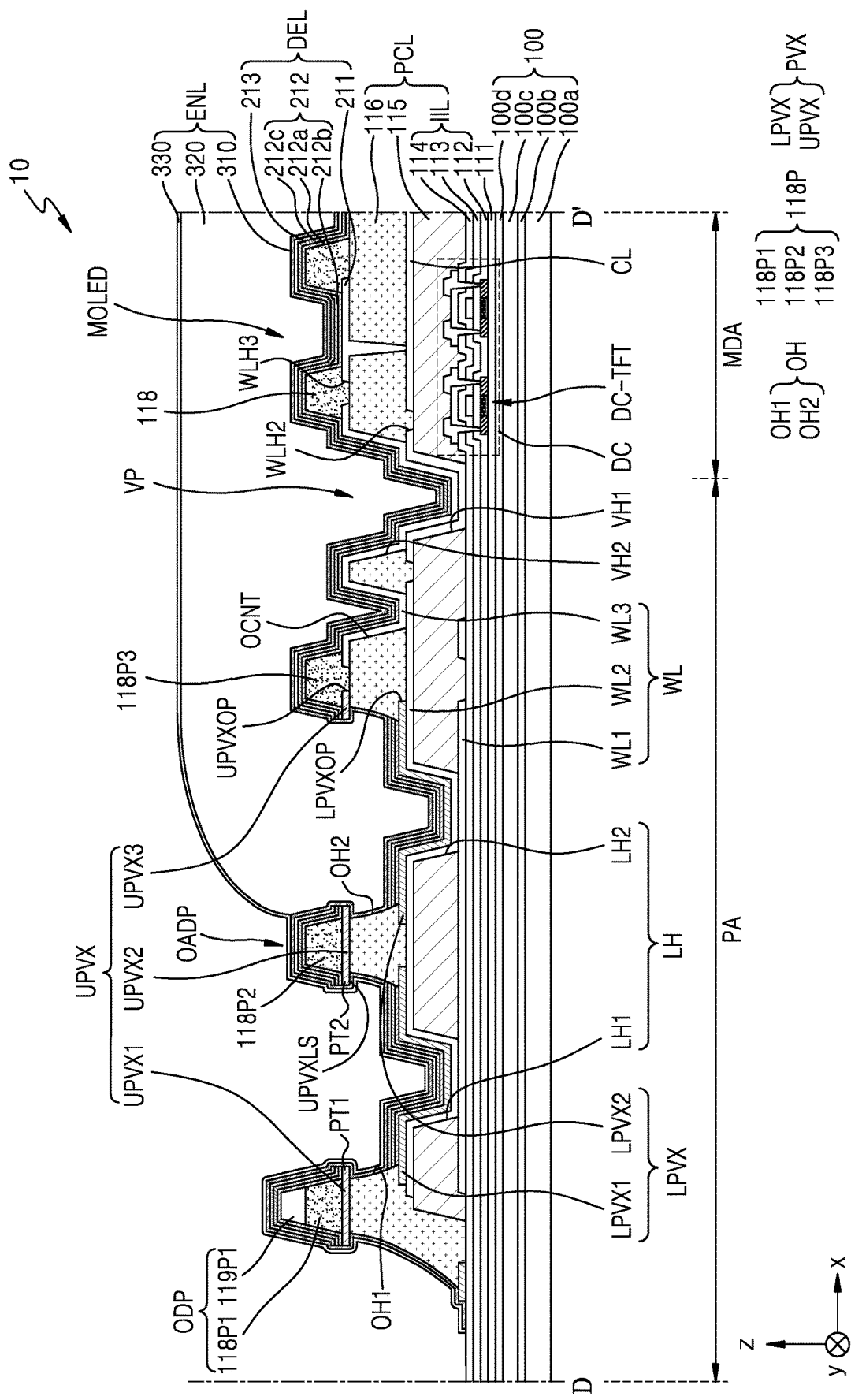
FIG. 7 is a schematic cross-sectional view of the display panel taken along line D-D' of FIG. 4.

FIG. 7 is a schematic cross-sectional view of the display panel 10 taken along line D-D' of FIG. 4. In FIG. 7, the same reference numerals as those in FIGS. 5 and 6A denote the same members, and any repetitive detailed descriptions thereof will be omitted.

FIG. 7 shows a third portion of the peripheral area PA between the first portion and a second portion (shown in FIG. 13) of the peripheral area PA. Referring to FIG. 7, an embodiment of the display panel 10 may include a substrate 100, a buffer layer 111, a pixel circuit layer PCL, an inorganic pattern layer PVX, a display element layer DEL, and an encapsulation layer ENL.

The substrate 100 may include a peripheral area PA and a middle display area MDA.

The pixel circuit layer PCL may include a line WL, a driving circuit DC, an inorganic insulating layer IIL, a lower insulating layer 115, and an insulating layer 116. According to an embodiment, the line WL may include a first line WL1, a second line WL2, and a third line WL3. The driving circuit DC may be arranged in the middle display area MDA. The inorganic insulating layer IIL may include a first gate insulating layer 112, a second gate insulating layer 113, and an interlayer insulating layer 114.

The inorganic pattern layer PVX may include a lower inorganic pattern layer LPVX and an upper inorganic pattern layer UPVX. According to an alternative embodiment, the lower inorganic pattern layer LPVX may be omitted.

A middle organic light-emitting diode MOLED may be on the middle display area MDA. The middle organic light-emitting diode MOLED may overlap the driving circuit thin-film transistor DC-TFT. The middle organic light-emitting diode MOLED may be electrically connected to the connection line CL between the lower insulating layer 115 and the insulating layer 116.

The middle organic light-emitting diode MOLED may include a pixel electrode 211, an intermediate layer 212, and an opposite electrode 413. According to an embodiment, the intermediate layer 212 may include a first functional layer 212*a*, an emission layer 212*b*, and a second functional layer 212*c*.

At least one of the first functional layer 212*a* and the second functional layer 212*c* may extend from the middle display area MDA to the peripheral area PA. In one embodiment, for example, the first functional layer 212*a* may extend from the middle display area MDA to the peripheral area PA. In one alternative embodiment, for example, the second functional layer 212*c* may extend from the middle display area MDA to the peripheral area PA. As another example, the first functional layer 212*a* and the second functional layer 212*c* may extend from the middle display area MDA to the peripheral area PA. Hereinafter, embodiments in which the first functional layer 212*a* and the second functional layer 212*c* extend from the middle display area MDA to the peripheral area PA will be described in detail. In such an embodiment, the opposite electrode 213 may extend from the middle display area MDA to the peripheral area PA.

According to an embodiment, the first functional layer 212*a*, the second functional layer 212*c*, and the opposite electrode 213 may be on at least one of the outer dam ODP and the outer auxiliary dam OADP. The first functional layer 212*a*, the second functional layer 212*c*, and the opposite electrode 213 may be disconnected by the protruding tip of the upper inorganic pattern layer UPVX. In one embodiment, for example, the first functional layer 212*a*, the second functional layer 212*c* and the opposite electrode 213 may be on the first protruding tip PT1 and the second protruding tip PT2, and the first functional layer 212*a*, the second functional layer 212*c* and the opposite electrode 213 may be apart from each other with the first outer through hole OH1 therebetween. The first functional layer 212*a*, the second functional layer 212*c* and the opposite electrode 213 may be inside the first outer through hole OH1. Therefore, the first functional layer 212*a*, the second functional layer 212*c* and the opposite electrode 213 may not be in contact with the lower surface UPVXLS of the upper inorganic pattern layer UPVX overlapping the outer through hole OH.

The encapsulation layer ENL may be disposed in the middle display area MDA and the peripheral area PA. The first inorganic encapsulation layer 310 and the second inorganic encapsulation layer 330 may extend from the middle display area MDA to the peripheral area PA. The first inorganic encapsulation layer 310 and the second inorganic encapsulation layer 330 may extend to the outer dam ODP.

The first inorganic encapsulation layer 310 may be in contact with the protruding tip of the upper inorganic pattern layer UPVX. In one embodiment, for example, the first inorganic encapsulation layer 310 may be in contact with the first protruding tip PT1 of the first upper inorganic pattern layer UPVX1 and the second protruding tip PT2 of the second upper inorganic pattern layer UPVX2. The first inorganic encapsulation layer 310 may be in contact with the lower surface UPVXLS of the upper inorganic pattern layer UPVX overlapping the outer through hole OH.

The organic encapsulation layer 320 may extend from the middle display area MDA to the peripheral area PA. The organic encapsulation layer 320 may fill the valley portion VP. In such an embodiment, the organic encapsulation layer 320 may overlap the first valley hole VH1 and the second valley hole VH2. According to an embodiment, the organic encapsulation layer 320 may extend to the third organic pattern layer 118P3. According to an embodiment, the organic encapsulation layer 320 may extend to the outer auxiliary dam OADP. According to an alternative embodiment, the organic encapsulation layer 320 may extend to the outer dam ODP.

The second inorganic encapsulation layer 330 may be in contact with the first inorganic encapsulation layer 310 on at least one of the outer dam ODP and the outer auxiliary dam OADP.

In an embodiment, the display panel 10 may display an image not only in the front display area FDA and the side display area but also in the middle display area MDA, in which the driving circuit DC is arranged, and the corner display area arranged in the corner. In an embodiment, the first functional layer 212*a*, the second functional layer 212*c* and the opposite electrode 213 may be provided or formed on the middle display area MDA and/or the corner display area to form a middle organic light-emitting diode in the middle display area MDA and/or a corner organic light-emitting diode in the corner display area. In such an embodiment, the first functional layer 212*a*, the second functional layer 212*c*, and the opposite electrode 213 may also be provided or formed on the outer dam ODP and the outer auxiliary dam OADP on the peripheral area PA adjacent to the middle display area MDA and/or the corner display area.

If the upper inorganic pattern layer UPVX is not provided or arranged as described above, the first functional layer 212a, the second functional layer 212c and the opposite electrode 213 may be continuously arranged in the peripheral area PA. In this case, external oxygen or moisture may be introduced into the display area through the first functional layer 212a and/or the second functional layer 212c. Such oxygen or moisture may damage the organic light-emitting diode arranged in the display area.

In an embodiment of the invention, as described herein, the upper inorganic pattern layer UPVX is provided on the insulating layer 116 and the protruding tip protruding toward the center of the outer through hole OH or the outer groove OGV of the insulating layer 116, such that the first functional layer 212a, the second functional layer 212c and the opposite electrode 213 may be disconnected on the peripheral area PA. Therefore, in such an embodiment, infiltration of external oxygen or moisture from the peripheral area PA to the display area may be prevented or reduced.

Figure 8:
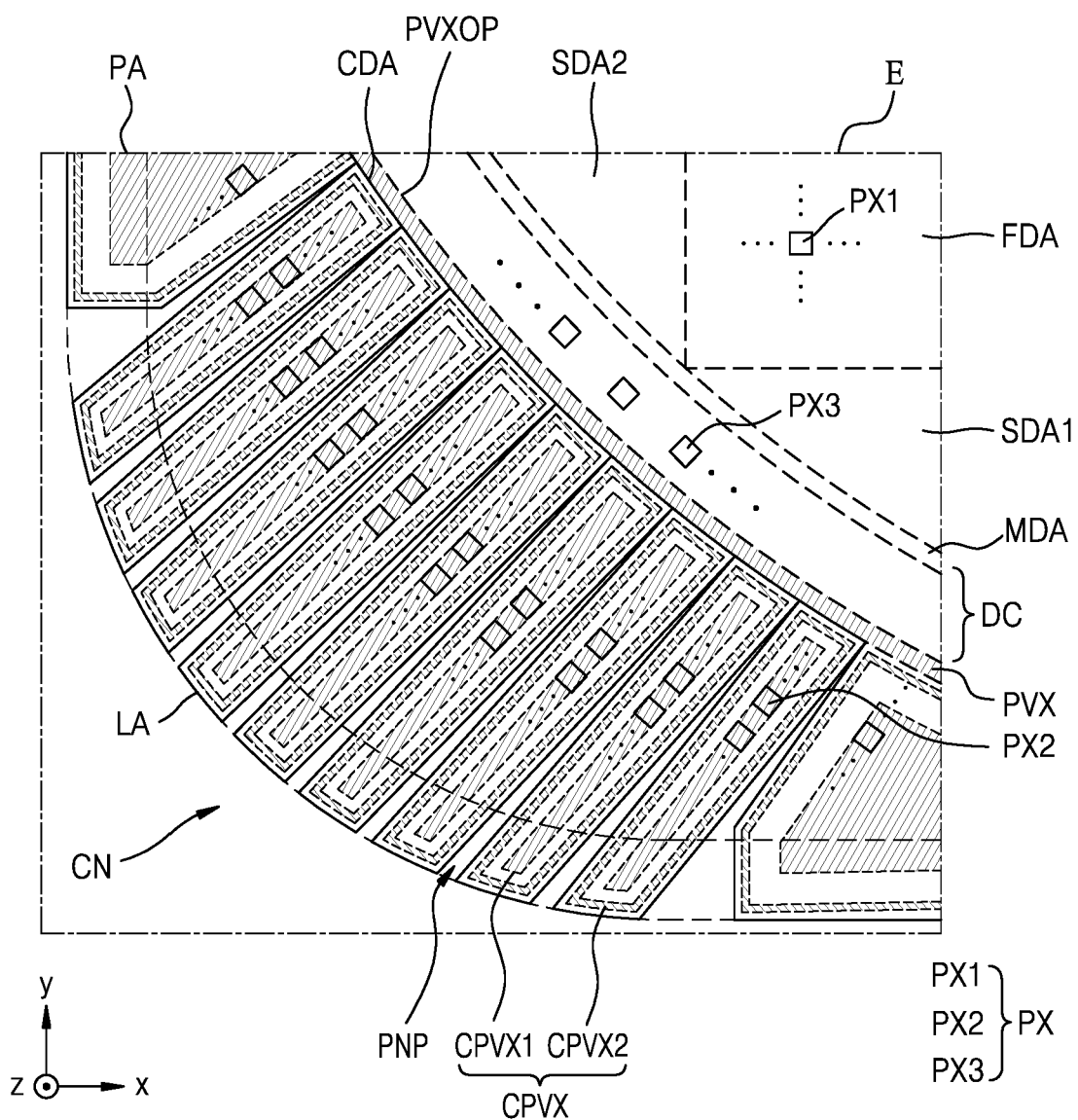
FIG. 8 is an enlarged view of a corner of the display panel, according to an embodiment.

FIG. 8 is an enlarged view of the corner CN of the display panel, according to an embodiment. FIG. 8 is an enlarged view of portion E of FIG. 4. In FIG. 8, the same reference numerals as those in FIG. 4 denote the same members, and any repetitive detailed descriptions thereof will be omitted.

Referring to FIG. 8, an embodiment of the display panel may include the corner CN. In such an embodiment, the substrate may include a front display area FDA, a first side display area SDA1, a second side display area SDA2, a corner display area CDA, a middle display area MDA, and a peripheral area PA. The corner display area CDA may be disposed in the corner CN of the display panel. In such an embodiment, the corner display area CDA may be between the front display area FDA and the peripheral area PA. The middle display area MDA may be between the corner display area CDA and the front display area FDA.

A first pixel PX1 may be on the front display area FDA. A second pixel PX2 may be on the corner display area CDA. A driving circuit DC and a third pixel PX3 overlapping the driving circuit DC may be on the middle display area MDA. According to an alternative embodiment, the driving circuit DC may not be on the middle display area MDA.

The inorganic pattern layer PVX may surround the front display area FDA. In an embodiment, an opening PVXOP may be defined through the inorganic pattern layer PVX to overlap the front display area FDA. The inorganic pattern layer PVX may extend between the front display area FDA and the corner display area CDA.

The substrate may include a plurality of extension areas LA that overlap at least a portion of the corner display area CDA. Each of the extension areas LA may extend in a direction away from the front display area FDA. According to an embodiment, the extension areas LA may overlap the corner display area CDA and the peripheral area PA. In such an embodiment, the second pixel PX2 may be on the extension area LA. The second pixels PX2 may be arranged side by side in the extending direction of the extension areas LA.

A penetrating portion PNP may be defined between the neighboring extension areas LA. The penetrating portion PNP may be defined to penetrate through the display panel. When the corner display area CDA is bent at the corner CN, a compressive strain may be greater than a tensile strain in the corner display area CDA. In such an embodiment where the penetrating portion PNP is defined between the neighboring extension areas LA, the extension areas LA may contract. Therefore, when the corner display area CDA is bent, the display panel may be bent without damage.

A corner inorganic pattern layer CPVX may be on the extension area LA. The corner inorganic pattern layer CPVX may include a first corner inorganic pattern layer CPVX1 and a second corner inorganic pattern layer CPVX2. The first corner inorganic pattern layer CPVX1 and the second corner inorganic pattern layer CPVX2 may be on the extension area LA. The first corner inorganic pattern layer CPVX1 and the second corner inorganic pattern layer CPVX2 may be in a form of a single-layer film or a multilayer film, each layer including an inorganic material such as silicon nitride ($SiN_x$), silicon oxide ($SiO_2$), and/or silicon oxynitride (SiON).

The first corner inorganic pattern layer CPVX1 may overlap the second pixel PX2. According to an embodiment, the corner display element of the second pixel PX2 may be on the first corner inorganic pattern layer CPVX1.

The second corner inorganic pattern layer CPVX2 may surround the second pixel PX2. The second corner inorganic pattern layer CPVX2 may be apart from the first corner inorganic pattern layer CPVX1.

The first corner inorganic pattern layer CPVX1 and the second corner inorganic pattern layer CPVX2 may prevent or reduce infiltration of external moisture or oxygen from the penetrating portion PNP to the corner display element of the second pixel PX2. This will be described later in detail.

Figure 9:
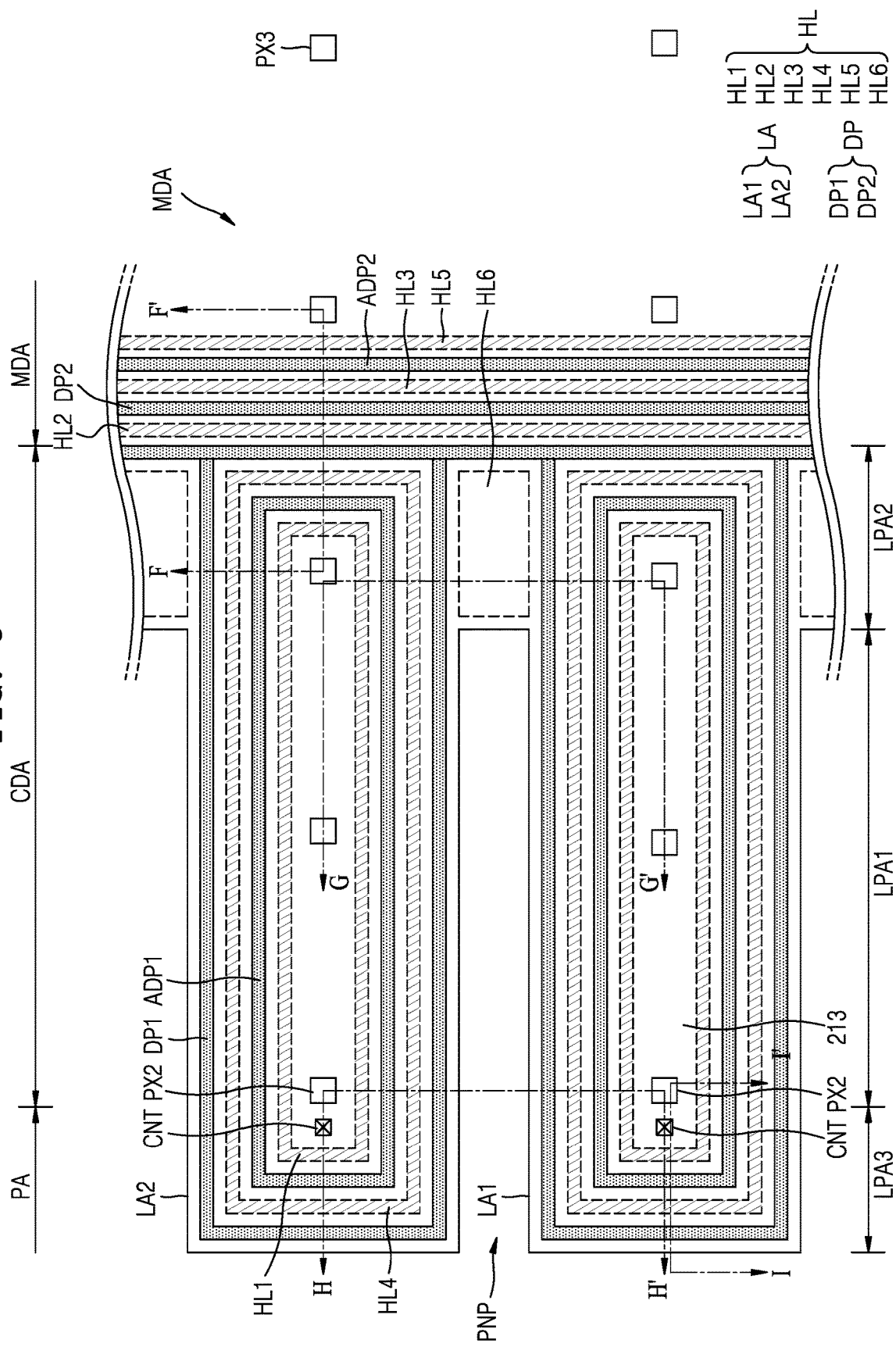
FIG. 9 is a schematic plan view of a portion of a display panel, according to an embodiment.

FIG. 9 is a schematic plan view of a portion of a display panel, according to an embodiment.

Referring to FIG. 9, in an embodiment of a display panel, a substrate may include a plurality of extension areas LA. In one embodiment, for example, the substrate may include a first extension area LA1 and a second extension area LA2. The first extension area LA1 and the second extension area LA2 may extend from a middle display area MDA. The first extension area LA1 and the second extension area LA2 may overlap a corner display area CDA and a peripheral area PA. A penetrating portion PNP penetrating through the display panel may be defined between the first extension area LA1 and the second extension area LA2. The penetrating portion PNP may be an empty space defined between two adjacent extension areas of the substrate.

The extension area LA may include a first area LPA1, a second area LPA2, and a third area LPA3. The first area LPA1 and the second area LPA2 may overlap the corner display area CDA. According to an embodiment, the neighboring extension areas LA may be connected to each other in the second area LPA2. In one embodiment, for example, the first extension area LA1 and the second extension area LA2 may be connected to each other in the second area LPA2. In such an embodiment, the second area LPA2 of the first extension area LA1 and the second area LPA2 of the second extension area LA2 may be integrally formed with each other as a single unitary unit. The third area LPA3 may overlap the peripheral area PA.

A plurality of second pixels PX2 may be arranged in the first extension area LA1 and the second extension area LA2, and a plurality of third pixels PX3 may be arranged in the middle display area MDA. In an embodiment, the second pixels PX2 and the third pixels PX3 may be arranged side by side in the extending direction of the first extension area LA1. In such an embodiment, the second pixels PX2 and the third pixels PX3 may be arranged side by side in the extending direction of the second extension area LA2.

An insulating layer may be on the substrate, and a hole HL may be defined through the insulating layer. The hole HL may penetrate through the insulating layer. In such an embodiment, at least one of a plurality of holes HL may overlap the first extension area LA1 and/or the second extension area LA2. According to an embodiment, the holes HL may include a first hole HL1, a second hole HL2, a third hole HL3, a fourth hole HL4, a fifth hole HL5, and a sixth hole HL6. According to an alternative embodiment, the insulating layer may include a plurality of grooves. Hereinafter, embodiments where the holes HL are defined through the insulating layer will be described in detail.

The first hole HL1 may overlap the first extension area LA1 and/or the second extension area LA2. According to an embodiment, the first hole HL1 may surround the second pixels PX2. According to an alternative embodiment, the first hole HL1 may be arranged to surround each of the second pixels PX2.

The second hole HL2 may be between the second pixel PX2 and the third pixel PX3. According to an embodiment, the second hole HL2 may extend in a direction in which the first extension area LA1 and the second extension area LA2 are apart from each other. In one embodiment, for example, the second hole HL2 may extend in one direction. The second hole HL2 may extend along the edge of the middle display area MDA.

The third hole HL3 may be between the second hole HL2 and the third pixel PX3. According to an embodiment, the third hole HL3 may extend parallel to the second hole HL2. In one embodiment, for example, the third hole HL3 may extend in a direction in which the first extension area LA1 and the second extension area LA2 are apart from each other. According to an embodiment, the third hole HL3 may be connected to the first outer through hole OH1 of FIG. 6A.

The fourth hole HL4 may overlap the first extension area LA1 and/or the second extension area LA2. The fourth hole HL4 may surround the first hole HL1. In one embodiment, for example, the fourth hole HL4 may surround the second pixels PX2 and the first hole HL1.

The fifth hole HL5 may be between the third hole HL3 and the third pixel PX3. According to an embodiment, the fifth hole HL5 may extend parallel to the second hole HL2 and/or the third hole HL3. In one embodiment, for example, the fifth hole HL5 may extend in a direction in which the first extension area LA1 and the second extension area LA2 are apart from each other. According to an embodiment, the fifth hole HL5 may be connected to the second outer through hole OH2 of FIG. 6A.

The sixth hole HL6 may overlap the second area LPA2. The sixth hole HL6 may be between the fourth hole HL4 of the first extension area LA1 and the fourth hole HL4 of the second extension area LA2, which are adjacent to each other.

An upper inorganic pattern layer may include a protruding tip on the insulating layer and protruding toward the center of the hole HL.

In an embodiment where the display element included in the second pixel PX2 is an organic light-emitting diode, the organic light-emitting diode may include a pixel electrode, an intermediate layer including an emission layer, and an opposite electrode 213. In such an embodiment, the intermediate layer may include a first functional layer between the pixel electrode and the emission layer and/or a second functional layer between the emission layer and the opposite electrode 213. The first functional layer and the second functional layer may be provided or formed on the entire surfaces of the middle display area MDA, the first extension area LA1, and the second extension area LA2. The first functional layer and the second functional layer may include an organic material, and external oxygen or moisture may be introduced into the middle display area MDA, the first extension area LA1, and the second extension area LA2 through the first functional layer and the second functional layer. Such oxygen or moisture may damage the organic light-emitting diodes arranged in the middle display area MDA, the first extension area LA1, and the second extension area LA2. In an embodiment of the invention, as described herein, the first functional layer and the second functional layer may be disconnected by the hole HL of the insulating layer and the protruding tip of the upper inorganic pattern layer, which may prevent infiltration of external moisture and oxygen into the organic light-emitting diode. Therefore, damage to the organic light-emitting diode may be prevented.

The display panel may include dams DP on the substrate. The dam DP may protrude from the reference surface in the thickness direction of the substrate. The dam DP may be on the upper inorganic pattern layer. In one embodiment, for example, the dam DP may protrude from the upper surface of the upper inorganic pattern layer in the thickness direction of the substrate. At least one of the dams DP may be arranged to surround the second pixel PX2. At least one of the dams DP may be arranged to surround the display element of the second pixel PX2. The dams DP may include a first dam DP1 and a second dam DP2.

The first dam DP1 may surround a plurality of second pixels PX2. The first dam DP1 may be arranged to surround the first hole HL1 and the fourth hole HL4. According to an embodiment, a portion of the first dam DP1 may extend in a direction in which the first extension area LA1 and the second extension area LA2 are apart from each other. In one embodiment, for example, the first dam DP1 may extend along the edge of the middle display area MDA.

The second dam DP2 may be between the first dam DP1 and the third pixel PX3. Specifically, the second dam DP2 may be between the second hole HL2 and the third hole HL3. In this case, the second dam DP2 may extend in a direction in which the second hole HL2 and/or the third hole HL3 extends. The second dam DP2 may extend in a direction in which the first extension area LA1 and the second extension area LA2 are apart from each other.

The first auxiliary dam ADP1 may be between the second pixel PX2 and the first dam DP1. The first auxiliary dam ADP1 may be between the first hole HL1 and the fourth hole HL4. Therefore, the first auxiliary dam ADP1 may be arranged to surround the second pixel PX2 and the first hole HL1.

The second auxiliary dam ADP2 may be between the third pixel PX3 and the second dam DP2. The second auxiliary dam ADP2 may be between the third hole HL3 and the fifth hole HL5. In an embodiment, the second auxiliary dam ADP2 may extend in a direction in which the third hole HL3 and/or the fifth hole HL5 extends. In one embodiment, for example, the second auxiliary dam ADP2 may extend in a direction in which the first extension area LA1 and the second extension area LA2 are apart from each other.

The first auxiliary dam ADP1 and the second auxiliary dam ADP2 may be on the upper inorganic pattern layer, and may protrude from the upper surface of the upper inorganic pattern layer in the thickness direction of the substrate. The thickness of the first auxiliary dam ADP1 and the thickness of the second auxiliary dam ADP2 may be less than the thickness of the dam DP.

According to an embodiment, at least one of the first dam DP1, the second dam DP2, and the second auxiliary dam ADP2 may be connected to at least one of the outer dam ODP and the outer auxiliary dam OADP of FIG. 6A.

In an embodiment where the display element included in the second pixel PX2 is an organic light-emitting diode, the organic light-emitting diode may be vulnerable to oxygen and moisture, as described above. Therefore, an encapsulation layer encapsulating the organic light-emitting diode may be on the second pixel PX2. The encapsulation layer may include at least one inorganic encapsulation layer and at least one organic encapsulation layer. Because the dam DP protrudes from the upper surface of the upper inorganic pattern layer in the thickness direction of the substrate, the flow of a material of the at least one organic encapsulation layer may be controlled in a process of providing the organic encapsulation layer. In such an embodiment, the dam DP may separate the at least one organic encapsulation layer. In such an embodiment, the first hole HL1, the third hole HL3, the fourth hole HL4, and the fifth hole HL5 may overlap the at least one organic encapsulation layer.

A contact hole CNT may be provided or defined to correspond to the distal end of the first extension area LA1 and/or the second extension area LA2. The contact hole CNT may overlap the third area LPA3. The contact hole CNT may be surrounded by the first hole HL1. The contact hole CNT may be between the first hole HL1 and the second pixel PX2 farthest away from the middle display area MDA. In an embodiment, the opposite electrode 213 may also be formed on the entire surfaces of the middle display area MDA and the extension area LA, similarly to the first functional layer or the second functional layer. In such an embodiment, the opposite electrode 213 may be disconnected based on the hole HL. Therefore, a connection line configured to supply power may be arranged in the first extension area LA1 and/or the second extension area LA2, and the connection line may supply the second power supply voltage (see ELVSS in FIG. 3) to the second pixel PX2 through the contact hole CNT.

Figure 10A:
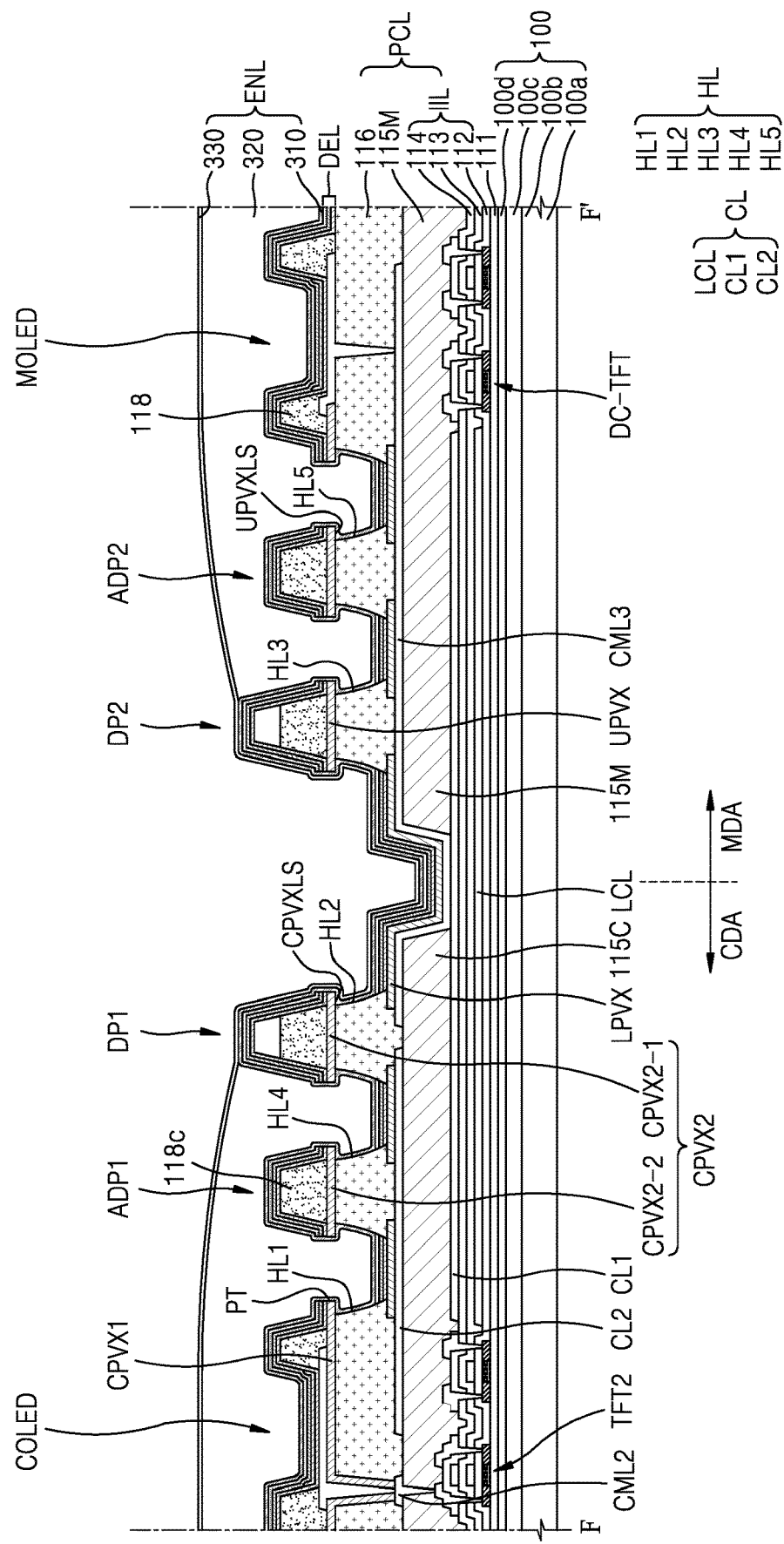
FIG. 10A is a cross-sectional view of the display panel taken along line F-F' of FIG. 9.
Figure 10B:
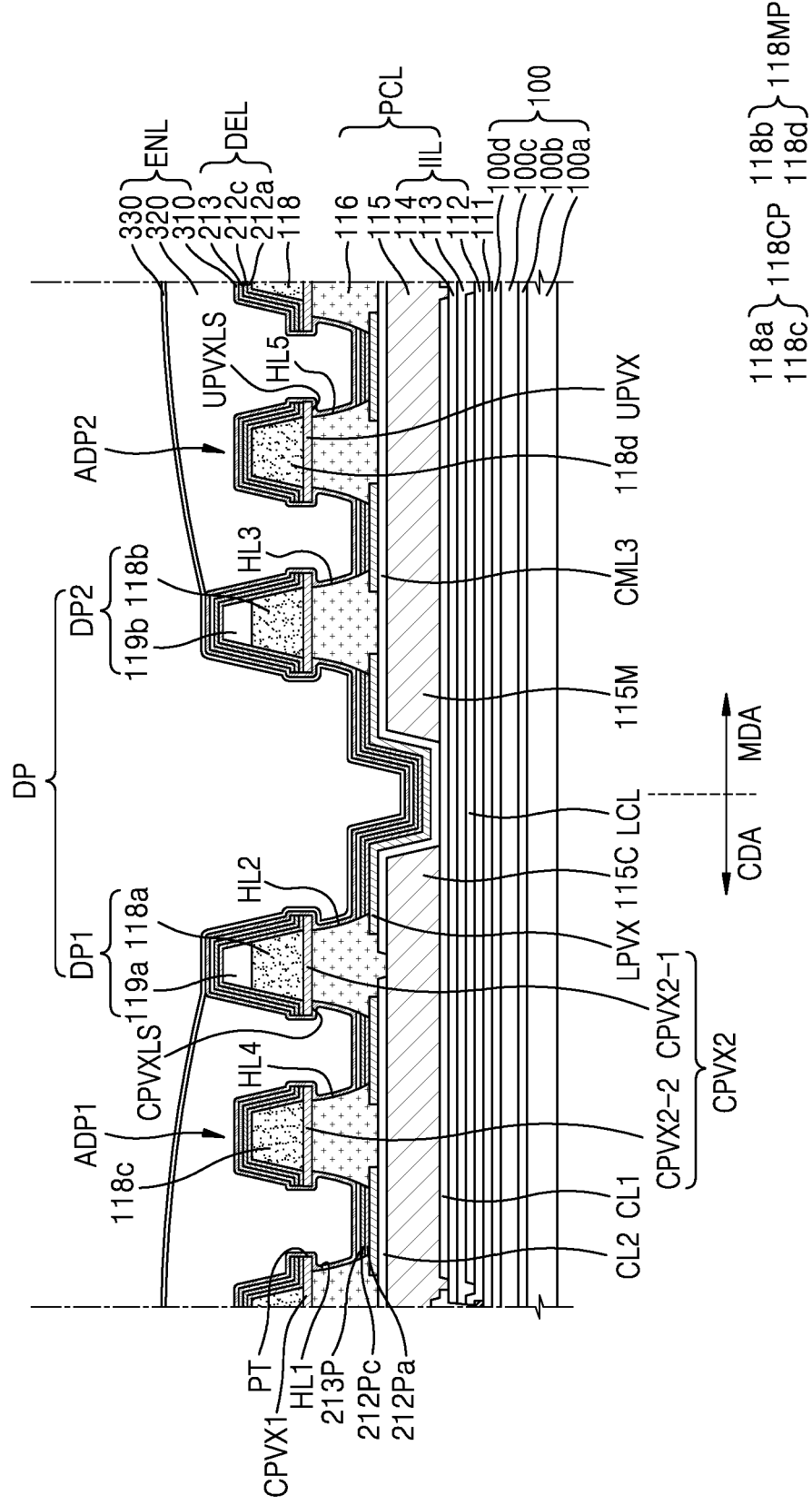
FIG. 10B is an enlarged view of a dam of FIG. 10A.

FIG. 10A is a cross-sectional view of the display panel taken along line F-F' of FIG. 9. FIG. 10B is an enlarged view of a dam of FIG. 10A. In FIGS. 10A and 10B, the same reference numerals as those in FIG. 5 denote the same members, and any repetitive detailed descriptions thereof will be omitted.

Referring to FIGS. 10A and 10B, an embodiment of the display panel may include a corner display area CDA and a middle display area MDA. A second thin-film transistor TFT2 and a corner organic light-emitting diode COLED may be arranged in a corner display area CDA, and a middle organic light-emitting diode MOLED may be arranged in a middle display area MDA. The second thin-film transistor TFT2 and the corner organic light-emitting diode COLED may constitute a subpixel in the corner display area CDA, and the middle organic light-emitting diode MOLED may constitute a subpixel in the middle display area MDA.

One of the middle organic light-emitting diodes MOLED may be positioned closest to the edge of the middle display area MDA, and may be arranged to face the corner organic light-emitting diode COLED.

A substrate 100, a buffer layer 111, a pixel circuit layer PCL, a display element layer DEL, and an encapsulation layer ENL may be arranged in the middle display area MDA and the corner display area CDA. The pixel circuit layer PCL may include an inorganic insulating layer IIL, a connection line CL, a driving circuit thin-film transistor DC-TFT, a second thin-film transistor TFT2, a lower insulating layer 115, and an insulating layer 116. The connection line CL may include a lower connection line LCL, a first connection line CL1, and a second connection line CL2.

According to an embodiment, the lower connection line LCL may be between the first gate insulating layer 112 and the second gate insulating layer 113. According to an alternative embodiment, the lower connection line LCL may be between the second gate insulating layer 113 and the interlayer insulating layer 114. In such an embodiment, the lower connection line LCL may include a same material as that of one of the first gate electrode GE1 and the upper electrode CE2 of FIG. 5. According to another alternative embodiment, the lower connection line LCL may be between the buffer layer 111 and the first gate insulating layer 112. In such an embodiment, the lower connection line LCL may include a same material as that of the first semiconductor layer ACT1 of FIG. 5.

The lower connection line LCL may extend from the middle display area MDA to the corner display area CDA. The lower connection line LCL may be a signal line configured to provide an electrical signal to the corner organic light-emitting diode COLED, or a power line configured to provide power.

The first connection line CL1 may be on the inorganic insulating layer IIL, and the lower insulating layer 115 may be on the first connection line CL1. The lower insulating layer 115 may be divided into a corner insulating layer 115C and a middle insulating layer 115M based on the second hole HL2. The corner insulating layer 115C may be arranged to cover the second thin-film transistor TFT2, and the middle insulating layer 115M may be arranged to cover the driving circuit thin-film transistor DC-TFT. According to an embodiment, a portion of the first connection line CL1 may be exposed between the corner insulating layer 115C and the middle insulating layer 115M.

The second connection line CL2, the second connection electrode CML2, and the third connection electrode CML3 may be on the lower insulating layer 115. The second connection electrode CML2 may be on the corner insulating layer 115C. According to an embodiment, the third connection electrode CML3 may be a portion of the second connection line CL2.

The third connection electrode CML3 may be on the middle insulating layer 115M. According to an embodiment, the third connection electrode CML3 may be connected to the first connection line CL1. In such an embodiment, the third connection electrode CML3 may extend from the middle insulating layer 115M to the corner insulating layer 115C, and may cover the side surface of the middle insulating layer 115M and the side surface of the corner insulating layer 115C, which face each other. In such an embodiment, the third connection electrode CML3 may be connected to the first connection line CL1 exposed between the corner insulating layer 115C and the middle insulating layer 115M. Therefore, the first connection line CL1 and the third connection electrode CML3 may prevent infiltration of moisture from the corner organic light-emitting diode COLED or the middle organic light-emitting diode MOLED.

A lower inorganic pattern layer LPVX may be on the second connection line CL2 and the third connection electrode CML3. According to an embodiment, a plurality of lower inorganic pattern layers LPVX may be on the second connection line CL2 and/or the third connection electrode CML3, and the lower inorganic pattern layers LPVX may be apart from each other on the second connection line CL2 and/or the third connection electrode CML3. According to an embodiment, one of the lower inorganic pattern layers LPVX may cover the side surface of the middle insulating layer 115M and the side surface of the corner insulating layer 115C, which face each other.

The insulating layer 116 may be arranged to cover the second connection line CL2, the second connection electrode CML2, and the third connection electrode CML3. In such an embodiment, the insulating layer 116 may cover the edge of the lower inorganic pattern layer LPVX.

in an embodiment, a hole HL is defined through the insulating layer 116, and the hole HL of the insulating layer 116 may expose a portion of the lower inorganic pattern layer LPVX. In an embodiment, as shown in FIG. 10A, a plurality of holes HL is defined through the insulating layer 116. According to an embodiment, the holes HL may include a first hole HL1, a second hole HL2, a third hole HL3, a fourth hole HL4, and a fifth hole HL5. The first hole HL1 and the fourth hole HL4 may overlap the corner display area CDA. The third hole HL3 and the fifth hole HL5 may overlap the middle display area MDA. The second hole HL2 may be between the third hole HL3 and the fourth hole HL4.

The hole HL of the insulating layer 116 may be formed through an etching process. If the lower inorganic pattern layer LPVX is not provided, the second connection line CL2 may be over-etched through the etching process. In this case, the resistance of the second connection line CL2 may increase. In an embodiment, the lower inorganic pattern layer LPVX is on the second connection line CL2 to overlap the hole HL of the insulating layer 116, such that the over-etching of the second connection line CL2 may be prevented.

A corner inorganic pattern layer CPVX and an upper inorganic pattern layer UPVX may be on the insulating layer 116. The corner inorganic pattern layer CPVX may overlap the corner display area CDA. The upper inorganic pattern layer UPVX may overlap the middle display area MDA. The upper inorganic pattern layer UPVX may extend between the corner display area CDA and the front display area.

The corner inorganic pattern layer CPVX may include a first corner inorganic pattern layer CPVX1 and a second corner inorganic pattern layer CPVX2. According to an embodiment, the first corner inorganic pattern layer CPVX1 may be between the corner organic light-emitting diode COLED and the insulating layer 116. The first corner inorganic pattern layer CPVX1 may be between the pixel electrode of the corner organic light-emitting diode COLED and the insulating layer 116. The second corner inorganic pattern layer CPVX2 may be apart from the first corner inorganic pattern layer CPVX1 on the insulating layer 116 with the hole HL therebetween. In one embodiment, for example, the second corner inorganic pattern layer CPVX2 may be apart from the first corner inorganic pattern layer CPVX1 with the first hole HL1 therebetween.

According to an embodiment, the second corner inorganic pattern layer CPVX2 may include an outer inorganic pattern layer CPVX2-1 and an inner inorganic pattern layer CPVX2-2. The outer inorganic pattern layer CPVX2-1 and the inner inorganic pattern layer CPVX2-2 may be apart from each other. The outer inorganic pattern layer CPVX2-1 may be farther away from the corner organic light-emitting diode COLED than the inner inorganic pattern layer CPVX2-2. According to an embodiment, the outer inorganic pattern layer CPVX2-1 may overlap the first dam DP1. The inner inorganic pattern layer CPVX2-2 may overlap the first auxiliary dam ADP1.

Each of the corner inorganic pattern layer CPVX and the upper inorganic pattern layer UPVX may include a protruding tip PT protruding toward the center of the hole HL. The direction toward the center of the hole HL may be a direction from the inner surface of the insulating layer 116 defining the hole HL to the central axis of the hole HL. Therefore, the lower surface of the protruding tip PT may be exposed through the hole HL. In such an embodiment, the hole HL of the insulating layer 116 may have an undercut structure.

According to an embodiment, each of the upper inorganic pattern layer UPVX and the inner inorganic pattern layer CPVX2-2 may include a protruding tip protruding toward the center of the first hole HL1. According to an embodiment, each of the inner inorganic pattern layer CPVX2-2 and the outer inorganic pattern layer CPVX2-1 may include a protruding tip protruding toward the center of the fourth hole HL4. In such an embodiment, the hole HL of the insulating layer 116 may have an undercut structure. At least one of the lower surface CPVXLS of the corner inorganic pattern layer CPVX and the lower surface UPVXLS of the upper inorganic pattern layer UPVX may overlap the hole HL of the insulating layer 116.

Dams DP protruding from the upper surface of the upper inorganic pattern layer UPVX in the thickness direction of the substrate 100 may be on the upper inorganic pattern layer UPVX. The dams DP may include a first dam DP1 and a second dam DP2, which are apart from each other. The dam DP and the hole HL may be alternately arranged.

The corner organic pattern layer 118CP may be on the corner inorganic pattern layer CPVX. The corner organic pattern layer 118CP may include a same material as that of the pixel defining layer 118. The corner organic pattern layer 118CP may be formed simultaneously with the pixel defining layer 118 during a same process.

The corner organic pattern layer 118CP may include an outer corner organic pattern layer 118a and an inner corner organic pattern layer 118c, which are apart from each other. The outer corner organic pattern layer 118a may be on the outer inorganic pattern layer CPVX2-1. The inner corner organic pattern layer 118c may be on the inner inorganic pattern layer CPVX2-2.

The middle organic pattern layer 118MP may be on the upper inorganic pattern layer UPVX. The middle organic pattern layer 118MP may include the same material as that of the pixel defining layer 118. The middle organic pattern layer 118MP may be formed simultaneously with the pixel defining layer 118 during a same process.

The middle organic pattern layer 118MP may include an outer middle organic pattern layer 118b and an inner middle organic pattern layer 118d, which are apart from each other. The outer middle organic pattern layer 118b and the inner middle organic pattern layer 118d may be on the upper inorganic pattern layer UPVX. According to an embodiment, at least one of the outer middle organic pattern layer 118b and the inner middle organic pattern layer 118d may be connected to the organic pattern layer 118P of FIG. 6A.

An upper corner organic pattern layer 119a may be on the outer corner organic pattern layer 118a. The upper corner organic pattern layer 119a may include the same material as that of the spacer 119. The upper corner organic pattern layer 119a may be formed simultaneously with the spacer 119 during a same process. The outer corner organic pattern layer 118a and the upper corner organic pattern layer 119a may form a first dam DP1.

An upper middle organic pattern layer 119b may be on the outer middle organic pattern layer 118b. The upper middle organic pattern layer 119b may include the same material as that of the spacer 119. The upper middle organic pattern layer 119b may be formed simultaneously with the spacer 119 during a same process. The outer middle organic pattern layer 118b and the upper middle organic pattern layer 119b may form a second dam DP2.

The first functional layer 212a, the second functional layer 212c, and the opposite electrode 213, which are on the corner inorganic pattern layer CPVX and the upper inorganic pattern layer UPVX, may be disconnected by the hole HL and the pair of protruding tips PT. in an embodiment, a first functional layer pattern 212Pa, a second functional layer pattern 212Pc, and an opposite electrode pattern 213P may be arranged in the hole HL. According to an embodiment, at least one of the lower surface CPVXLS of the corner inorganic pattern layer CPVX and the lower surface UPVXLS of the upper inorganic pattern layer UPVX, which overlap the hole HL, may not be in contact with the first functional layer 212a, the second functional layer 212c, and the opposite electrode 213.

A first auxiliary dam ADP1 may be between the corner organic light-emitting diode COLED and the first dam DP1. The first auxiliary dam ADP1 may be between the first hole HL1 and the fourth hole HL4. The first auxiliary dam ADP1 may include an inner corner organic pattern layer 118c. The second auxiliary dam ADP2 may be between the middle organic light-emitting diode MOLED and the second dam DP2. The second auxiliary dam ADP2 may be between the third hole HL3 and the fifth hole HL5. The second auxiliary dam ADP2 may include an inner middle organic pattern layer 118d.

In an embodiment, the thickness of the dam DP may be less than the thickness of the first auxiliary dam ADP1. In such an embodiment, the thickness of the dam DP may be less than the thickness of the second auxiliary dam ADP2. In one embodiment, for example, while the first dam DP1 includes the outer corner organic pattern layer 118a and the upper corner organic pattern layer 119a, the first auxiliary dam ADP1 includes the inner corner organic pattern layer 118c. Therefore, the thickness of the first dam DP1 may be different from the thickness of the first auxiliary dam ADP1. The thickness of the first dam DP1 may be a distance from the upper surface of the outer inorganic pattern layer CPVX2-1 to the upper surface of the upper corner organic pattern layer 119a. The thickness of the first auxiliary dam ADP1 may be a distance from the upper surface of the inner inorganic pattern layer CPVX2-2 to the upper surface of the inner corner organic pattern layer 118c.

In an embodiment, the distance from the upper surface of the substrate 100 to the upper surface of the upper corner organic pattern layer 119a may be greater than the distance from the upper surface of the substrate 100 to the upper surface of the inner corner organic pattern layer 118c. In such an embodiment, the distance from the upper surface of the substrate 100 to the upper surface of the upper middle organic pattern layer 119b may be greater than the distance from the upper surface of the substrate 100 to the upper surface of the inner middle organic pattern layer 118d.

The upper corner organic pattern layer 119a of the first dam DP1 and/or the upper middle organic pattern layer 119b of the second dam DP2 may function as the spacer 119 described above with reference to FIG. 5. In one embodiment, for example, the upper corner organic pattern layer 119a and the upper middle organic pattern layer 119b may prevent at least one of the pixel circuit layer PCL and the display element layer DEL from being damaged by the mask sheet in a method of manufacturing the display panel. In such a method, at least one of the upper corner organic pattern layer 119a and the upper middle organic pattern layer 119b may be in contact with the mask sheet, and thus the shape of the at least one of the upper corner organic pattern layer 119a and the upper middle organic pattern layer 119b may be deformed. When the shape of at least one of the upper corner organic pattern layer 119a and the upper middle organic pattern layer 119b is deformed, the first inorganic encapsulation layer 310 may be formed according to the deformed shape of at least one of the upper corner organic pattern layer 119a and the upper middle organic pattern layer 119b, and barrier characteristics may be weakened.

In an embodiment, the first auxiliary dam ADP1 and the second auxiliary dam ADP2 may be between the organic light-emitting diode and the dam DP. Because the thickness of the first auxiliary dam ADP1 and the thickness of the second auxiliary dam ADP2 are less than the thickness of the dam DP, the first auxiliary dam ADP1 and the second auxiliary dam ADP2 may not be in contact with the mask sheet. Therefore, the first inorganic encapsulation layer 310 may be formed on the flat upper surface of the first auxiliary dam ADP1 and the flat upper surface of the second auxiliary dam ADP2. Therefore, the time for external air or moisture to reach the organic light-emitting diode may be delayed, and barrier characteristics of the first inorganic encapsulation layer 310 may be enhanced.

According to an alternative embodiment, the first auxiliary dam ADP1 and the second auxiliary dam ADP2 may have a same thickness as that of the dam DP.

The encapsulation layer ENL may cover the corner organic light-emitting diode COLED and the middle organic light-emitting diode MOLED. The encapsulation layer ENL may include at least one inorganic encapsulation layer and at least one organic encapsulation layer. FIGS. 10A and 10B illustrate an embodiment where the encapsulation layer ENL includes a first inorganic encapsulation layer 310, an organic encapsulation layer 320, and a second inorganic encapsulation layer 330.

In an embodiment, the encapsulation layer ENL may extend from the corner organic light-emitting diode COLED to the first dam DP1. In such an embodiment, the encapsulation layer ENL may extend from the middle organic light-emitting diode MOLED to the second dam DP2.

The first inorganic encapsulation layer 310 may entirely and continuously cover the corner display area CDA and the middle display area MDA. In an embodiment, the first inorganic encapsulation layer 310 may be arranged entirely and continuously in the first hole HL1, the first auxiliary dam ADP1, the fourth hole HL4, the first dam DP1, the second hole HL2, the second dam DP2, the third hole HL3, the second auxiliary dam ADP2, and the fifth hole HL5. In such an embodiment, the first inorganic encapsulation layer 310 may cover the first functional layer pattern 212Pa, the second functional layer pattern 212Pc, and the opposite electrode pattern 213P, which are arranged in the hole HL. The first inorganic encapsulation layer 310 may be in contact with the upper inorganic pattern layer UPVX and the corner inorganic pattern layer CPVX. In an embodiment, the first inorganic encapsulation layer 310 may be in contact with the protruding tip of the upper inorganic pattern layer UPVX and the protruding tip of the corner inorganic pattern layer CPVX. The first inorganic encapsulation layer 310 may be in contact with the lower surface UPVXLS of the upper inorganic pattern layer UPVX overlapping the hole HL of the insulating layer 116 and the lower surface CPVXLS of the corner inorganic pattern layer CPVX overlapping the hole HL of the insulating layer 116.

The organic encapsulation layer 320 may be separated by the dam DP. In one embodiment, for example, the organic encapsulation layer 320 may extend from the corner organic light-emitting diode COLED to the first dam DP1, and may overlap the first hole HL1 and/or the fourth hole HL4. In an embodiment, the organic encapsulation layer 320 may not overlap the first hole HL1 and the fourth hole HL4. In an embodiment, the organic encapsulation layer 320 may extend from the middle organic light-emitting diode MOLED to the second dam DP2, and may overlap the third hole HL3 and/or the fifth hole HL5. In an embodiment, the organic encapsulation layer 320 may not overlap the third hole HL3 and the fifth hole HL5. In such an embodiment, the organic encapsulation layer 320 may be controlled by the first dam DP1 and the second dam DP2. In such an embodiment, the second hole HL2 may be apart from the organic encapsulation layer 320.

In an embodiment, the second inorganic encapsulation layer 330 may entirely and continuously cover the corner display area CDA and the middle display area MDA, as described above with reference to the first inorganic encapsulation layer 310. According to an embodiment, the second inorganic encapsulation layer 330 may be in contact with the first inorganic encapsulation layer 310 at the first dam DP1 and the second dam DP2. In such an embodiment, the second inorganic encapsulation layer 330 may be in contact with the first inorganic encapsulation layer 310 in the second hole HL2. Therefore, the organic encapsulation layer 320 may be separated by the dam DP.

Figure 11:
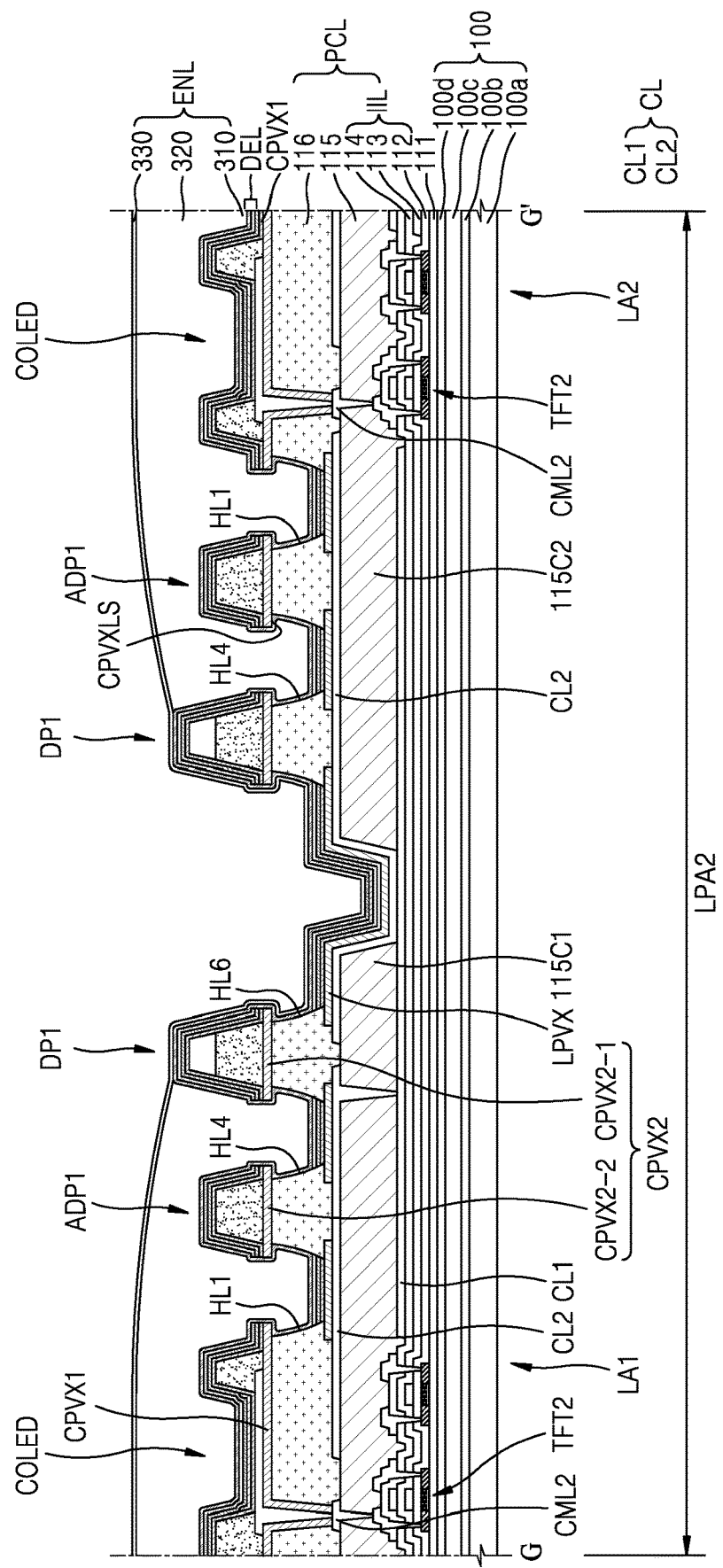
FIG. 11 is a cross-sectional view of the display panel taken along line G-G' of FIG. 9.
Figure 12:
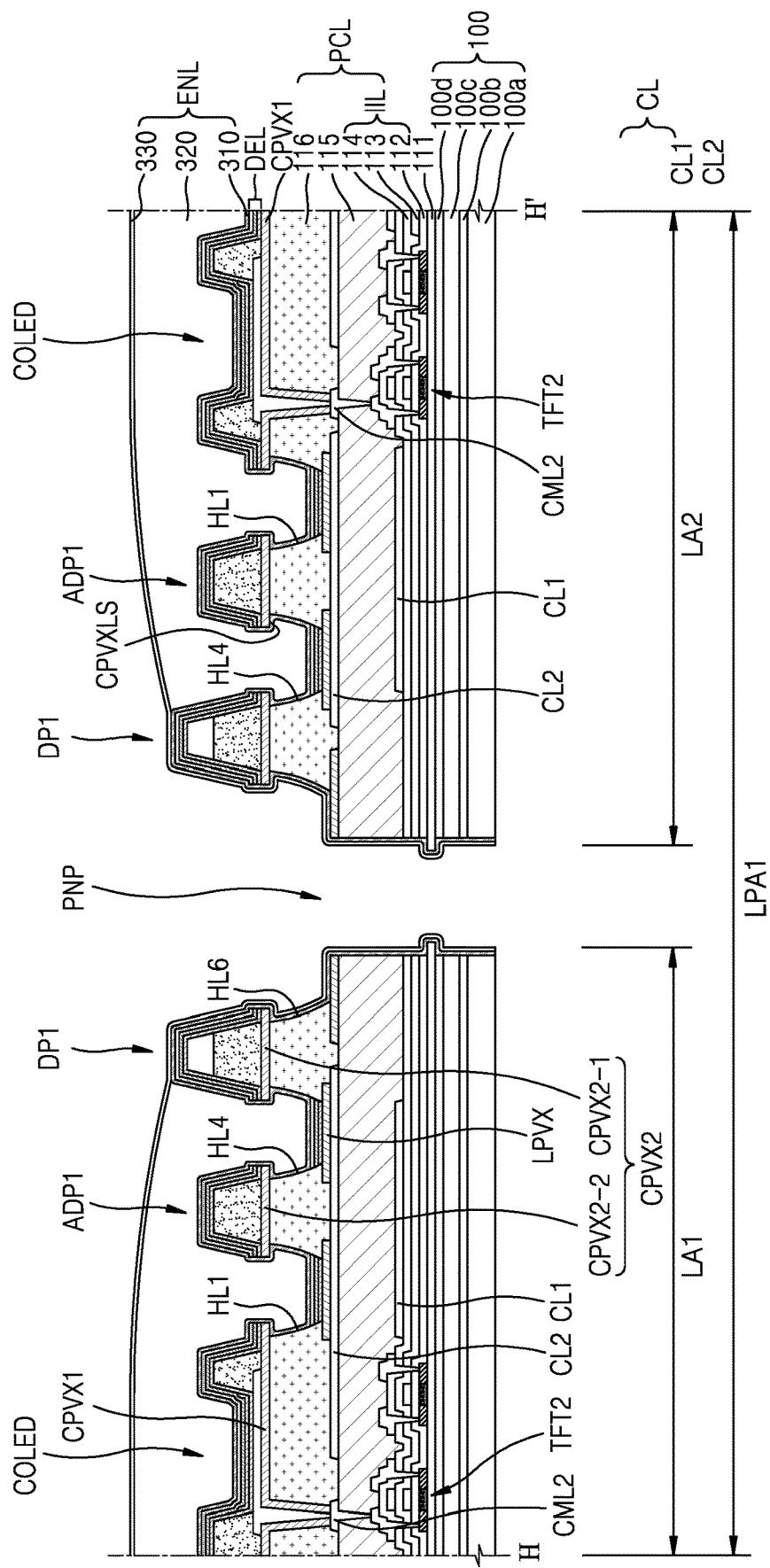
FIG. 12 is a cross-sectional view of the display panel taken along line H-H' of FIG. 9.

FIG. 11 is a cross-sectional view of the display panel taken along line G-G' of FIG. 9. FIG. 12 is a cross-sectional view of the display panel taken along line H-H' of FIG. 9. In FIGS. 11 and 12, the same reference numerals as those in FIGS. 10A and 10B denote the same members, and any repetitive detailed descriptions thereof will be omitted.

Referring to FIGS. 11 and 12, in an embodiment of the display panel, the corner display area may overlap at least a portion of the first extension area LA1 and the second extension area LA2. The corner organic light-emitting diode COLED may be on the first extension area LA1 and the second extension area LA2. The first extension area LA1 and the second extension area LA2 may be connected to each other in the second area LPA2. The first extension area LA1 and the second extension area LA2 may be apart from each other in the first area LPA1. In such an embodiment, the penetrating portion PNP may be defined between the first extension area LA1 and the second extension area LA2 in the first area LPA1.

Referring to FIG. 11, in an embodiment, the pixel circuit layer PCL, the display element layer DEL, and the encapsulation layer ENL may be arranged in the second area LPA2. The pixel circuit layer PCL may include a second thin-film transistor TFT2, a first connection line CL1, a second connection line CL2, an inorganic insulating layer IIL, a lower insulating layer 115, and an insulating layer 116. The display element layer DEL may include a corner organic light-emitting diode COLED.

In an embodiment, the first hole HL1, the fourth hole HL4, and the sixth hole HL6 may overlap the second area LPA2. In such an embodiment, the first auxiliary dam ADP1 may be between the first hole HL1 and the fourth hole HL4, and the first dam DP1 may be between the fourth hole HL4 and the sixth hole HL6.

According to an embodiment, the substrate 100 and the inorganic insulating layer IIL may be continuously arranged in the second extension area LA2. The lower insulating layer 115 may be separated or disconnected based on the sixth hole HL6. In one embodiment, for example, the lower insulating layer 115 may be separated into a first corner insulating layer 115C1 and a second corner insulating layer 115C2 based on the sixth hole HL6. According to an alternative embodiment, the inorganic insulating layer IIL may also be separated or disconnected based on the sixth hole HL6.

The second connection line CL2 and the second connection electrode CML2 may be on the lower insulating layer 115. According to an embodiment, the second connection electrode CML2 may be a portion of the second connection line CL2.

According to an embodiment, the second connection line CL2 may cover the first corner insulating layer 115C1 and the second corner insulating layer 115C2. In one embodiment, for example, the second connection line CL2 may cover a side surface of the first corner insulating layer 115C1 and a side surface of the second corner insulating layer 115C2, which face each other. The second connection line CL2 may be connected to the first connection line CL1 exposed between the first corner insulating layer 115C1 and the second corner insulating layer 115C2. Therefore, the first connection line CL1 and the second connection line CL2 may prevent infiltration of moisture into the corner organic light-emitting diode COLED.

The lower inorganic pattern layer LPVX may be on the second connection line CL2. A plurality of lower inorganic pattern layers LPVX may be on the second connection line CL2, and the lower inorganic pattern layers LPVX may be apart from each other on the second connection line CL2. One of the lower inorganic pattern layers LPVX may cover the side surface of the first corner insulating layer 115C1 and the side surface of the second corner insulating layer 115C2, which face each other.

The organic encapsulation layer 320 may be separated by the first dam DP1.

Referring to FIG. 12, in an embodiment, the pixel circuit layer PCL, the display element layer DEL and the encapsulation layer ENL may be arranged in the first extension area LA1 and the second extension area LA2. The pixel circuit layer PCL may include a second thin-film transistor TFT2, a first connection line CL1, a second connection line CL2, an inorganic insulating layer IIL, a lower insulating layer 115, and an insulating layer 116. The display element layer DEL may include a corner organic light-emitting diode COLED.

The first hole HL1 and the fourth hole HL4 may overlap the first extension area LA1 and the second extension area LA2, respectively. A first auxiliary dam ADP1 may be between the first hole HL1 and the fourth hole HL4, and a first dam DP1 may be between the fourth hole HL4 and the penetrating portion PNP.

The first extension area LA1 and the second extension area LA2 may be apart from each other in the second area LPA2 based on the penetrating portion PNP. The inorganic insulating layer IIL, the lower insulating layer 115, the insulating layer 116, and the encapsulation layer ENL may be separated or disconnected based on the penetrating portion PNP.

Figure 13:
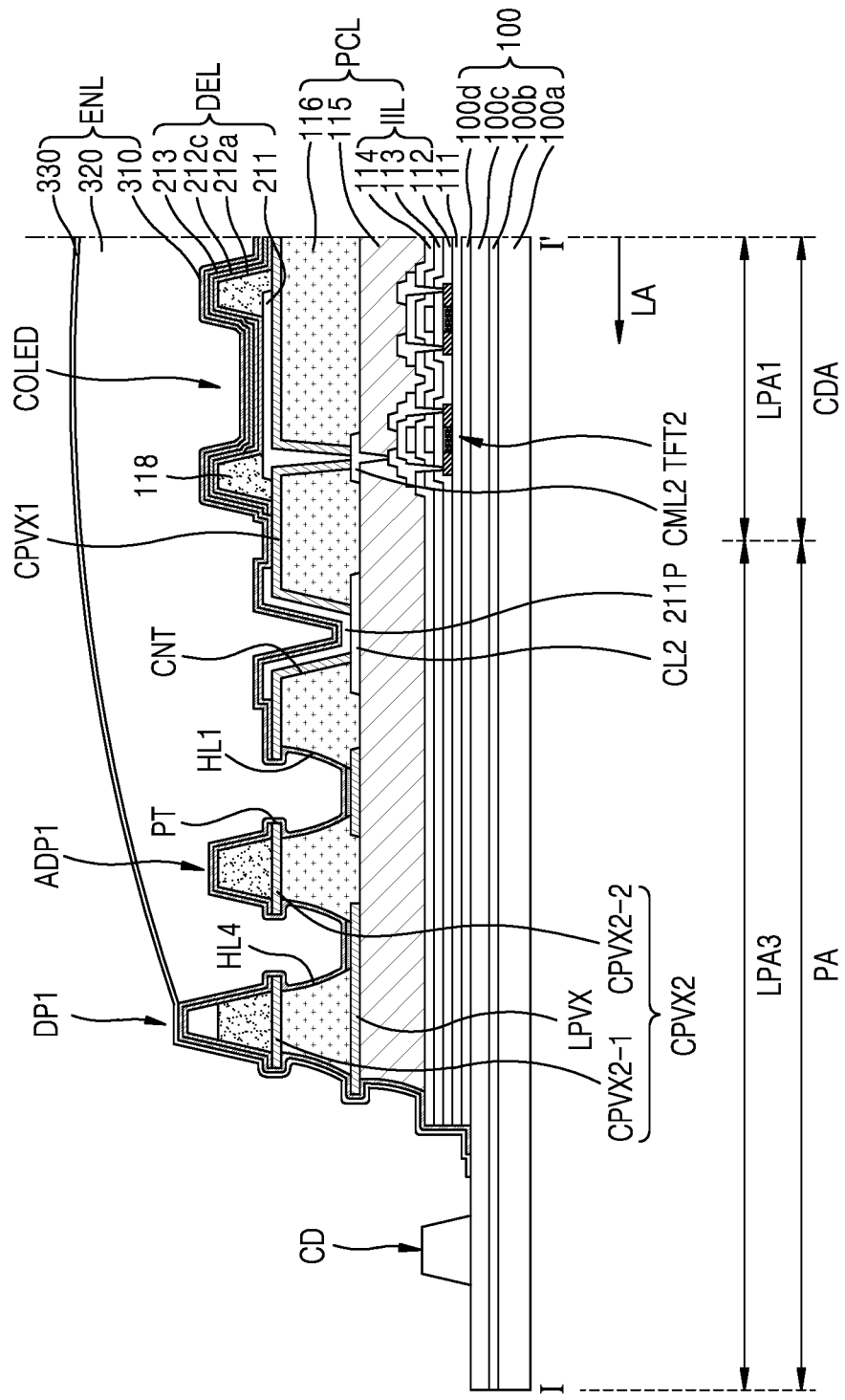
FIG. 13 is a cross-sectional view of the display panel taken along line I-I' of FIG. 9.

FIG. 13 is a cross-sectional view of the display panel taken along line I-I' of FIG. 9. In FIG. 13, the same reference numerals as those in FIGS. 10A and 10B denote the same members, and any repetitive detailed descriptions thereof will be omitted.

FIG. 13 shows the second portion of the peripheral area PA outside the corner display area CDA. Referring to FIG. 13, an embodiment of the display panel may include the substrate 100 including the corner display area CDA at the corner, and the second thin-film transistor TFT2 and the corner organic light-emitting diode COLED in the corner display area CDA. The corner organic light-emitting diode COLED of FIG. 13 is a corner organic light-emitting diode farthest away from the middle display area.

The corner display area CDA may overlap at least a portion of the first extension area LA1. The first extension area LA1 may extend in a direction away from the front display area. The first extension area LA1 may include the first area LPA1 and the third area LPA3. The first area LPA1 may overlap the corner display area CDA, and the third area LPA3 may overlap the peripheral area PA.

The first corner inorganic pattern layer CPVX1 may be between the insulating layer 116 and the corner organic light-emitting diode COLED. The second corner inorganic pattern layer CPVX2 may be apart from the first corner inorganic pattern layer CPVX1 on the insulating layer 116 with the first hole HL1 therebetween. Each of the first corner inorganic pattern layer CPVX1 and the second corner inorganic pattern layer CPVX2 may include a protruding tip PT protruding toward the center of the first hole HL1. The second corner inorganic pattern layer CPVX2 may include an outer inorganic pattern layer CPVX2-1 and an inner inorganic pattern layer CPVX2-2, which are apart from each other.

The second connection line CL2 may be arranged in the first extension area LA1. According to an embodiment, the second connection line CL2 may be between the lower insulating layer 115 and the insulating layer 116. According to an embodiment, the second connection line CL2 may supply the second power supply voltage (see ELVSS in FIG. 3) to the corner organic light-emitting diode COLED.

In an embodiment, a contact hole CNT is defined through the insulating layer 116 to expose at least a portion of the second connection line CL2. In such an embodiment, the contact hole CNT may overlap the third area LPA3. The contact hole CNT may be between the first hole HL1 and the corner organic light-emitting diode COLED farthest away from the middle display area among the corner organic light-emitting diodes COLED arranged in the first extension area LA1.

The second connection line CL2 may be connected to the opposite electrode 213. The second connection line CL2 may supply the second power supply voltage to the opposite electrode 213 of the corner organic light-emitting diode COLED. According to an embodiment, the second connection line CL2 and the opposite electrode 213 may be connected to each other through the pixel electrode pattern 211P including a same material as that of the pixel electrode 211. The pixel electrode pattern 211P may be apart from the pixel electrode 211 and may overlap the contact hole CNT. The pixel electrode pattern 211P may be formed simultaneously with the pixel electrode 211 during a same process.

The first functional layer 212a and the second functional layer 212c may be apart from the contact hole CNT to expose the contact hole CNT. In an embodiment, the first functional layer 212a and the second functional layer 212c may not extend to the contact hole CNT exposing the second connection line CL2. Therefore, the second connection line CL2 and the opposite electrode 213 connected to each other through the pixel electrode pattern 211P may maintain low resistance. The first functional layer 212a and the second functional layer 212c may not be provided or formed in the third area LPA3 of the extension area LA by adjusting a range to be formed on the entire surface of the first extension area LA1. The opposite electrode 213 may be formed to overlap the pixel electrode pattern 211P by adjusting a range to be formed on the entire surface of the first extension area LA1.

The opposite electrode pattern 213P inside the first hole HL1 and the fourth hole HL4 may be in contact with the lower inorganic pattern layer LPVX or the lower insulating layer 115. The first inorganic encapsulation layer 310 may cover the opposite electrode pattern 213P.

According to an embodiment, a crack dam CD may be arranged in the first extension area LA1 to prevent cracking of the display panel. The crack dam CD may be arranged in the third area LPA3 and may include an organic material.

Figure 14A:
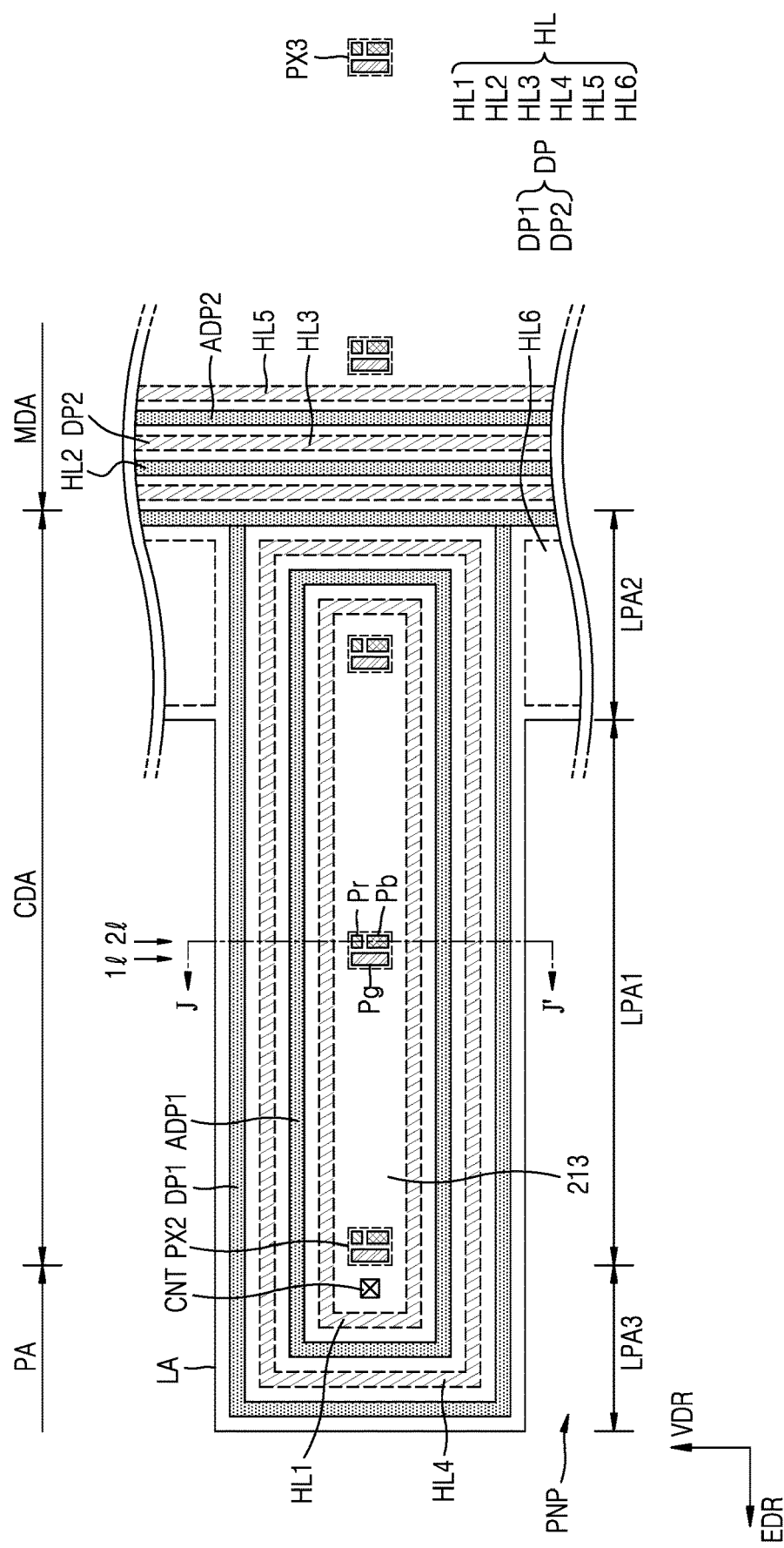
FIGS. 14A and 14B are plan views illustrating an arrangement structure of subpixels in a corner display area and a middle display area, according to an embodiment.
Figure 14B:
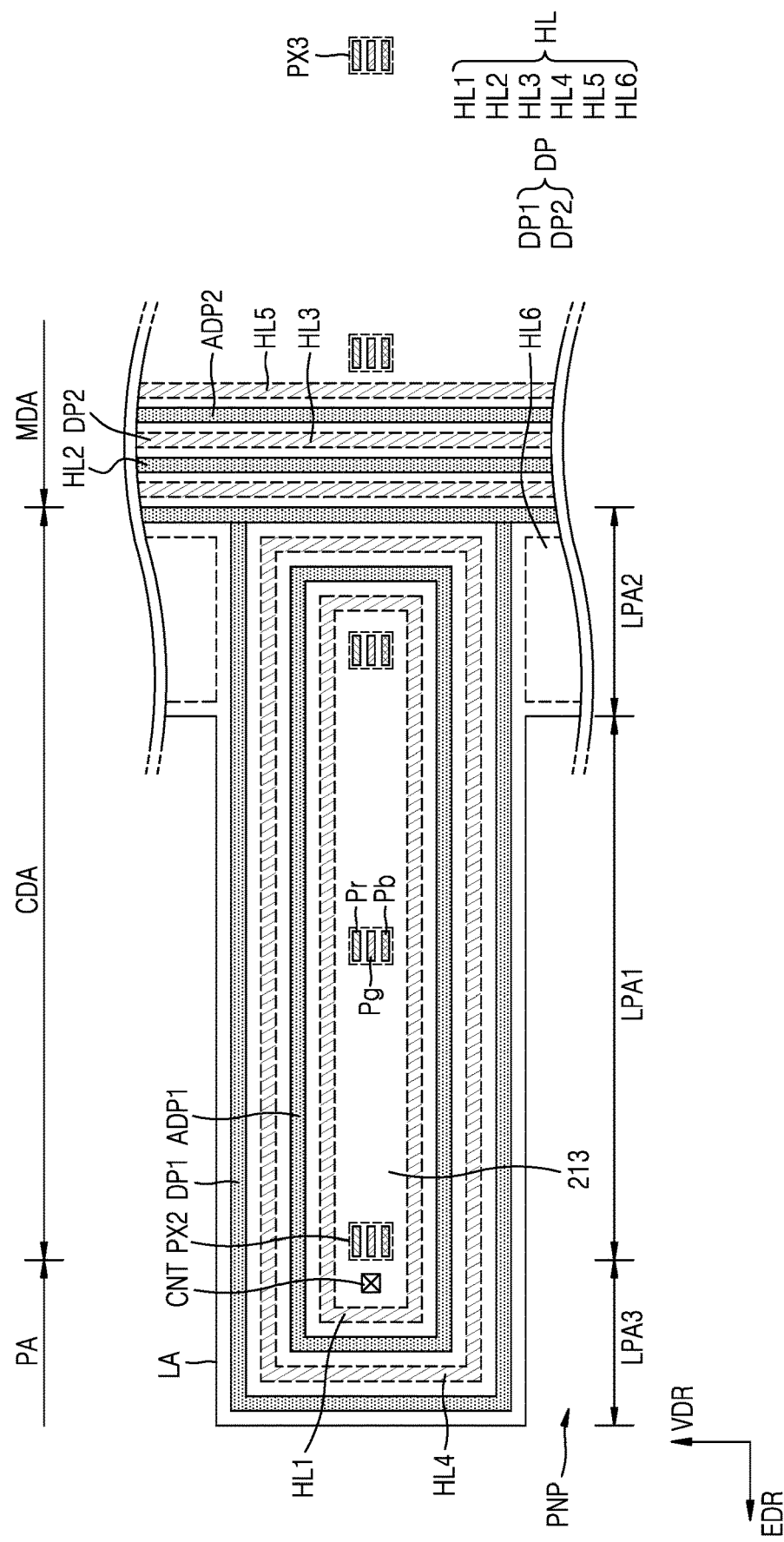

FIGS. 14A and 14B are plan views illustrating an arrangement structure of subpixels in a corner display area CDA and a middle display area MDA, according to an embodiment.

Referring to FIGS. 14A and 14B, in an embodiment, an extension area LA may include a first area LPA1, a second area LPA2, and a third area LPA3. The first area LPA1 and the second area LPA2 may overlap the corner display area CDA. The third area LPA3 may overlap a peripheral area PA.

A plurality of second pixels PX2 may be arranged in the corner display area CDA. According to an embodiment, the second pixels PX2 may be arranged side by side along the extending direction EDR of the extension area LA.

A plurality of third pixels PX3 may be arranged in the middle display area MDA. According to an embodiment, the third pixels PX3 may be arranged side by side along the extending direction EDR of the extension area LA. In such an embodiment, the third pixels PX3 may be arranged side by side with the second pixels PX2.

Each of the second pixel PX2 and the third pixel PX3 may include a red subpixel Pr, a green subpixel Pg, and a blue subpixel Pb. The red subpixel Pr, the green subpixel Pg, and the blue subpixel Pb may emit red light, green light, and blue light, respectively.

Referring to FIG. 14A, in an embodiment, the subpixel arrangement structure of the second pixel PX2 and the subpixel arrangement structure of the third pixel PX3 may be provided in an S-stripe structure. Each of the second pixel PX2 and the third pixel PX3 may include a red subpixel Pr, a green subpixel Pg, and a blue subpixel Pb.

The green subpixel Pg may be arranged in a first column 11, and the red subpixel Pr and the blue subpixel Pb may be arranged in a second column 21 adjacent to the first column 11. In such an embodiment, the green subpixel Pg may be arranged in a rectangular shape having a long side in a vertical direction VDR, and the red subpixel Pr and the blue subpixel Pb may be arranged in a rectangular shape. In such an embodiment, the side of the red subpixel Pr and the side of the blue subpixel Pb may be arranged to face the long side of the green subpixel Pg. According to an embodiment, the length of the side of the red subpixel Pr in the vertical direction VDR perpendicular to the extending direction EDR may be less than the length of the side of the blue subpixel Pb in the vertical direction VDR.

Referring to FIG. 14B, in an alternative embodiment, the red subpixel Pr, the green subpixel Pg, and the blue subpixel Pb may have a stripe structure. In such an embodiment, the red subpixel Pr, the green subpixel Pg, and the blue subpixel Pb may be arranged side by side in the vertical direction VDR perpendicular to the extending direction EDR. In such an embodiment, the red subpixels Pr, the green subpixels Pg, and the blue subpixels Pb may be arranged side by side in the extending direction EDR. In such an embodiment, the red subpixel Pr, the green subpixel Pg, and the blue subpixel Pb may all have a long side in the extending direction EDR.

Alternatively, although not illustrated, the red subpixel Pr, the green subpixel Pg, and the blue subpixel Pb may be arranged side by side in the extending direction EDR. In such an embodiment, the red subpixel Pr, the green subpixel Pg, and the blue subpixel Pb may all have a long side in the vertical direction VDR.

The red subpixel Pr, the green subpixel Pg, and the blue subpixel Pb of the third pixel PX3 may be arranged side by side with the red subpixel Pr, the green subpixel Pg, and the blue subpixel Pb of the second pixel PX2, respectively.

According to another alternative embodiment, the subpixel arrangement structure of the second pixel PX2 and the subpixel arrangement structure of the third pixel PX3 may be a pentile type.

Figure 15:
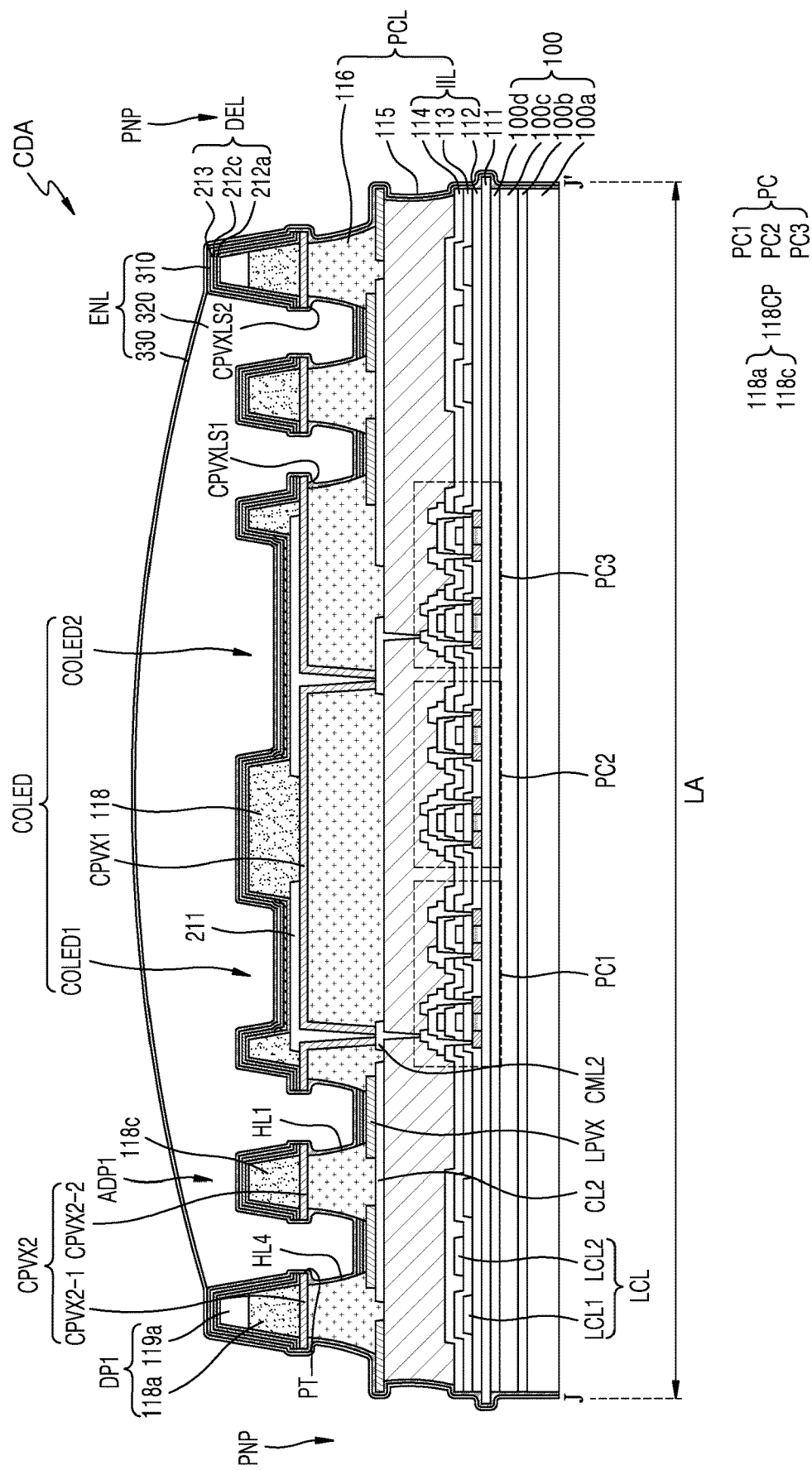
FIG. 15 is a cross-sectional view of the display panel taken along line J-J' of FIG. 14A.

FIG. 15 is a cross-sectional view of the display panel taken along line J-J' of FIG. 14A. In FIG. 15, the same reference numerals as those in FIG. 12 denote the same members, and any repetitive detailed descriptions thereof will be omitted.

Referring to FIG. 15, an embodiment of a display panel may include a substrate 100, a buffer layer 111, a pixel circuit layer PCL, a lower inorganic pattern layer LPVX, a first corner inorganic pattern layer CPVX1, a second corner inorganic pattern layer CPVX2, a display element layer DEL, and an encapsulation layer ENL. The pixel circuit layer PCL may include a lower connection line LCL, a pixel circuit PC, an inorganic insulating layer IIL, a lower insulating layer 115, and an insulating layer 116. The inorganic insulating layer IIL may include a first gate insulating layer 112, a second gate insulating layer 113, and an interlayer insulating layer 114.

The lower connection line LCL may include a first lower connection line LCL1 and a second lower connection line LCL2. The first lower connection line LCL1 may be between the first gate insulating layer 112 and the second gate insulating layer 113. The second lower connection line LCL2 may be between the second gate insulating layer 113 and the interlayer insulating layer 114. According to an embodiment, the first lower connection line LCL1 and the second lower connection line LCL2 may be alternately arranged. Therefore, the width of the extension area LA may be reduced.

The pixel circuit PC may include a first pixel circuit PC1, a second pixel circuit PC2, and a third pixel circuit PC3. The first pixel circuit PC1 may be connected to a red corner organic light-emitting diode COLED1. Although not illustrated, the second pixel circuit PC2 may be connected to a green corner organic light-emitting diode. The third pixel circuit PC3 may be connected to a blue corner organic light-emitting diode COLED2. According to an embodiment, the size of an emission area of the blue corner organic light-emitting diode COLED2 may be greater than the size of an emission area of the red corner organic light-emitting diode COLED1.

The lower insulating layer 115 may cover the lower connection line LCL and the pixel circuit PC. A second connection line CL2 and a second connection electrode CML2 may be on the lower insulating layer 115.

The lower inorganic pattern layer LPVX may be on the second connection line CL2, and the insulating layer 116 may include a hole HL and may be on the lower insulating layer 115. According to an embodiment, the insulating layer 116 may cover the edge of the lower inorganic pattern layer LPVX and the edge of the second connection line CL2, and may include a first hole HL1 and a fourth hole HL4 exposing the central portion of the lower inorganic pattern layer LPVX.

The first corner inorganic pattern layer CPVX1 may be on the insulating layer 116. According to an embodiment, the red corner organic light-emitting diode COLED1 and the blue corner organic light-emitting diode COLED2 may overlap the first corner inorganic pattern layer CPVX1.

The second corner inorganic pattern layer CPVX2 may be apart from the first corner inorganic pattern layer CPVX1 on the insulating layer 116 with the first hole HL1 therebetween. Each of the first corner inorganic pattern layer CPVX1 and the second corner inorganic pattern layer CPVX2 may include a protruding tip PT protruding toward the center of the first hole HL1. The second corner inorganic pattern layer CPVX2 may include an outer inorganic pattern layer CPVX2-1 and an inner inorganic pattern layer CPVX2-2, which are apart from each other.

In such an embodiment, each of the first corner inorganic pattern layer CPVX1 and the second corner inorganic pattern layer CPVX2 includes a protruding tip protruding toward the center of the first hole HL1 and/or the fourth hole HL4, such that the first functional layer 212a, the second functional layer 212c and the opposite electrode 213 may be disconnected based on the first hole HL1 and/or the fourth hole HL4.

The lower surface of the second corner inorganic pattern layer CPVX2 overlapping the first hole HL1 may not be in contact with the first functional layer 212a, the second functional layer 212c, and the opposite electrode 213. The lower surface CPVXLS1 of the first corner inorganic pattern layer CPVX1 overlapping the first hole HL1 and the lower surface CPVXLS2 of the second corner inorganic pattern layer CPVX2 overlapping the fourth hole HL4 may not be in contact with the first functional layer 212a, the second functional layer 212c, and the opposite electrode 213.

The encapsulation layer ENL may cover the display element layer DEL. According to an embodiment, the encapsulation layer ENL may include a first inorganic encapsulation layer 310, an organic encapsulation layer 320, and a second inorganic encapsulation layer 330. The first inorganic encapsulation layer 310 may be in contact with the first corner inorganic pattern layer CPVX1, the second corner inorganic pattern layer CPVX2, the lower inorganic pattern layer LPVX, and the inorganic insulating layer IIL. According to an embodiment, the lower surface CPVXLS1 of the first corner inorganic pattern layer CPVX1 overlapping the first hole HL1 may be in contact with the first inorganic encapsulation layer 310. The lower surface of the second corner inorganic pattern layer CPVX2 overlapping the first hole HL1 and the lower surface CVPXLS2 of the second corner inorganic pattern layer CPVX2 overlapping the fourth hole HL4 may be in contact with the first inorganic encapsulation layer 310.

The organic encapsulation layer 320 may cover the corner organic light-emitting diode COLED and may overlap the first hole HL1 and the fourth hole HL4. In an embodiment, the organic encapsulation layer 320 may not overlap the first hole HL1 and/or the fourth hole HL4. The second inorganic encapsulation layer 330 may be on the organic encapsulation layer 320, and may be in contact with the first inorganic encapsulation layer 310 on the first dam DP1.

Figure 16A:
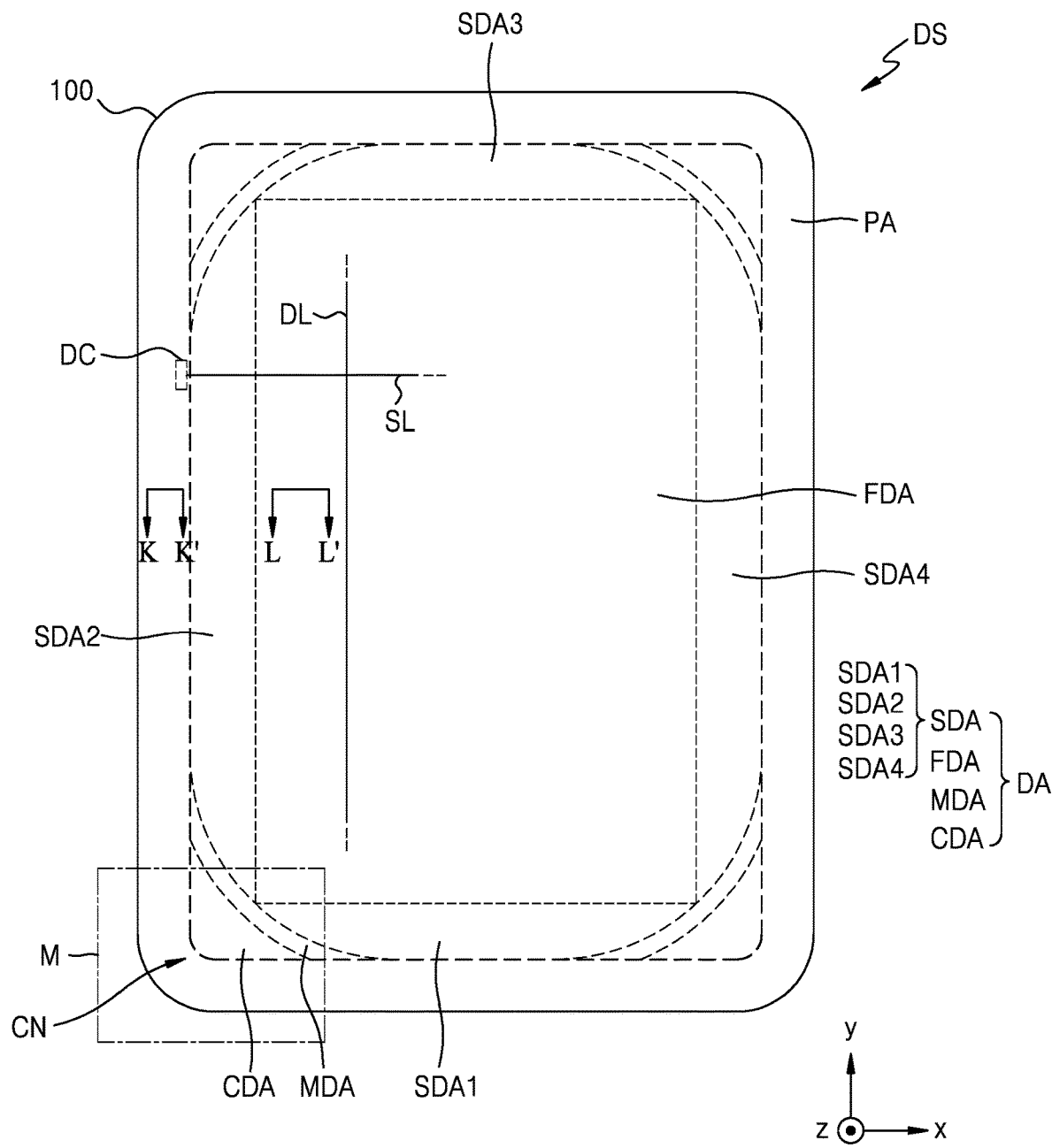
FIG. 16A is a plan view illustrating a method of manufacturing a display device, according to an embodiment.

FIG. 16A is a plan view illustrating a method of manufacturing a display device, according to an embodiment. FIGS. 16B to 16E are cross-sectional views illustrating a method of manufacturing a display device, according to an embodiment. FIG. 16F is a plan view illustrating a method of manufacturing a display device, according to an embodiment. FIGS. 16G to 16M are cross-sectional views illustrating a method of manufacturing a display device, according to an embodiment. FIGS. 16B to 16E and 16G to 16K are schematic cross-sectional views of a display panel taken along lines K-K' and L-L' of FIG. 16A.

Referring to FIG. 16A, in an embodiment of a method of manufacturing a display device, a display substrate DS may be prepared. The display substrate DS may include a substrate 100 including a display area DA and a peripheral area PA, and lines and a driving circuit DC on the substrate 100. The display area DA may include a front display area FDA, a side display area SDA, a corner display area CDA, and a middle display area MDA. The side display area SDA may include a first side display area SDA1, a second side display area SDA2, a third side display area SDA3, and a fourth side display area SDA4.

The corner display area CDA may be arranged at a corner CN of the manufactured display panel. The middle display area MDA may be between the front display area FDA and the corner display area CDA.

The peripheral area PA may surround at least a portion of the display area DA. According to an embodiment, the peripheral area PA may entirely surround the display area DA.

The driving circuit DC may be arranged in the peripheral area PA. According to an embodiment, the driving circuit DC may also be arranged in the middle display area MDA. A scan line SL may be connected to the driving circuit DC.

Figure 16B:
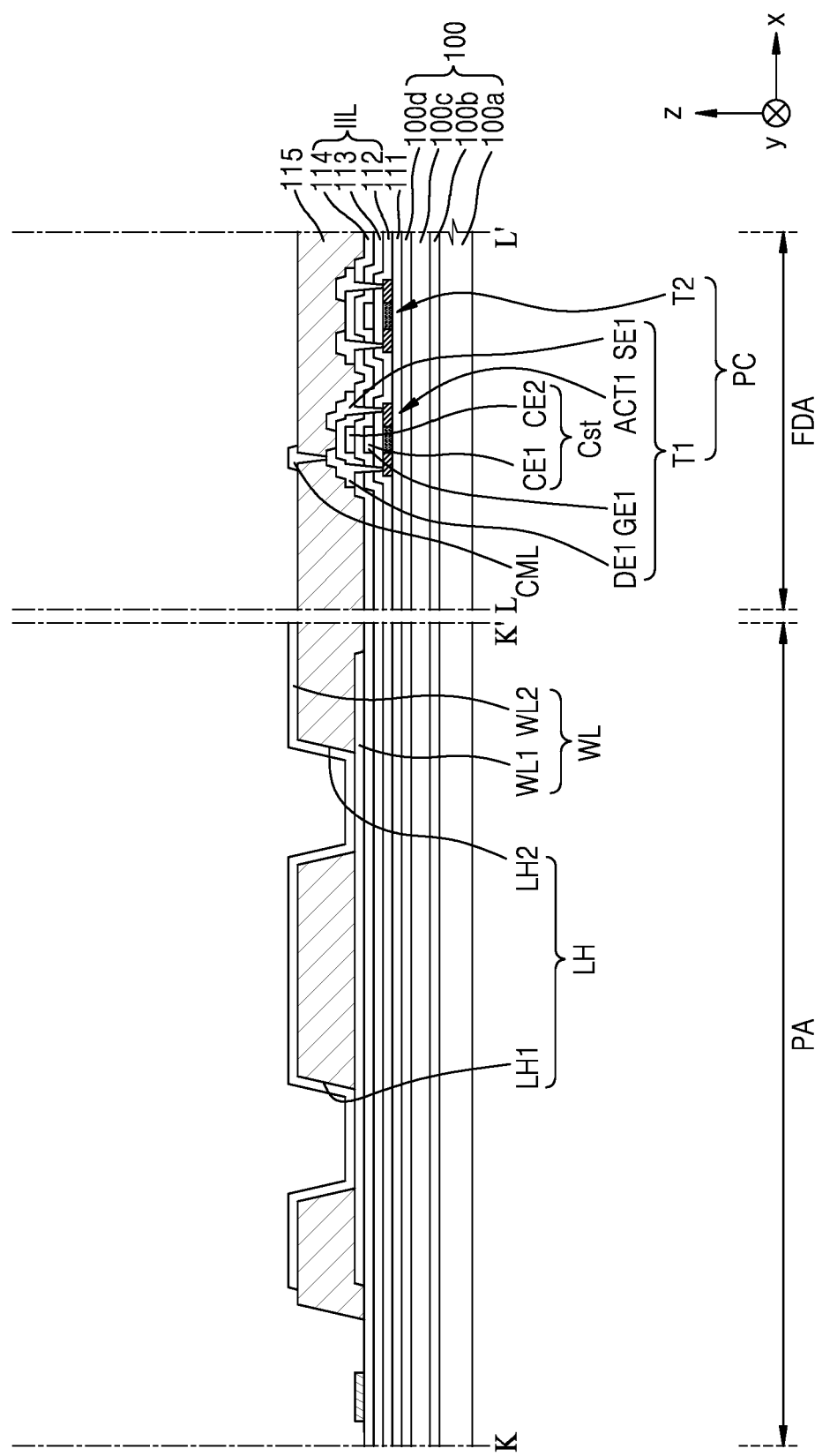
FIGS. 16B to 16E are cross-sectional views illustrating a method of manufacturing a display device, according to an embodiment.

Referring to FIG. 16B, the display substrate DS may include a substrate 100, a buffer layer 111, a pixel circuit PC, a line WL, an inorganic insulating layer IIL, and a lower insulating layer 115. The line WL may include a first line WL1 and a second line WL2. The inorganic insulating layer IIL may include a first gate insulating layer 112, a second gate insulating layer 113, and an interlayer insulating layer 114.

The substrate 100 may include the front display area FDA and the peripheral area PA outside the front display area FDA.

The first line WL1 may overlap the peripheral area PA. The first line WL1 may be between the inorganic insulating layer IIL and the lower insulating layer 115.

In an embodiment, a lower hole LH may be formed through the lower insulating layer 115 overlap the peripheral area PA. The lower hole LH may expose at least a portion of the first line WL1. According to an embodiment, the lower hole LH may include a first lower hole LH1 and a second lower hole LH2. The first lower hole LH1 may be farther away from the front display area FDA than the second lower hole LH2.

The second line WL2 may be on the lower insulating layer 115. The second line WL2 may be between the lower insulating layer 115 and the insulating layer 116. The second line WL2 may extend from the peripheral area PA to the front display area FDA. The second line WL2 may be electrically connected to the first line WL1. The second line WL2 may be connected to the first line WL1 through the lower hole LH. The second line WL2 may overlap the lower hole LH, and the second line WL2 may be electrically connected to the first line WL1 through the lower hole LH. In one embodiment, for example, the second line WL2 may be electrically connected to the first line WL1 through at least one of the first lower hole LH1 and the second lower hole LH2.

The pixel circuit PC may be on the front display area FDA. The pixel circuit PC may include a driving thin-film transistor T1, a switching thin-film transistor T2, and a storage capacitor Cst.

The lower insulating layer 115 may cover the driving thin-film transistor T1 and the switching thin-film transistor T2, and a connection electrode CML may be connected to the pixel circuit PC through a contact hole of the lower insulating layer 115.

Figure 16C:
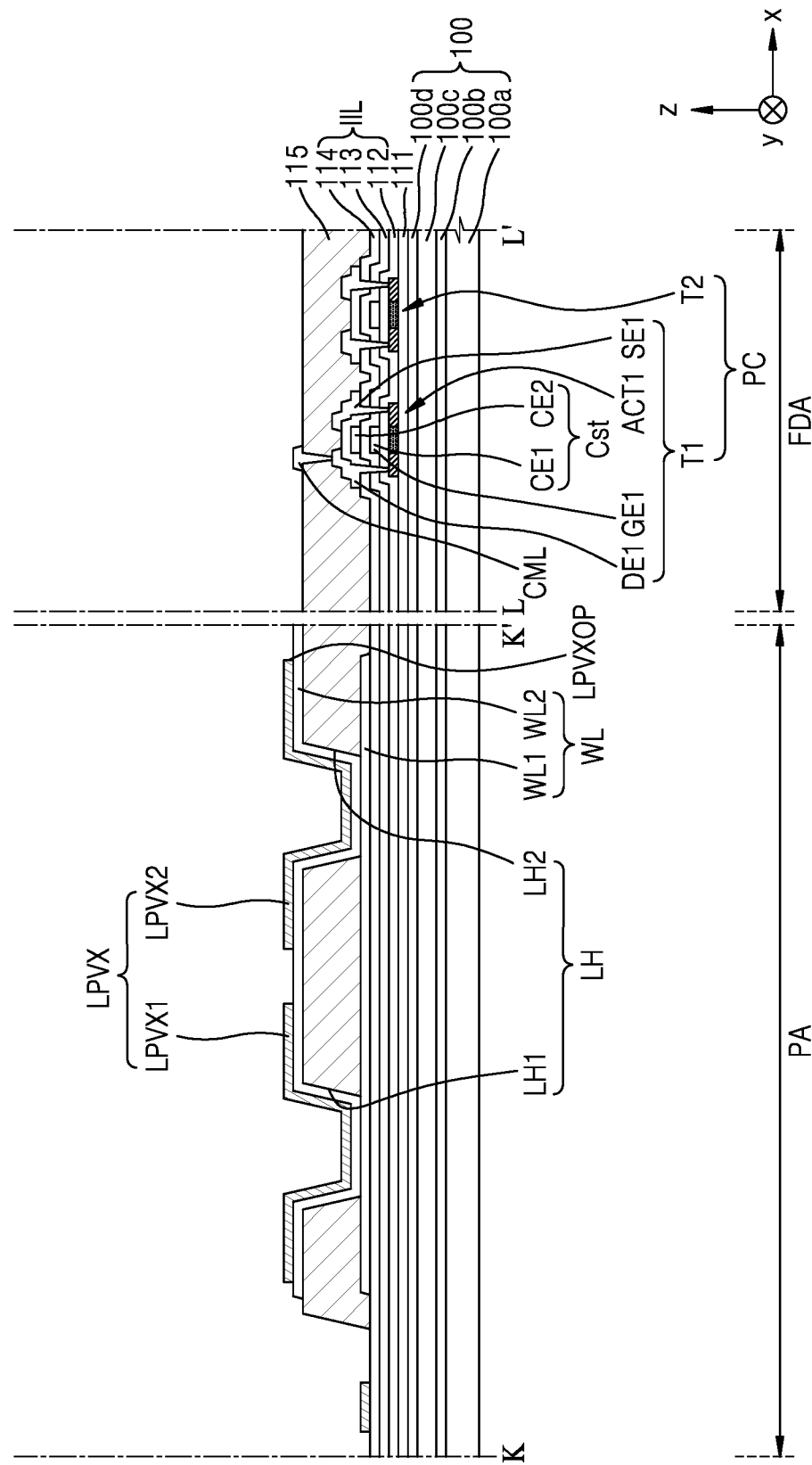

Referring to FIG. 16C, a lower inorganic pattern layer LPVX may be provided or formed on the peripheral area PA. According to an embodiment, the lower inorganic pattern layer LPVX may be provided or formed on the second line WL2. According to an embodiment, the lower inorganic pattern layer LPVX may overlap the lower hole LH.

The lower inorganic pattern layer LPVX may be apart from the front display area FDA. According to an embodiment, the lower inorganic pattern layer LPVX may surround the front display area FDA. In such an embodiment, a lower opening LPVXOP may be formed through the lower inorganic pattern layer LPVX to overlap the front display area FDA.

According to an embodiment, the lower inorganic pattern layer LPVX may include a first lower inorganic pattern layer LPVX1 and a second lower inorganic pattern layer LPVX2. The first lower inorganic pattern layer LPVX1 may be farther away from the front display area FDA than the second lower inorganic pattern layer LPVX2. According to an embodiment, the first lower inorganic pattern layer LPVX1 may overlap the first lower hole LH1. The second lower inorganic pattern layer LPVX2 may overlap the second lower hole LH2.

According to an embodiment, the forming of the lower inorganic pattern layer LPVX may be omitted.

Figure 16D:
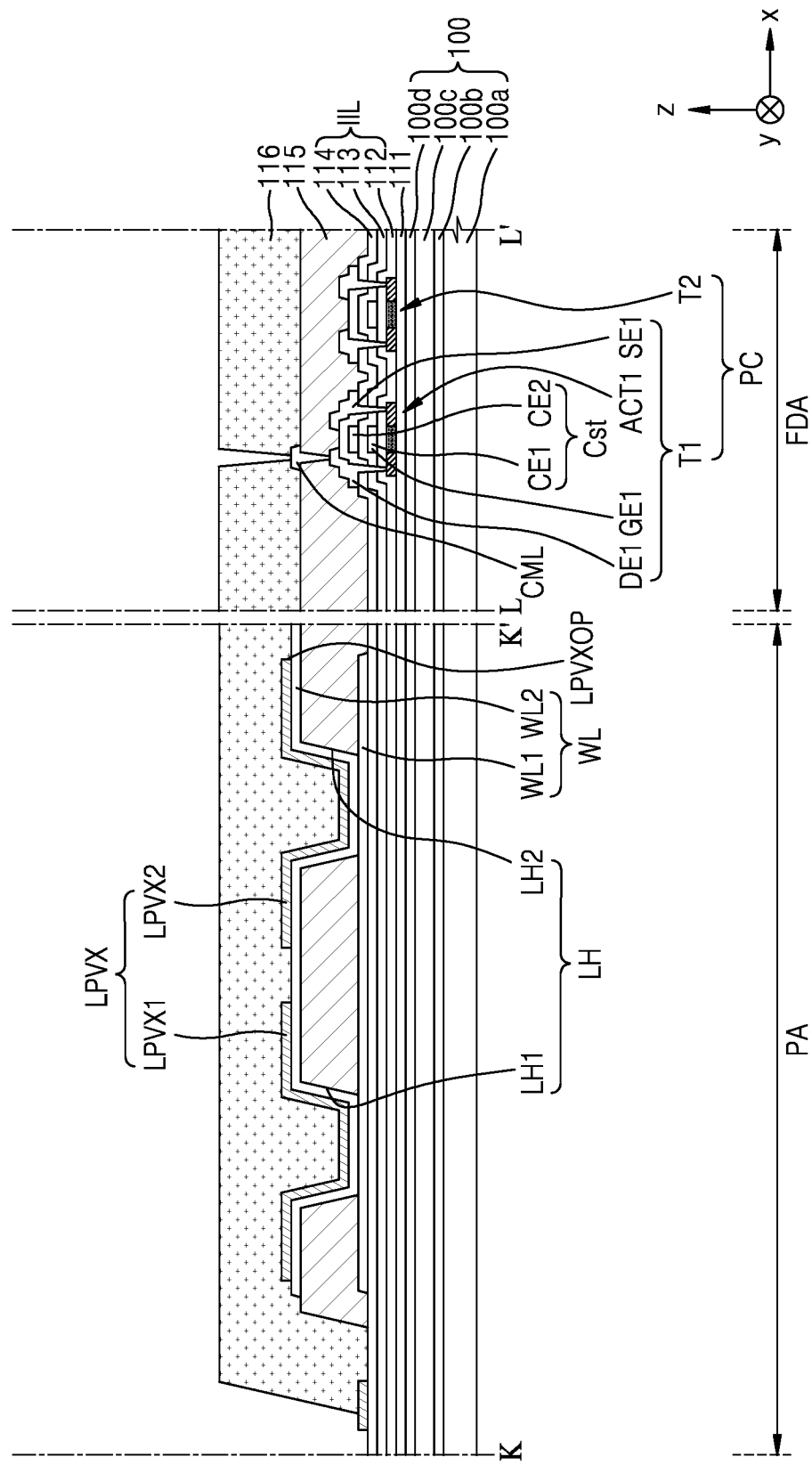

Referring to FIG. 16D, an insulating layer 116 may be provided or formed on the display area DA and the peripheral area PA. The insulating layer 116 may overlap the display area DA and the peripheral area PA and may cover the line WL. According to an embodiment, the insulating layer 116 may be continuously formed on the line WL. According to an embodiment, a contact hole may be formed through the insulating layer 116 to overlap the display area DA and to expose the connection electrode CML.

Figure 16E:
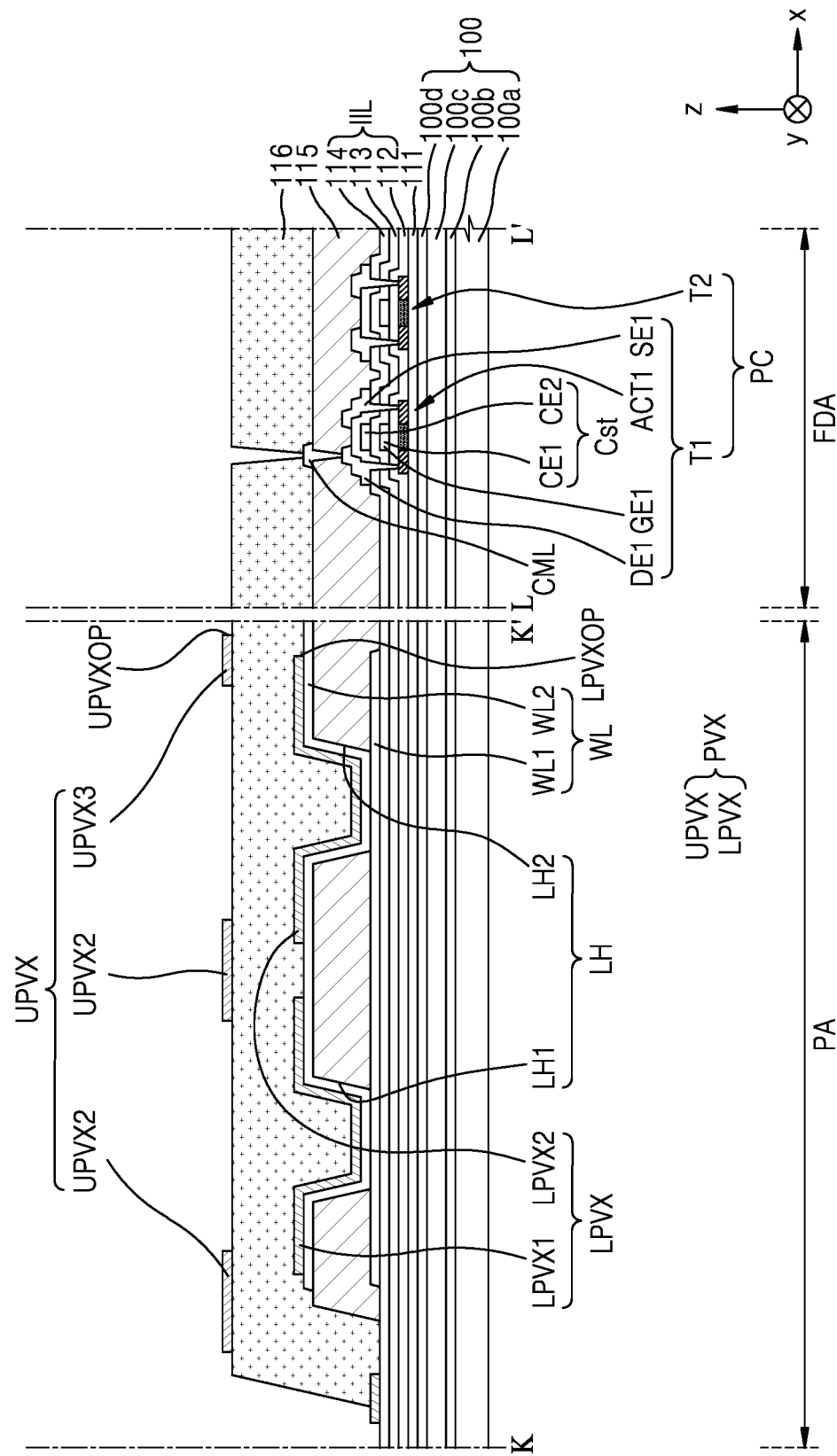
Figure 16F:
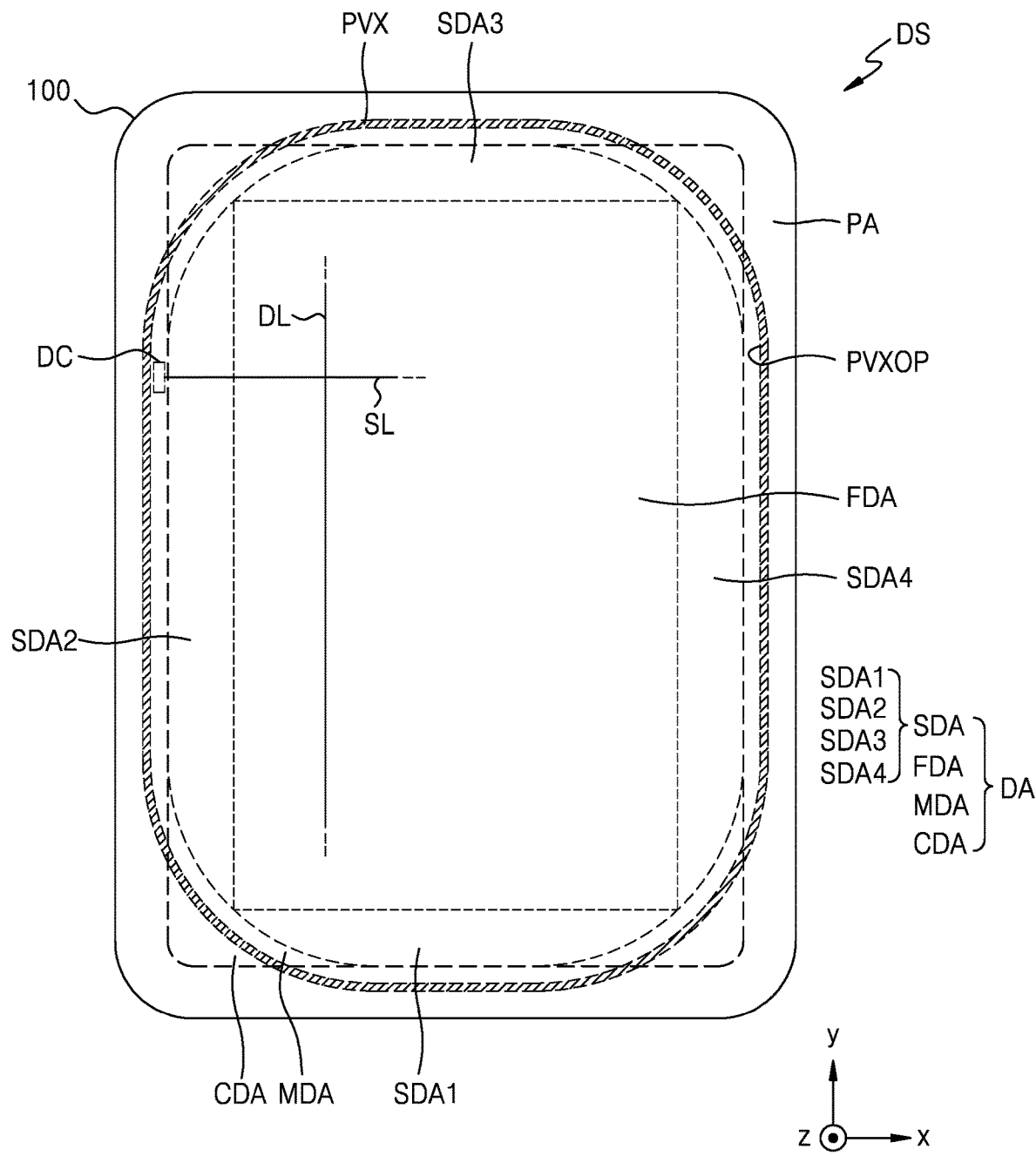
FIG. 16F is a plan view illustrating a method of manufacturing a display device, according to an embodiment.

Referring to FIGS. 16E and 16F, an upper inorganic pattern layer UPVX may be provided or formed on the insulating layer 116 to overlap the peripheral area PA. The upper inorganic pattern layer UPVX may be apart from the front display area FDA. According to an embodiment, the upper inorganic pattern layer UPVX may surround the front display area FDA. In such an embodiment, an upper opening UPVXOP may be formed through the upper inorganic pattern layer UPVX to overlap the front display area FDA.

In an embodiment, a plurality of upper inorganic pattern layers UPVX may be provided. The upper inorganic pattern layers UPVX may be apart from each other. In one embodiment, for example, the upper inorganic pattern layer UPVX may include a first upper inorganic pattern layer UPVX1, a second upper inorganic pattern layer UPVX2, and a third upper inorganic pattern layer UPVX3.

According to an embodiment, after an inorganic layer is entirely formed on the insulating layer 116, at least a portion of the inorganic layer may be etched to form the first upper inorganic pattern layer UPVX1, the second upper inorganic pattern layer UPVX2, and the third upper inorganic pattern layer UPVX3. In such an embodiment, an upper opening UPVXOP may be formed through the upper inorganic pattern layer UPVX to overlap the front display area FDA by etching.

Therefore, in such an embodiment, an opening PVXOP may be formed through the inorganic pattern layer PVX including the lower inorganic pattern layer LPVX and the upper inorganic pattern layer UPVX to overlap the front display area FDA.

According to an embodiment, the inorganic pattern layer PVX may entirely surround the front display area FDA and the side display area SDA. In such an embodiment, an opening PVXOP may be formed through the inorganic pattern layer PVX to overlap the front display area FDA and the side display area SDA.

According to an embodiment, the inorganic pattern layer PVX may extend between the front display area FDA and the corner display area CDA. At least a portion of the inorganic pattern layer PVX may be arranged in the peripheral area PA while facing the side display area SDA. At least a portion of the inorganic pattern layer PVX may be between the front display area FDA and the corner display area CDA.

Figure 16G:
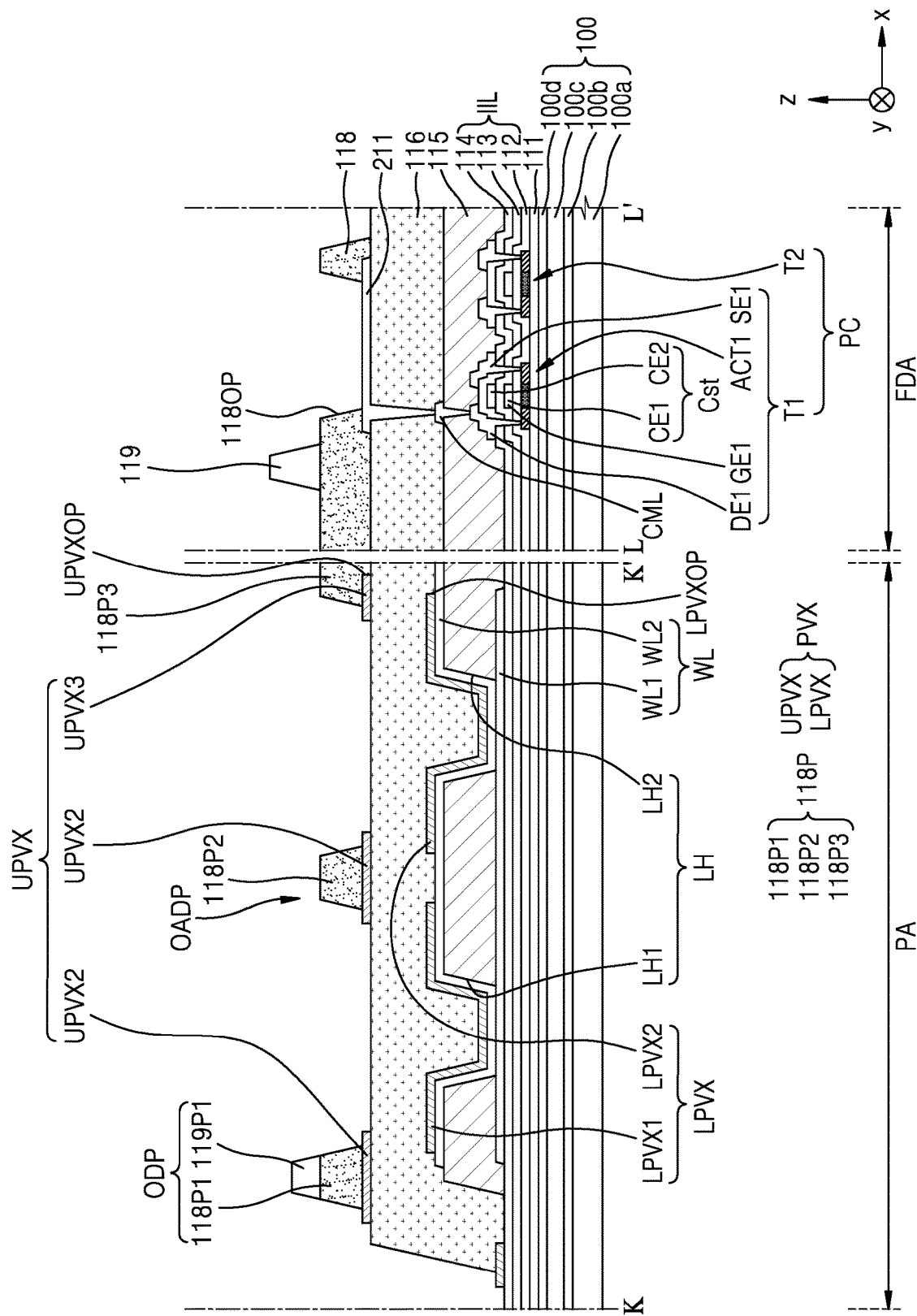
FIGS. 16G to 16M are cross-sectional views illustrating a method of manufacturing a display device, according to an embodiment.

Referring to FIG. 16G, a pixel electrode 211 may be provided or formed in the front display area FDA on the insulating layer 116. According to an embodiment, after the upper inorganic pattern layer UPVX is formed, the pixel electrode 211 may be formed. In an embodiment, a pixel defining layer 118 may be provided or formed to cover the edge of the pixel electrode 211. In an embodiment, an opening 118OP may be formed through the pixel defining layer 118 to expose the central portion of the pixel electrode 211.

An organic pattern layer 118P may be provided or formed on the upper inorganic pattern layer UPVX. The organic pattern layer 118P may be formed when the pixel defining layer 118 is formed. According to an embodiment, an organic layer may be entirely formed in the front display area FDA and the peripheral area PA and then patterned to form the organic pattern layer 118P and the pixel defining layer 118. In such an embodiment, the organic pattern layer 118P and the pixel defining layer 118 may include a same material as each other.

According to an embodiment, a first organic pattern layer 118P1 may be provided or formed on the first upper inorganic pattern layer UPVX1. A second organic pattern layer 118P2 may be provided or formed on the second upper inorganic pattern layer UPVX2. A third organic pattern layer 118P3 may be provided or formed on the third upper inorganic pattern layer UPVX3. The first organic pattern layer 118P1, the second organic pattern layer 118P2, and the third organic pattern layer 118P3 may be apart from each other.

A spacer 119 may be provided or formed on the pixel defining layer 118. In such an embodiment, a first upper organic pattern layer 119P1 may be provided or formed on the first organic pattern layer 118P1. According to an embodiment, the first upper organic pattern layer 119P1 and the spacer 119 may be provided or formed simultaneously with the organic pattern layer 118P and the pixel defining layer 118. The first upper organic pattern layer 119P1 and the spacer 119 may be provided or formed simultaneously with the organic pattern layer 118P and the pixel defining layer 118 through a mask process using a halftone mask or the like. In such an embodiment, the first upper organic pattern layer 119P1 and the spacer 119 may include a same materials as those of the organic pattern layer 118P and the pixel defining layer 118.

Each of the first organic pattern layer 118P1 and the first upper organic pattern layer 119P1 may collectively define an outer dam ODP. The second organic pattern layer 118P2 may collectively define an outer auxiliary dam OADP.

Figure 16H:
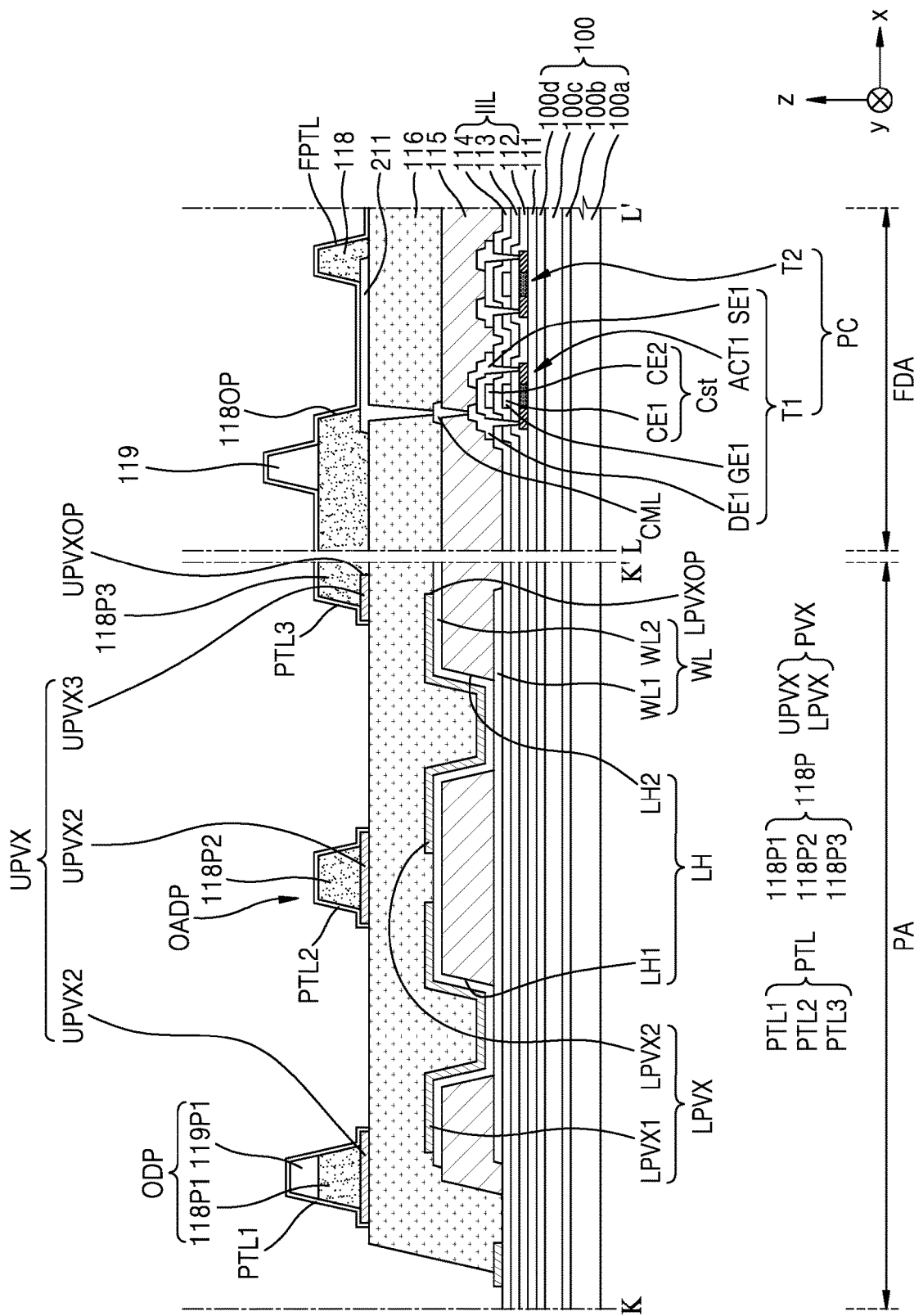

Referring to FIG. 16H, a protective layer PTL may be provided or formed in the peripheral area PA. The protective layer PTL may include a first protective layer PTL1, a second protective layer PTL2, and a third protective layer PTL3, which are apart from each other. The first protective layer PTL1 may cover the first organic pattern layer 118P1 and/or the first upper organic pattern layer 119P1. The second protective layer PTL2 may cover the second organic pattern layer 118P2. The third protective layer PTL3 may cover the third organic pattern layer 118P3.

The first protective layer PTL1 and the second protective layer PTL2 may be apart from each other to expose the insulating layer 116. The second protective layer PTL2 and the third protective layer PTL3 may be apart from each other to expose the insulating layer 116.

According to an embodiment, a front protective layer FPTL may be provided or formed in the front display area FDA. The front protective layer FPTL may entirely cover the front display area FDA. The front protective layer FPTL may be formed when the protective layer PTL is formed in the peripheral area PA.

According to an embodiment, a preliminary protective layer may be provided or formed on the substrate 100, and a photoresist pattern may be provided or formed on the preliminary protective layer. Subsequently, at least a portion of the preliminary protective layer may be removed to form the first protective layer PTL1, the second protective layer PTL2, the third protective layer PTL3, and the front protective layer FPTL. According to an embodiment, the preliminary protective layer may include IZO. In such an embodiment, the preliminary protective layer may be formed on the substrate 100 using sputtering, the photoresist layer may be entirely applied onto the preliminary protective layer, and only a portion of the photoresist layer may be exposed and developed to form photoresist pattern. Subsequently, the preliminary protective layer may be etched to form the first protective layer PTL1, the second protective layer PTL2, the third protective layer PTL3, and the front protective layer FPTL. The preliminary protective layer may be wet-etched to be separated into the first protective layer PTL1, the second protective layer PTL2, the third protective layer PTL3, and the front protective layer FPTL.

Figure 16I:
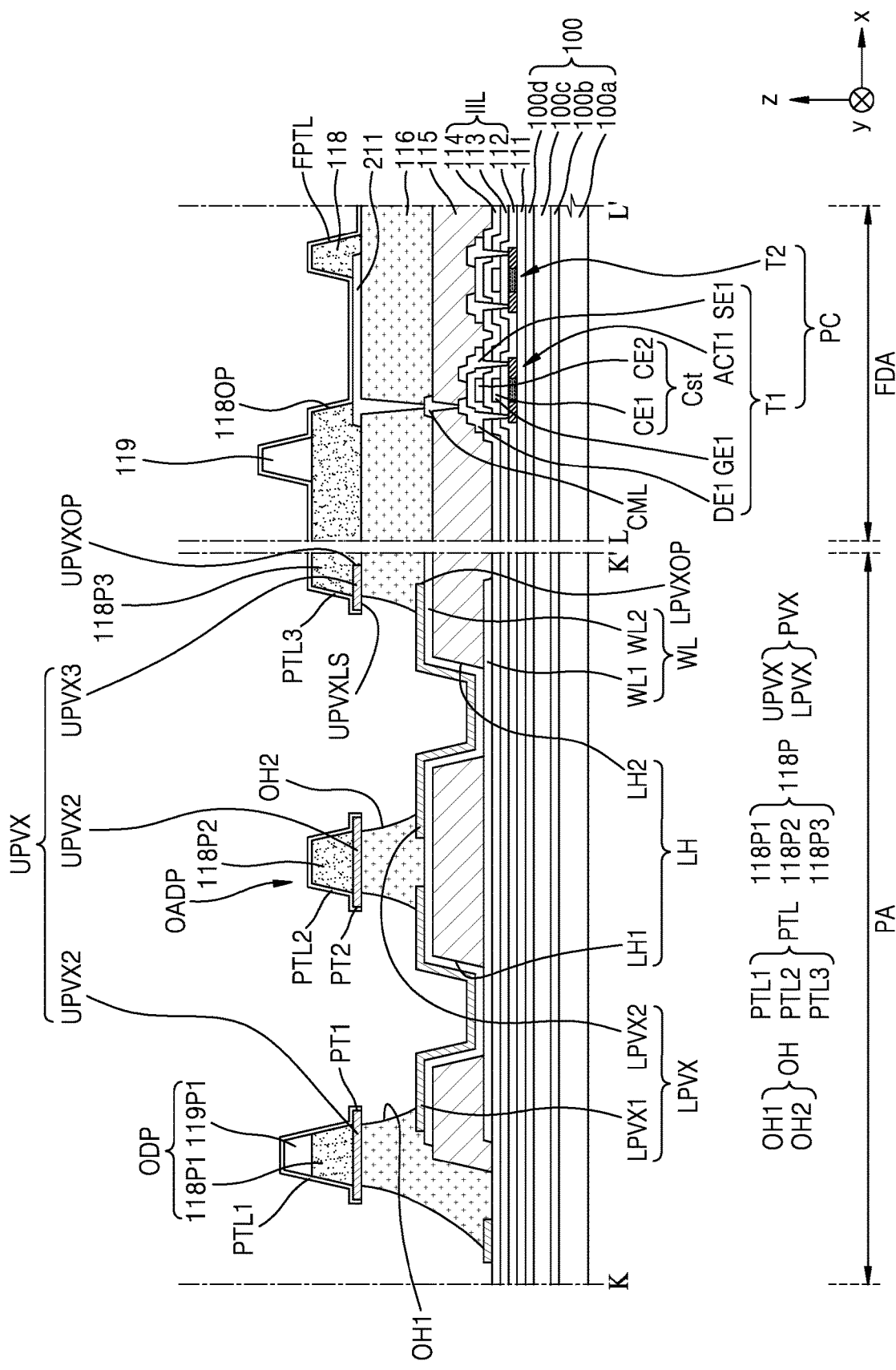

Referring to FIG. 16I, an outer through hole OH may be formed through the insulating layer 116. According to an embodiment, the outer through hole OH may be formed through a dry etching process.

According to an embodiment, the insulating layer 116 exposed between the first protective layer PTL1 and the second protective layer PTL2 may be etched in a way such that a first outer through hole OH1 of the insulating layer 116 may be formed.

According to an embodiment, the insulating layer 116 exposed between the second protective layer PTL2 and the third protective layer PTL3 may be etched in a way, such that a second outer through hole OH2 of the insulating layer 116 may be formed.

The outer through hole OH may overlap the lower hole LH. In one embodiment, for example, the first outer through hole OH1 may overlap the first lower hole LH1, and the second outer through hole OH2 may overlap the second lower hole LH2.

The outer through hole OH may expose the lower inorganic pattern layer LPVX. According to an embodiment, the outer through hole OH may expose the central portion of the lower inorganic pattern layer LPVX. The lower inorganic pattern layer LPVX may prevent the second line WL2 below the lower inorganic pattern layer LPVX from being over-etched. Therefore, the lower inorganic pattern layer LPVX may prevent or reduce a resistance from increasing due to over-etching of the second line WL2.

The upper inorganic pattern layer UPVX and the organic pattern layer 118P may be covered with the protective layer PTL. Therefore, the protective layer PTL may prevent or reduce the etching of the upper inorganic pattern layer UPVX and the organic pattern layer 118P while the outer through hole OH is formed.

According to an embodiment, the insulating layer 116 below the upper inorganic pattern layer UPVX may be over-etched. Therefore, an undercut structure may be formed in the insulating layer 116. In such an embodiment, the lower surface of the end of the upper inorganic pattern layer UPVX may be exposed. in such an embodiment, the lower surface UPVXLS of the upper inorganic pattern layer UPVX overlapping the outer through hole OH may be exposed.

According to an embodiment, the first upper inorganic pattern layer UPVX1 may include a first protruding tip PT1 protruding toward the center of the first outer through hole OH1, and the second upper inorganic pattern layer UPVX2 may include a second protruding tip PT2 protruding toward the center of the first outer through hole OH1. The first protruding tip PT1 and the second protruding tip PT2 may face each other with the first outer through hole OH1 therebetween.

Figure 16J:
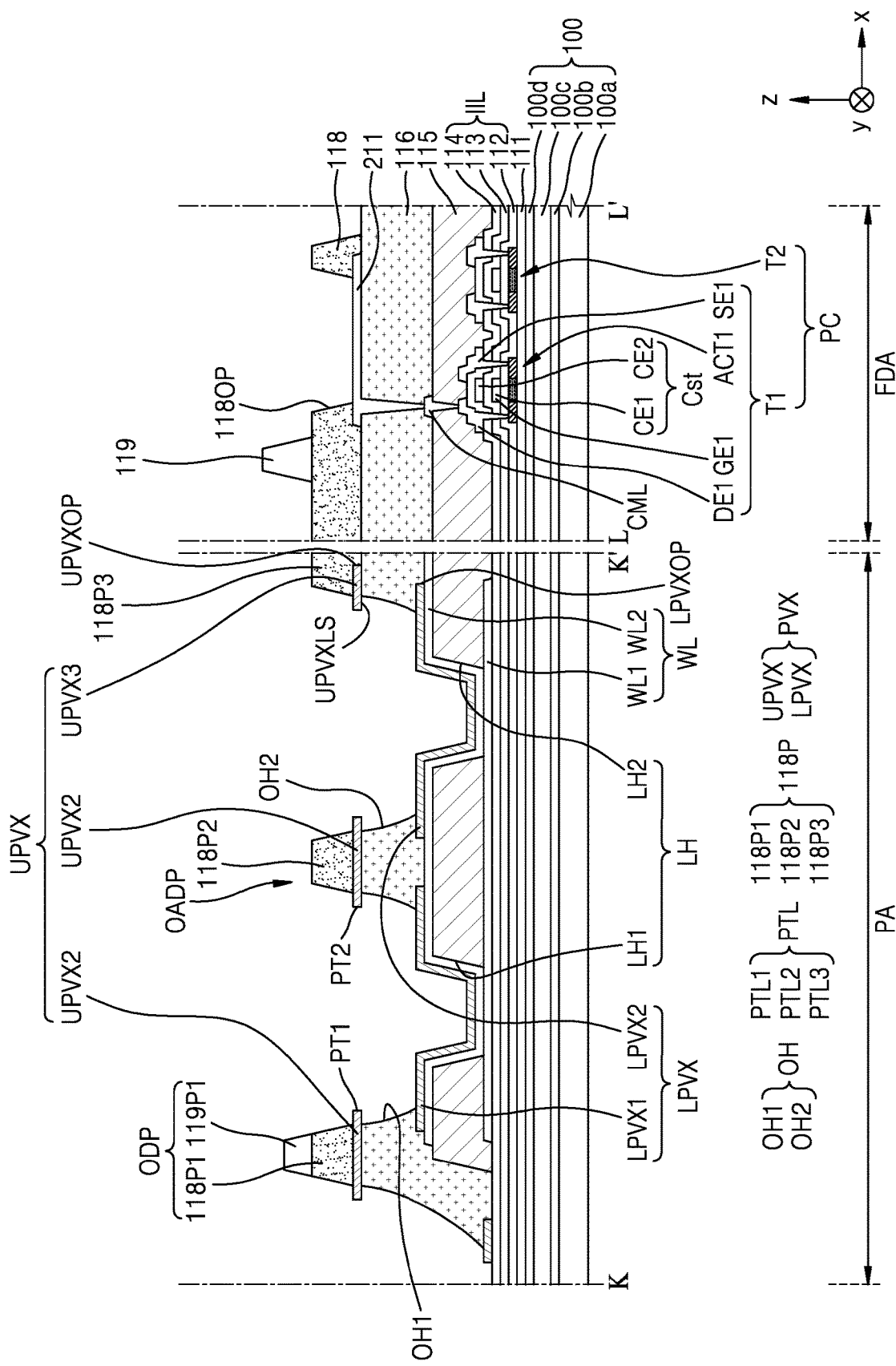

Referring to FIG. 16J, the protective layer PTL may be removed. In one embodiment, for example, the first protective layer PTL1, the second protective layer PTL2, and the third protective layer PTL3 may be removed. Also, the front protective layer FPTL may be removed. The protective layer PTL and the front protective layer FPTL may be removed through a wet etching process. According to an embodiment, the protective layer PTL and the front protective layer FPTL may be simultaneously removed during a same process.

Figure 16K:
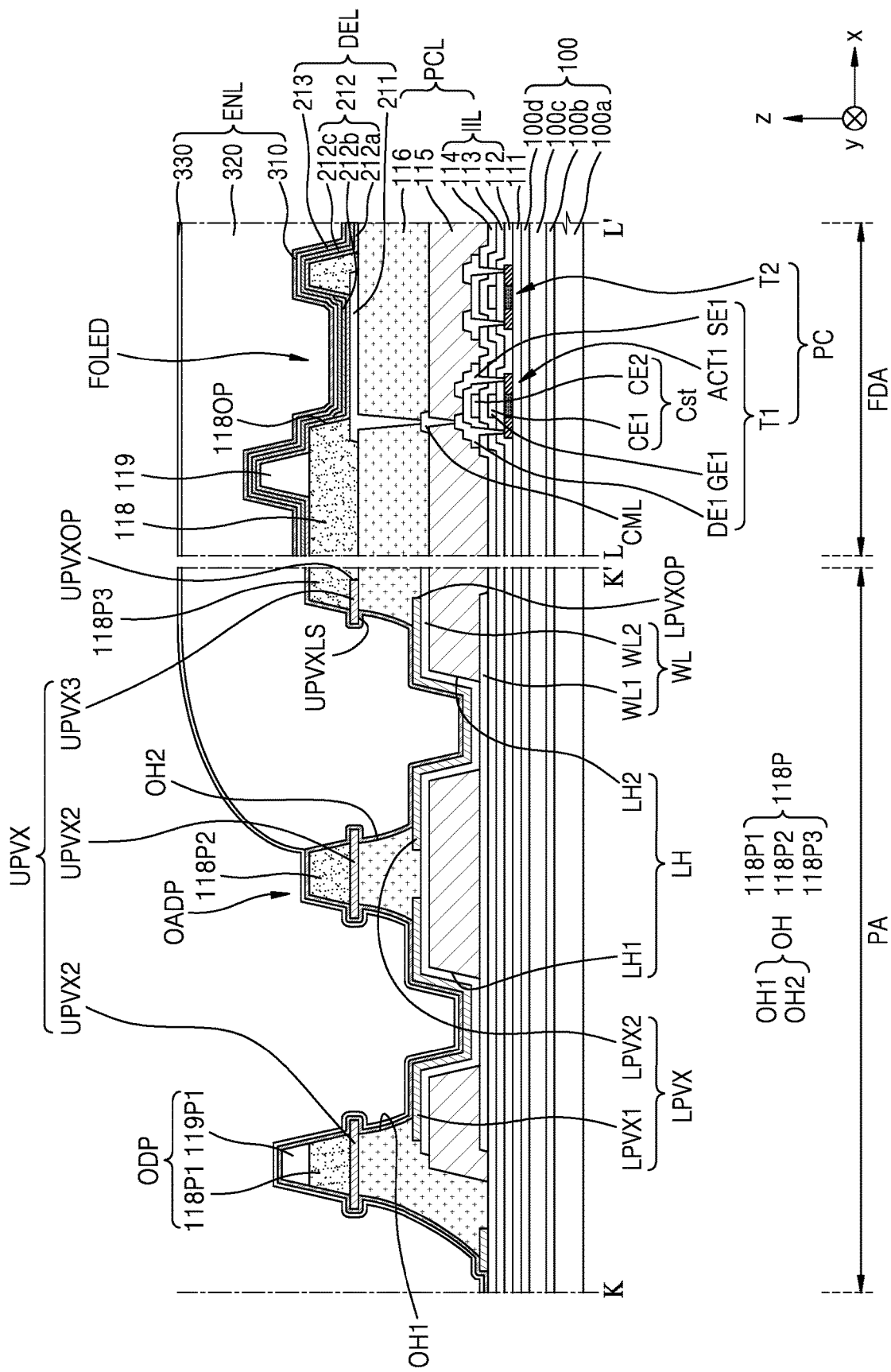

Referring to FIG. 16K, an intermediate layer 212 and an opposite electrode 213 may be provided or formed on the front display area FDA. Therefore, the front organic light-emitting diode FOLED may be formed. According to an embodiment, the first functional layer 212a and the second functional layer 212c may also be provided or formed on the peripheral area PA. In such an embodiment, because the upper inorganic pattern layer UPVX may include the protruding tip protruding toward the center of the outer through hole OH, the first functional layer 212a, the second functional layer 212c, and the opposite electrode 213 may be disconnected based on the outer through hole OH. In such an embodiment, the lower surface UPVXLS of the upper inorganic pattern layer UPVX overlapping the outer through hole OH may not be in contact with the first functional layer 212a, the second functional layer 212c, and the opposite electrode 213. Therefore, infiltration of foreign matter or external moisture into the front display area FDA through at least one of the first functional layer 212a and the second functional layer 212c may be prevented or reduced, such that the reliability of the display panel may be improved.

After the front organic light-emitting diode FOLED is formed, an encapsulation layer ENL may be formed. The encapsulation layer ENL may include at least one inorganic encapsulation layer and at least one organic encapsulation layer. In one embodiment, for example, the encapsulation layer ENL may include a first inorganic encapsulation layer 310, an organic encapsulation layer 320, and a second inorganic encapsulation layer 330. The first inorganic encapsulation layer 310 may be in contact with the protruding tip of the upper inorganic pattern layer UPVX. The first inorganic encapsulation layer 310 may be in contact with the lower surface UPVXLS of the upper inorganic pattern layer UPVX overlapping the outer through hole OH. In one embodiment, for example, the first inorganic encapsulation layer 310 may be in contact with the first protruding tip PT1 of the first upper inorganic pattern layer UPVX1 and the second protruding tip PT2 of the second upper inorganic pattern layer UPVX2.

According to an embodiment, the first inorganic encapsulation layer 310 may be in contact with the lower inorganic pattern layer LPVX. In one embodiment, for example, the first inorganic encapsulation layer 310 may be in contact with the first lower inorganic pattern layer LPVX1 and the second lower inorganic pattern layer LPVX2. In such an embodiment, the first inorganic encapsulation layer 310 may be in contact with the inorganic insulating layer IIL.

According to an embodiment, the organic encapsulation layer 320 may extend to the third organic pattern layer 118P3. According to an embodiment, the organic encapsulation layer 320 may extend to the outer auxiliary dam OADP. According to an embodiment, the organic encapsulation layer 320 may extend to the outer dam ODP. The third organic pattern layer 118P3, the outer auxiliary dam OADP, and the outer dam ODP may control the flow of an organic material provided for forming the organic encapsulation layer 320.

The second inorganic encapsulation layer 330 may be provided or formed on the organic encapsulation layer 320. The second inorganic encapsulation layer 330 may be in contact with the first inorganic encapsulation layer 310 on at least one of the outer dam ODP and the outer auxiliary dam OADP.

Figure 16L:
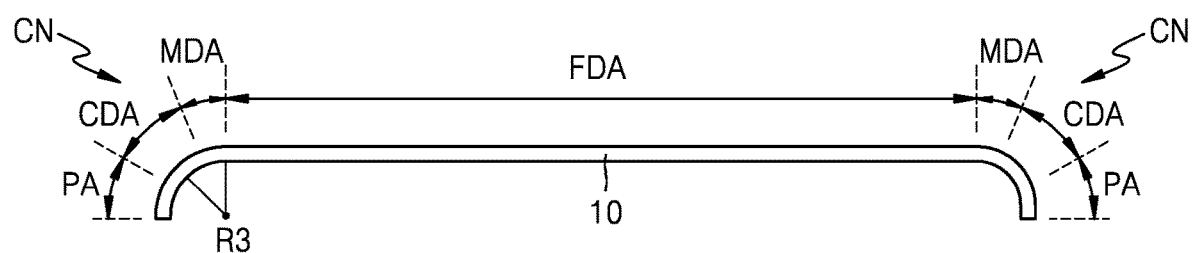

Referring to FIG. 16L, the display panel 10 may be bent. in an embodiment, the corner display area CDA overlapping the corner CN of the display panel 10 may be bent. According to an embodiment, the corner display area CDA may have a third radius R3 of curvature. According to an embodiment, a guide film may be arranged below the display panel 10, and the corner display area CDA may be bent in a vacuum state. According to an embodiment, the corner display area CDA may be bent through a thermoforming process.

Figure 16M:
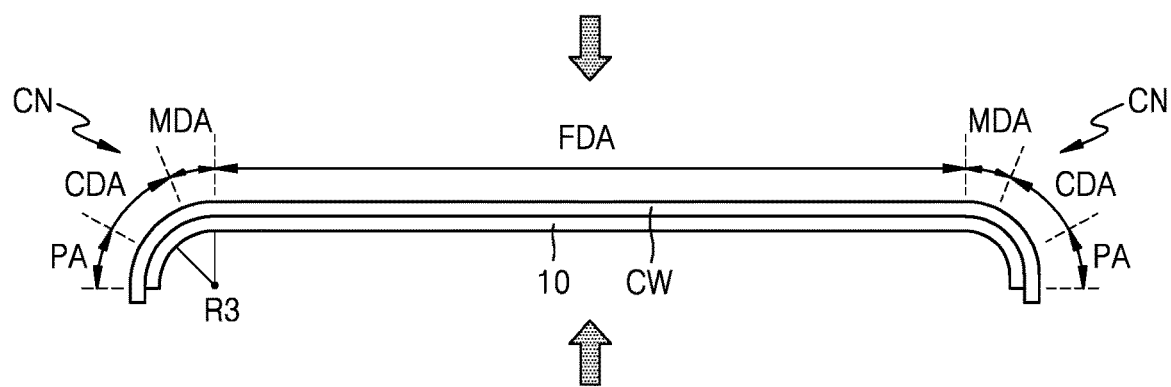

Referring to FIG. 16M, a cover window CW may be provided on the display panel 10 manufactured as described above. The display panel 10 may be attached to the cover window CW. According to an embodiment, the display panel 10 and the cover window CW may be connected to each other using an OCA (not illustrated). The display panel 10 may be attached to the cover window CW through a lamination process. Therefore, the cover window CW may be on the corner display area CDA of the display panel 10.

Figure 17:
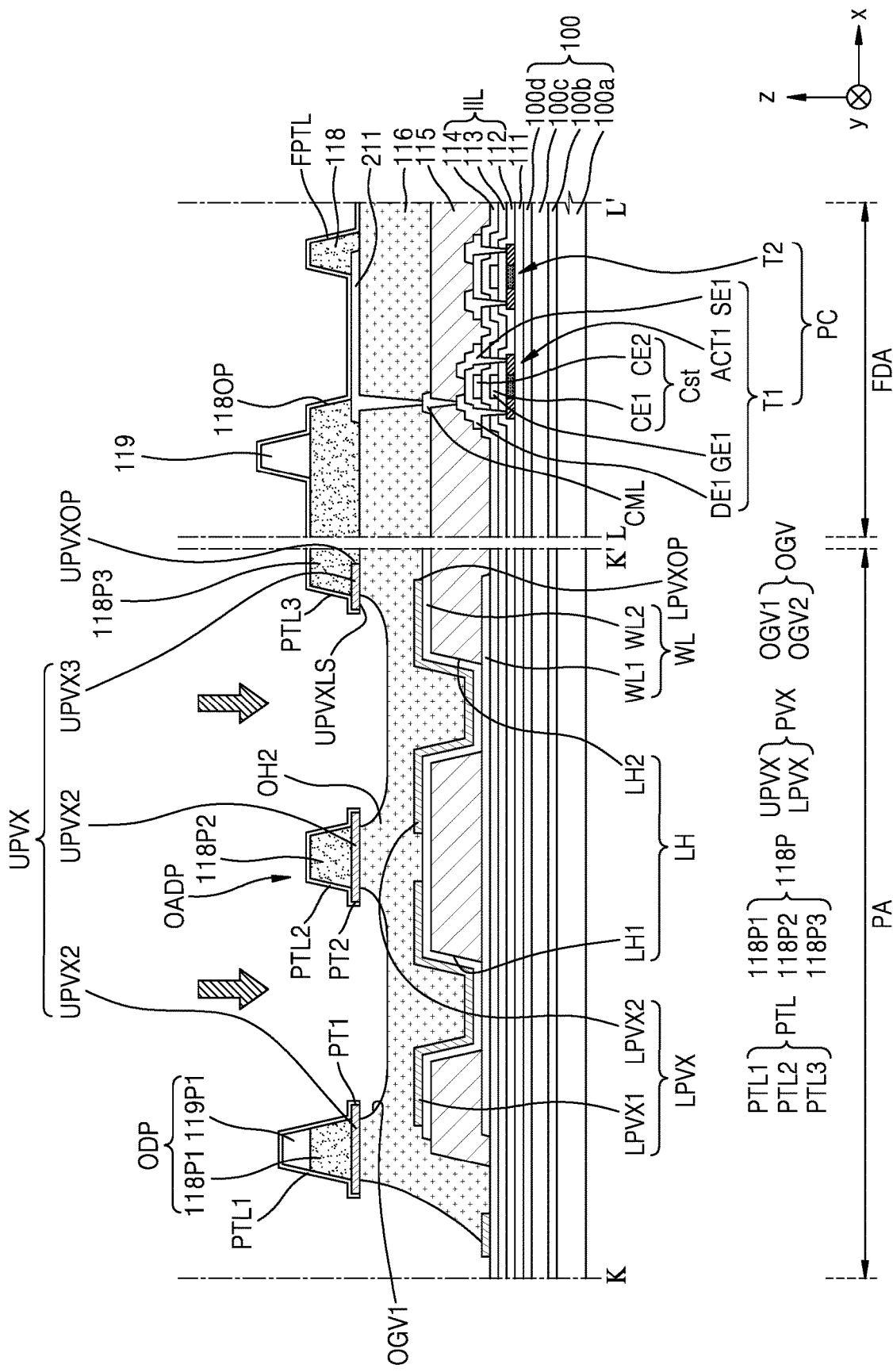
FIG. 17 is a schematic cross-sectional view illustrating a method of manufacturing a display device, according to an alternative embodiment.

FIG. 17 is a schematic cross-sectional view illustrating a method of manufacturing a display device, according to an alternative embodiment. In FIG. 17, the same reference numerals as those in FIG. 16I denote the same elements, and any repetitive detailed descriptions thereof will be omitted. Because the method of manufacturing the same elements of the display device of FIG. 17 is the same as those described above with reference to FIGS. 16A to 16H, any repetitive detailed descriptions thereof will be omitted.

Referring to FIG. 17, the outer groove OGV of the insulating layer 116 may be formed. According to an embodiment, an outer groove OGV may be formed through a dry etching process.

According to an embodiment, the insulating layer 116 exposed between the first protective layer PTL1 and the second protective layer PTL2 may be etched in a way, such that a first outer groove OGV1 of the insulating layer 116 may be formed.

According to an embodiment, the insulating layer 116 exposed between the second protective layer PTL2 and the third protective layer PTL3 may be etched in a way, such that a second outer groove OGV2 of the insulating layer 116 may be formed.

The outer groove OGV may overlap the lower hole LH. In one embodiment, for example, the first outer groove OGV1 may overlap the first lower hole LH1, and the second outer groove OGV2 may overlap the second lower hole LH2. In such an embodiment, because the second line WL2 is still covered with the insulating layer 116, the process of forming the lower inorganic pattern layer LPVX may be omitted.

The upper inorganic pattern layer UPVX and the organic pattern layer 118P may be covered with the protective layer PTL. Therefore, the protective layer PTL may prevent or reduce the etching of the upper inorganic pattern layer UPVX and the organic pattern layer 118P while the outer groove OGV is formed.

According to an embodiment, the insulating layer 116 below the upper inorganic pattern layer UPVX may be over-etched. Therefore, an undercut structure may be formed in the insulating layer 116. In such an embodiment, the lower surface of the end of the upper inorganic pattern layer UPVX may be exposed. In such an embodiment, the lower surface UPVXLS of the upper inorganic pattern layer UPVX overlapping the outer groove OGV may be exposed.

According to an embodiment, the first upper inorganic pattern layer UPVX1 may include a first protruding tip PT1 protruding toward the center of the first outer groove OGV1, and the second upper inorganic pattern layer UPVX2 may include a second protruding tip PT2 protruding toward the center of the first outer groove OGV1. The first protruding tip PT1 and the second protruding tip PT2 may face each other with the first outer groove OGV1 therebetween.

Figure 18A:
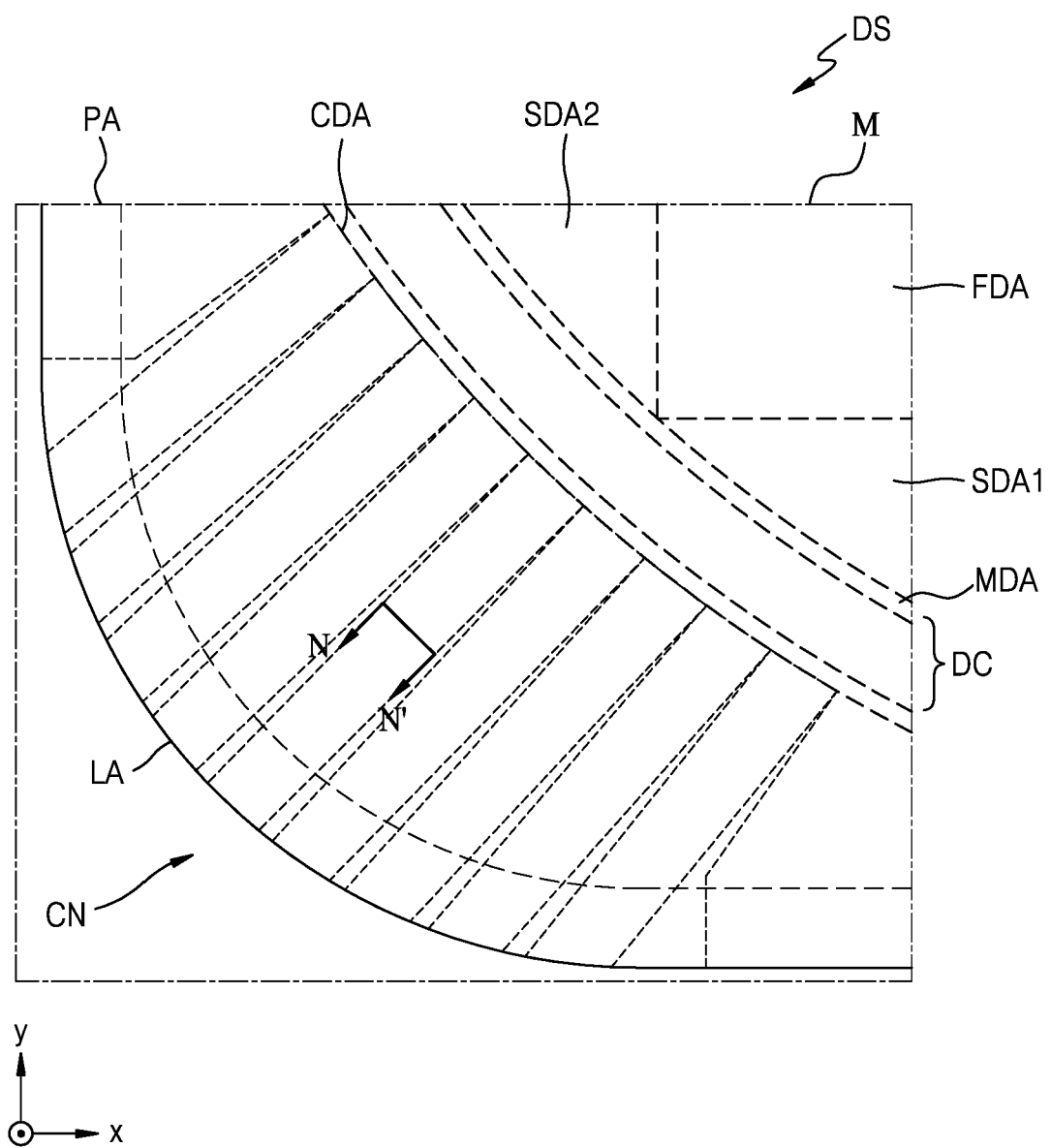
FIG. 18A is a plan view illustrating a method of manufacturing a display device, according to an embodiment.

FIG. 18A is a plan view illustrating a method of manufacturing a display device, according to an embodiment. FIGS. 18B to 18E are cross-sectional views illustrating a method of manufacturing a display device, according to an embodiment. FIG. 18F is a plan view illustrating a method of manufacturing a display device, according to an embodiment. FIGS. 18G to 18K are cross-sectional views illustrating a method of manufacturing a display device, according to an embodiment. FIG. 18A is an enlarged view of portion M of FIG. 16A. FIGS. 18B to 18E and 18G to 18K are schematic cross-sectional views of a display panel taken along line N-N' of FIG. 18A.

Referring to FIG. 18A, an embodiment of a display substrate DS may include a substrate including a display area DA and a peripheral area PA, and lines and a driving circuit DC on the substrate. The display area DA may include a front display area FDA, a first side display area SDA1, a second side display area SDA2, a corner display area CDA, and a middle display area MDA.

The corner display area CDA may overlap at least a portion of a plurality of extension areas LA. A penetrating portion penetrating through the display panel may be defined or formed between the neighboring extension areas LA through a subsequent process. A driving circuit DC may be arranged in the middle display area MDA.

Figure 18B:
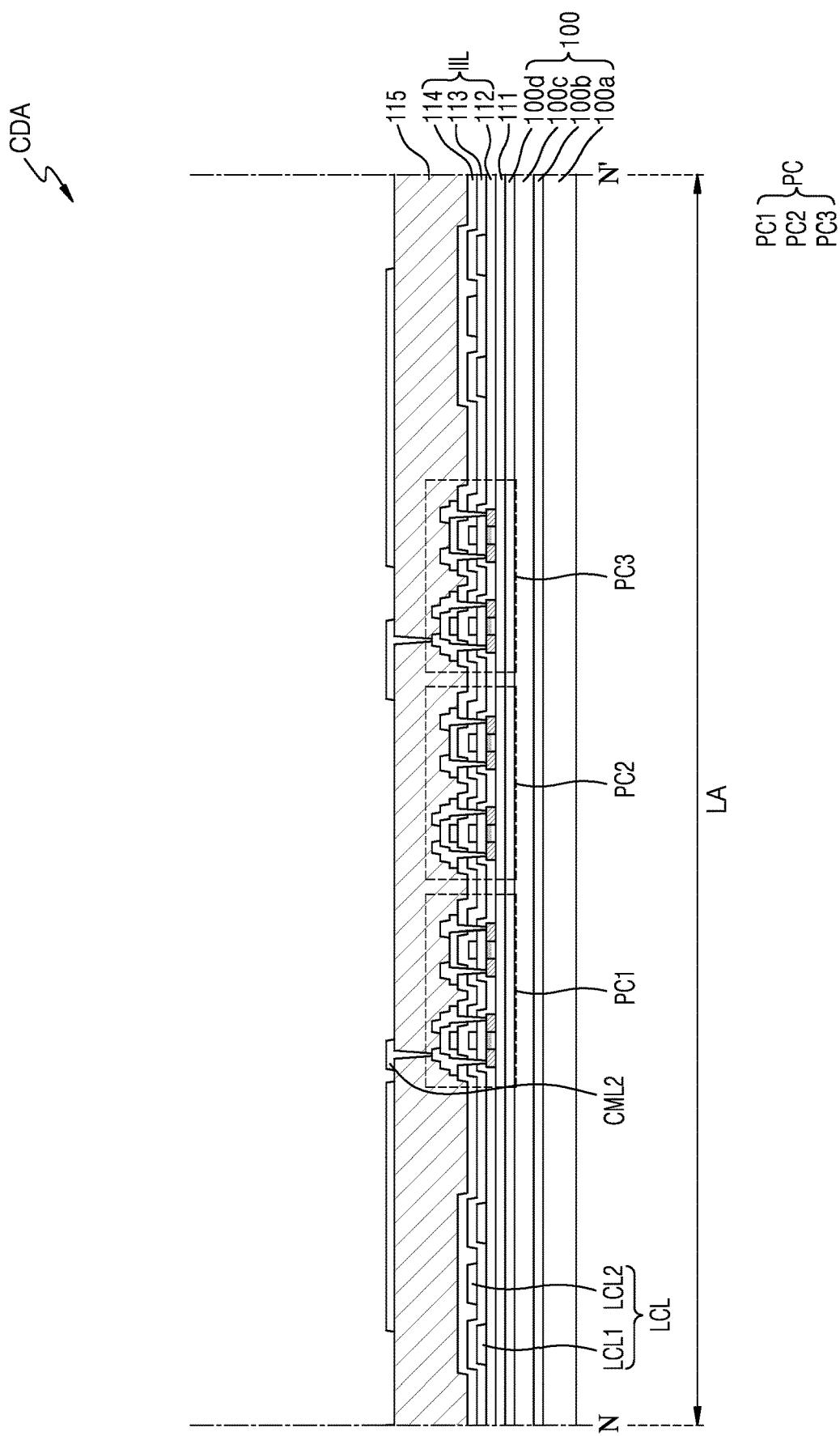

Referring to FIG. 18B, a buffer layer 111, a pixel circuit PC, a connection line, an inorganic insulating layer IIL, and a lower insulating layer 115 may be provided or formed on the extension areas LA overlapping the corner display area CDA. The connection line may include a lower connection line LCL and a second connection line CL2. The inorganic insulating layer IIL may include a first gate insulating layer 112, a second gate insulating layer 113, and an interlayer insulating layer 114.

The lower connection line LCL may include a first lower connection line LCL1 and a second lower connection line LCL2. The first lower connection line LCL1 may be between the first gate insulating layer 112 and the second gate insulating layer 113. The second lower connection line LCL2 may be between the second gate insulating layer 113 and the interlayer insulating layer 114.

According to an embodiment, the pixel circuit PC may include a first pixel circuit PC1, a second pixel circuit PC2, and a third pixel circuit PC3.

The lower insulating layer 115 may cover the lower connection line LCL and the pixel circuit PC. A second connection line CL2 and a second connection electrode CML2 may be on the lower insulating layer 115.

Figure 18C:
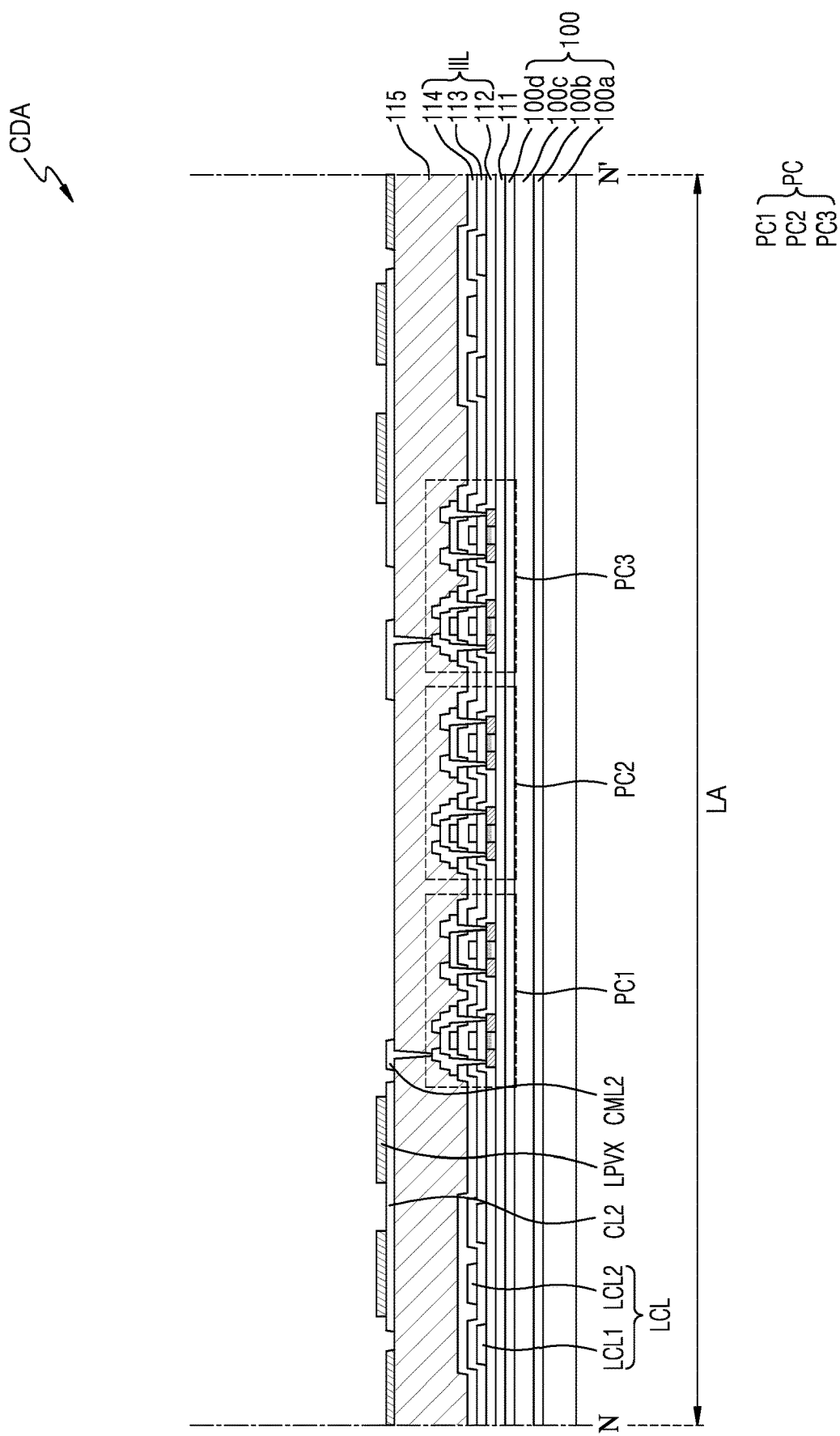

Referring to FIG. 18C, the lower inorganic pattern layer LPVX may be provided or formed on the extension area LA. In such an embodiment, the lower inorganic pattern layer LPVX may overlap the corner display area CDA. According to an embodiment, the lower inorganic pattern layer LPVX may be provided or formed on the second connection line CL2. According to an embodiment, a plurality of lower inorganic pattern layers LPVX may be provided.

Referring to FIG. 18D, an insulating layer 116 may be provided or formed on the corner display area CDA. The insulating layer 116 may overlap the extension area LA and may cover the second connection line CL2. According to an embodiment, the insulating layer 116 may be continuously formed on the second connection line CL2. According to an embodiment, a contact hole may be formed through the insulating layer 116 to expose the second connection electrode CML2.

Figure 18E:
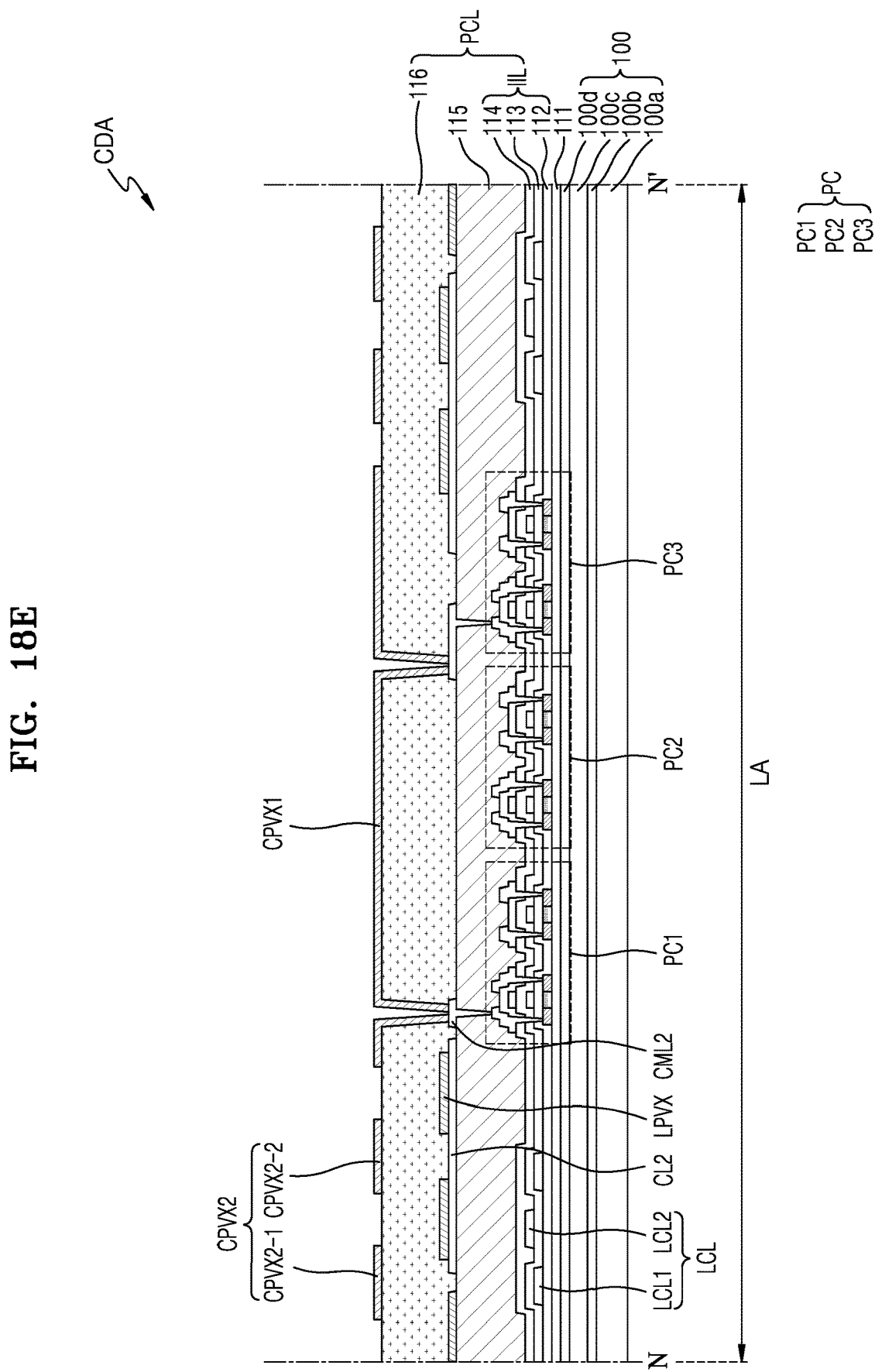
Figure 18F:
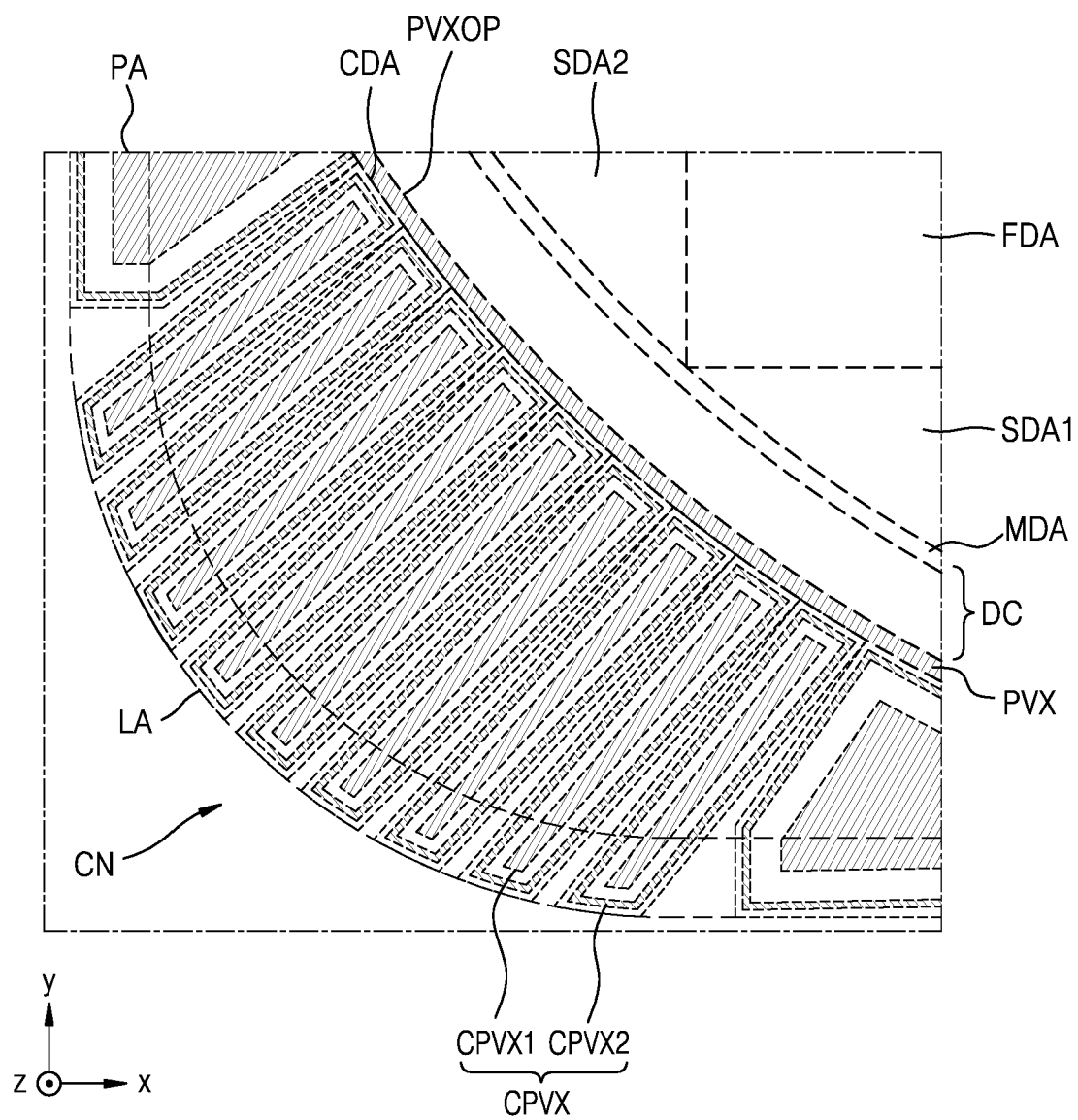
FIG. 18F is a plan view illustrating a method of manufacturing a display device, according to an embodiment.

Referring to FIGS. 18E and 18F, a first corner inorganic pattern layer CPVX1 and a second corner inorganic pattern layer CPVX2 may be provided or formed on the insulating layer 116. The first corner inorganic pattern layer CPVX1 and the second corner inorganic pattern layer CPVX2 may overlap the corner display area CDA. The first corner inorganic pattern layer CPVX1 and the second corner inorganic pattern layer CPVX2 may be apart from each other.

The second corner inorganic pattern layer CPVX2 may be provided or formed to surround the first corner inorganic pattern layer CPVX1. The second corner inorganic pattern layer CPVX2 may include an outer inorganic pattern layer CPVX2-1 and an inner inorganic pattern layer CPVX2-2, which are apart from each other.

According to an embodiment, after an inorganic layer is entirely formed on the insulating layer 116, at least a portion of the inorganic layer may be etched to form the first corner inorganic pattern layer CPVX1 and the second corner inorganic pattern layer CPVX2.

According to an embodiment, the first corner inorganic pattern layer CPVX1 and the second corner inorganic pattern layer CPVX2 may be formed simultaneously with the upper inorganic pattern layer of the inorganic pattern layer PVX during a same process. In one embodiment, for example, after the inorganic layer is entirely formed on the insulating layer 116, at least a portion of the inorganic layer may be etched to form the first corner inorganic pattern layer CPVX1, the second corner inorganic pattern layer CPVX2, and the upper inorganic pattern layers of the inorganic pattern layer PVX.

Figure 18G:
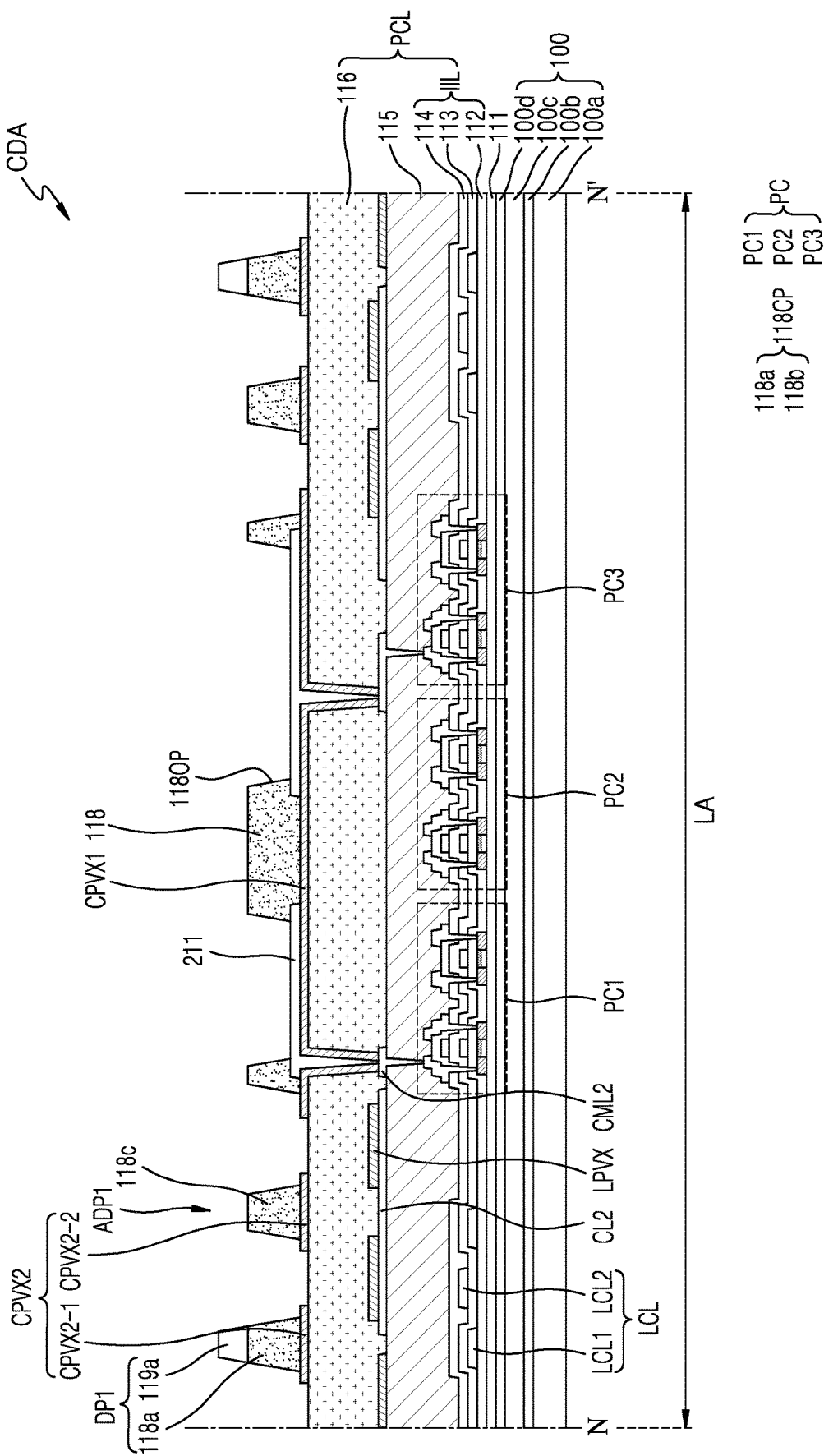
FIGS. 18G to 18K are cross-sectional views illustrating a method of manufacturing a display device, according to an embodiment.

Referring to FIG. 18G, a pixel electrode 211 may be provided or formed on the first corner inorganic pattern layer CPVX1. In such an embodiment, after the first corner inorganic pattern layer CPVX1 is formed, the pixel electrode 211 may be formed. In an embodiment, a pixel defining layer 118 may be formed to cover the edge of the pixel electrode 211. In such an embodiment, an opening 1180P may be formed through the pixel defining layer 118 to expose the central portion of the pixel electrode 211.

A corner organic pattern layer 118CP may be provided or formed on the second corner inorganic pattern layer CPVX2. The corner organic pattern layer 118CP may be formed when the pixel defining layer 118 is formed. According to an embodiment, an organic layer may be entirely formed in the corner display area CDA and then patterned to form the corner organic pattern layer 118CP and the pixel defining layer 118. In such an embodiment, the corner organic pattern layer 118CP and the pixel defining layer 118 may include a same material as each other. The corner organic pattern layer 118CP may include an outer corner organic pattern layer 118a and an inner corner organic pattern layer 118c.

According to an embodiment, the outer corner organic pattern layer 118a may be provided or formed on the outer inorganic pattern layer CPVX2-1. The inner corner organic pattern layer 118c may be provided or formed on the inner inorganic pattern layer CPVX2-2. The outer corner organic pattern layer 118a and the inner corner organic pattern layer 118c may be apart from each other.

According to an embodiment, an upper corner organic pattern layer 119a may be provided or formed on the outer corner organic pattern layer 118a. According to an embodiment, the outer corner organic pattern layer 118a and the upper corner organic pattern layer 119a may be formed simultaneously with each other. In one embodiment, for example, the outer corner organic pattern layer 118a and the upper corner organic pattern layer 119a may be formed simultaneously through a mask process using a halftone mask or the like. In such an embodiment, the outer corner organic pattern layer 118a and the upper corner organic pattern layer 119a may include a same material as each other.

The outer corner organic pattern layer 118a and the upper corner organic pattern layer 119a may collectively define a first dam DP1. The inner corner organic pattern layer 118c may define a first auxiliary dam ADP1.

Figure 18H:
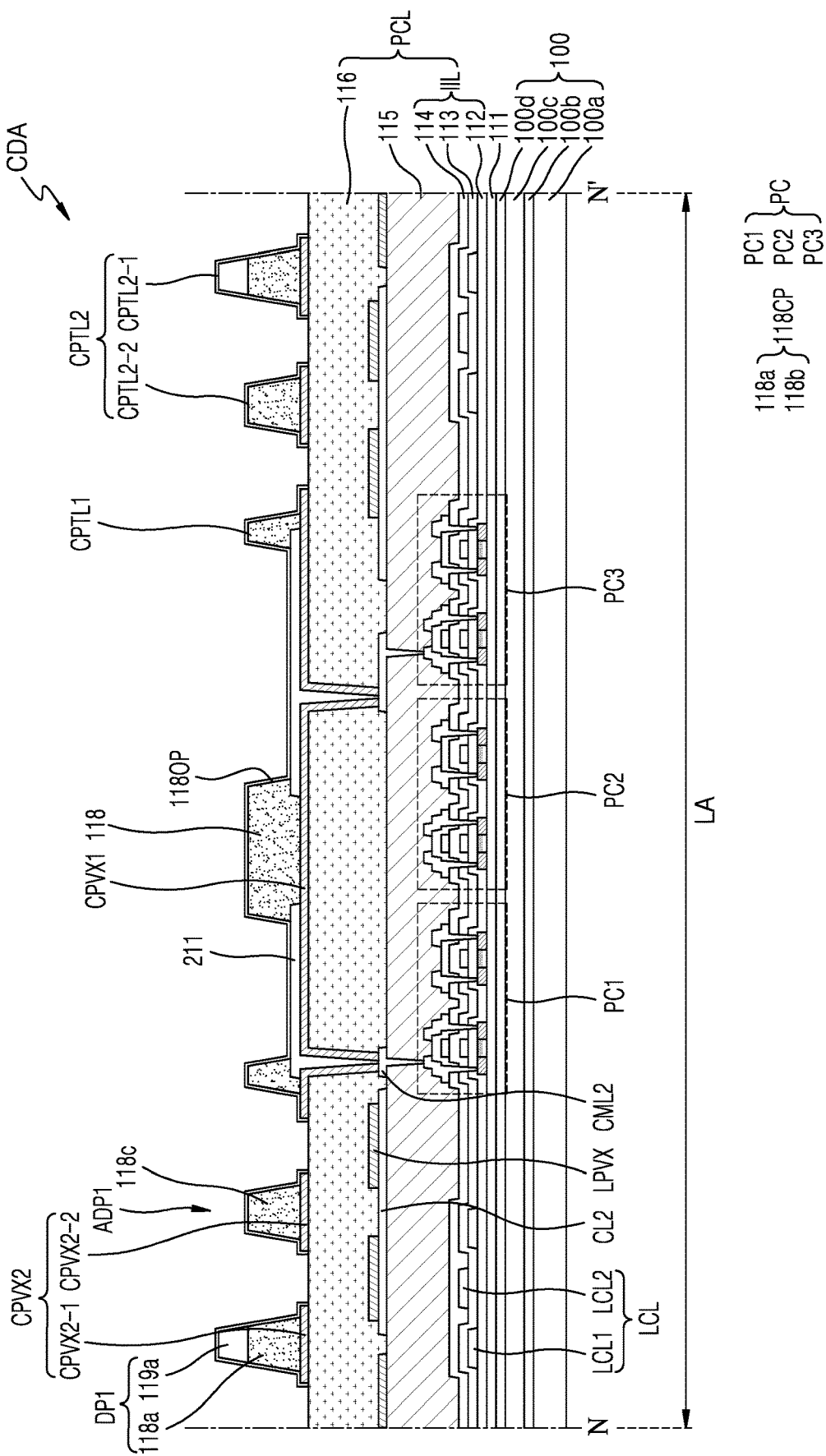

Referring to FIG. 18H, a first corner protective layer CPTL1 and a second corner protective layer CPTL2 apart from each other may be provided or formed on the corner display area CDA. The second corner protective layer CPTL2 may include an outer corner protective layer CPTL2-1 and an inner corner protective layer CPTL2-2, which are apart from each other. The first corner protective layer CPTL1 may cover the first corner inorganic pattern layer CPVX1, the pixel electrode 211, and the pixel defining layer 118. The outer corner protective layer CPTL2-1 may cover the outer inorganic pattern layer CPVX2-1, the outer corner organic pattern layer 118a, and the upper corner organic pattern layer 119a. The inner corner protective layer CPTL2-2 may cover the inner inorganic pattern layer CPVX2-2 and the inner corner organic pattern layer 118c.

The first corner protective layer CPTL1 and the second corner protective layer CPTL2 may be apart from each other to expose the insulating layer 116. In an embodiment, the outer corner protective layer CPTL2-1 and the inner corner protective layer CPTL2-2 may be apart from each other to expose the insulating layer 116. The inner corner protective layer CPTL2-2 and the first corner protective layer CPTL1 may be apart from each other to expose the insulating layer 116.

According to an embodiment, the first corner protective layer CPTL1 and the second corner protective layer CPTL2 may be formed simultaneously when the protective layer PTL and the front protective layer FPTL of FIG. 16H are formed. The first corner protective layer CPTL1 and the second corner protective layer CPTL2 may include IZO. In such an embodiment, the method of forming the first corner protective layer CPTL1 and the second corner protective layer CPTL2 is similar to the method of forming the protective layer PTL and the front protective layer FPTL, and any repetitive detailed descriptions thereof will be omitted.

Figure 18I:
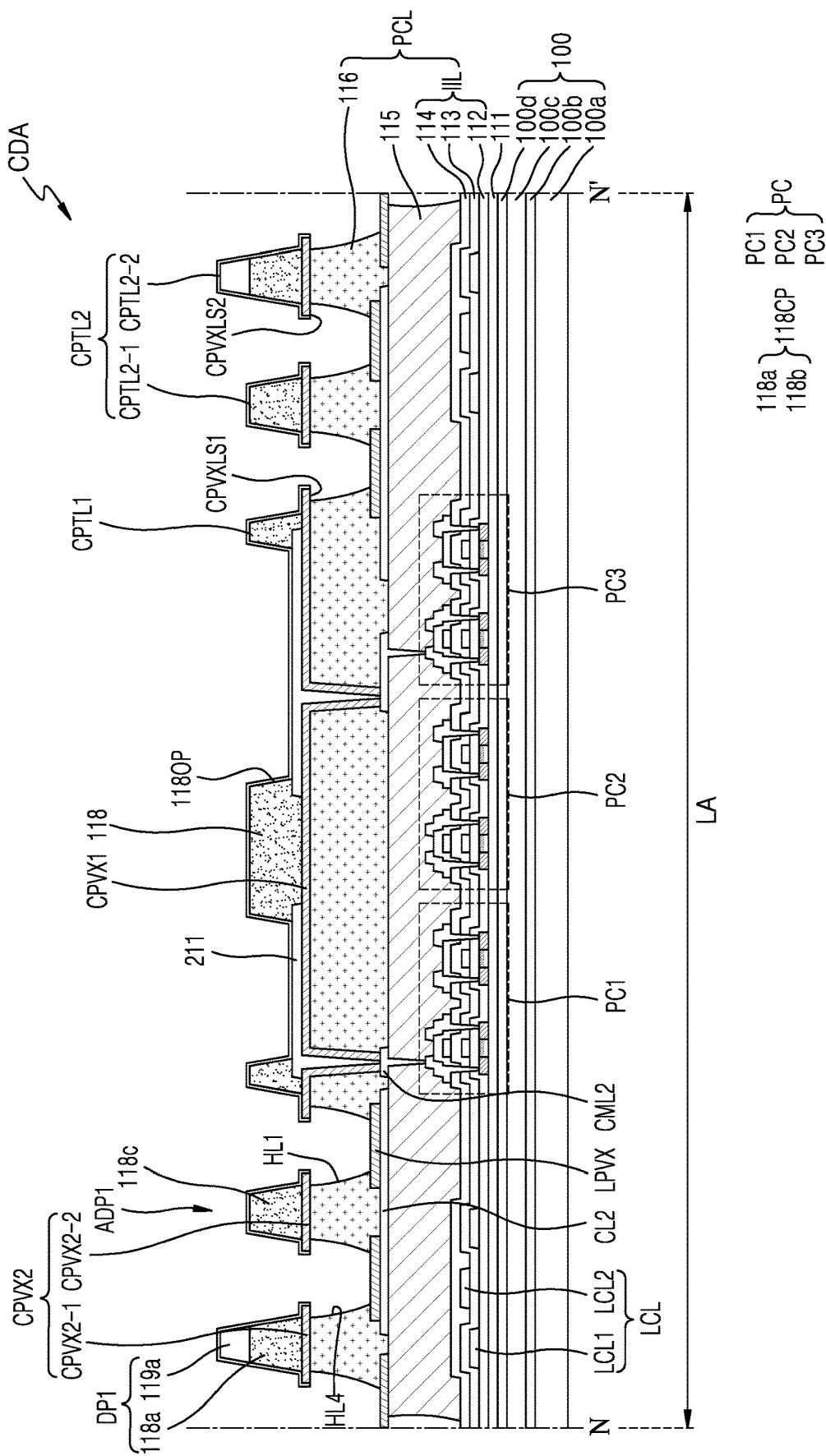

Referring to FIG. 18I, a hole may be formed through the insulating layer 116. According to an embodiment, the hole of the insulating layer 116 may be formed through a dry etching process.

According to an embodiment, the insulating layer 116 exposed between the first corner protective layer CPTL1 and the inner corner protective layer CPTL2-2 may be etched in a way, such that a first hole HL1 of the insulating layer 116 may be formed.

According to an embodiment, the insulating layer 116 exposed between the inner corner protective layer CPTL2-2 and the outer corner protective layer CPTL2-1 may be etched in a way, such that a fourth hole HL4 of the insulating layer 116 may be formed.

The first hole HL1 and the fourth hole HL4 may expose the lower inorganic pattern layer LPVX. According to an embodiment, the first hole HL1 and the fourth hole HL4 may expose the central portion of the lower inorganic pattern layer LPVX. The lower inorganic pattern layer LPVX may prevent the second connection line CL2 below the lower inorganic pattern layer LPVX from being over-etched. Therefore, the lower inorganic pattern layer LPVX may prevent or reduce a resistance from increasing due to over-etching of the second connection line CL2.

The first corner inorganic pattern layer CPVX1, the pixel defining layer 118, and the pixel electrode 211 may be covered with the first corner protective layer CPTL1. The second corner inorganic pattern layer CPVX2 and the corner organic pattern layer 118CP may be covered with the second corner protective layer CPTL2. Therefore, the first corner protective layer CPTL1 and the second corner protective layer CPTL2 may prevent or reduce etching of the first corner inorganic pattern layer CPVX1, the pixel defining layer, the pixel electrode 211, the second corner inorganic pattern layer CPVX2, and the corner organic pattern layer 118CP while the second hole HL2 and the fourth hole HL4 are formed.

According to an embodiment, the insulating layer 116 below the first corner inorganic pattern layer CPVX1 and the second corner inorganic pattern layer CPVX2 may be over-etched. Therefore, an undercut structure may be formed in the insulating layer 116. In such an embodiment, lower surfaces of ends of the first corner inorganic pattern layer CPVX1 and the second corner inorganic pattern layer CPVX2 may be exposed. in such an embodiment, the lower surface CPVXLS1 of the first corner inorganic pattern layer CPVX1 overlapping the first hole HL1 may be exposed. The lower surface of the second corner inorganic pattern layer CPVX2 overlapping the first hole HL1 and the lower surface CPVXLS2 of the second corner inorganic pattern layer CPVX2 overlapping the fourth hole HL4 may be exposed.

The lower surface of the first corner inorganic pattern layer CPVX1 and/or the lower surface of the second corner inorganic pattern layer CPVX2, which overlap the first hole HL1 and/or the fourth hole HL4, may be exposed.

In such an embodiment, the protruding tip of the first corner inorganic pattern layer CPVX1 and the protruding tip of the second corner inorganic pattern layer CPVX2 may protrude toward the center of the second hole HL2 and/or the center of the fourth hole HL4.

Figure 18J:
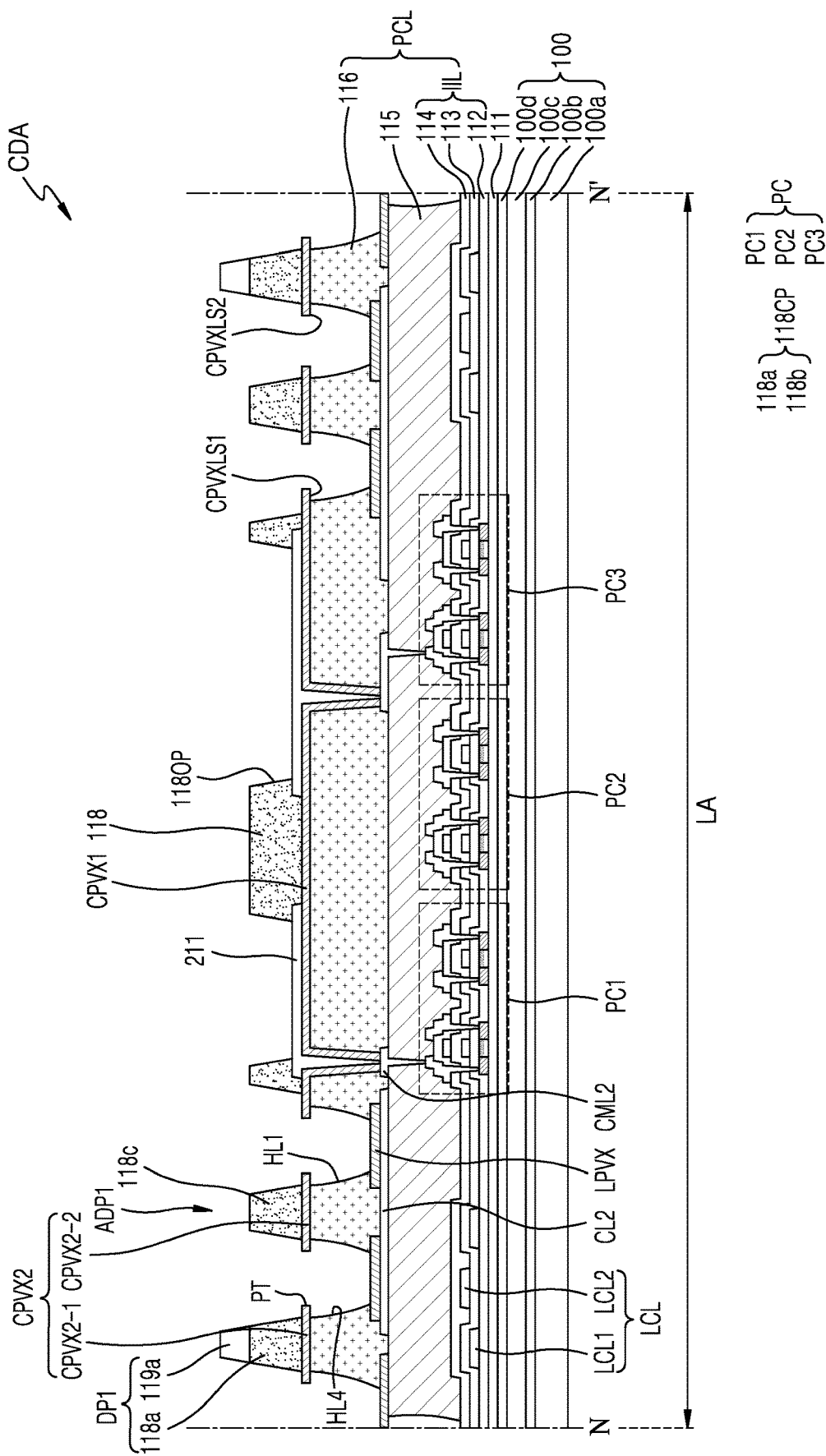

Referring to FIG. 18J, the first corner protective layer CPTL1 and the second corner protective layer CPTL2 may be removed. The first corner protective layer CPTL1 and the second corner protective layer CPTL2 may be removed through a wet etching process. According to an embodiment, the first corner protective layer CPTL1 and the second corner protective layer CPTL2 may be removed simultaneously with the protective layer PTL and the front protective layer FPTL of FIG. 16H.

Figure 18K:
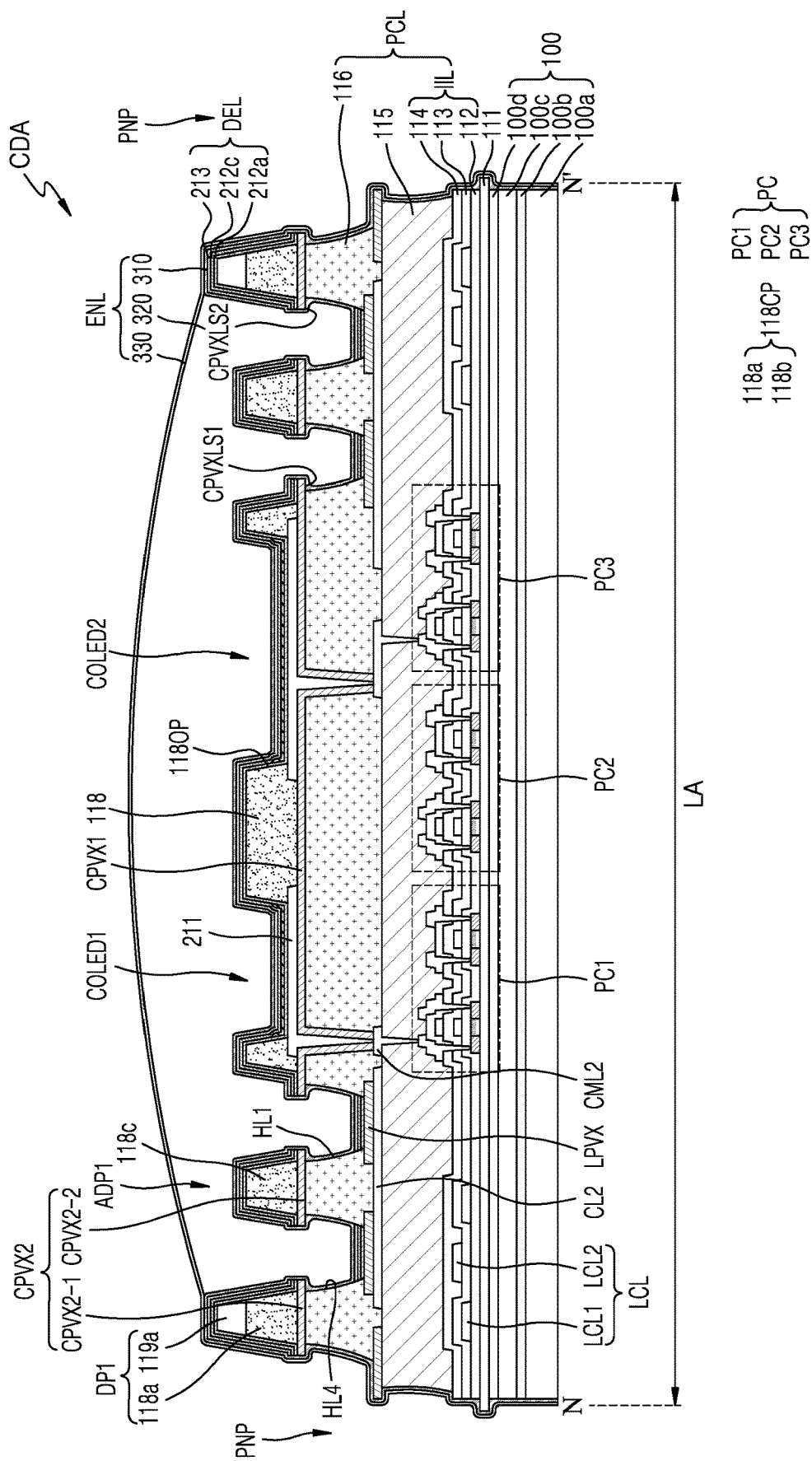

Referring to FIG. 18K, an intermediate layer and an opposite electrode 213 may be provided or formed on the corner display area CDA, such that a corner organic light-emitting diode COLED may be formed. Because each of the first corner inorganic pattern layer CPVX1 and the second corner inorganic pattern layer CPVX2 include a protruding tip protruding toward the center of the first hole HL1 and/or the fourth hole HL4, the first functional layer 212a, the second functional layer 212c, and the opposite electrode 213 may be disconnected based on the first hole HL1 and/or the fourth hole HL4.

The lower surface of the second corner inorganic pattern layer CPVX2 overlapping the first hole HL1 may not be in contact with the first functional layer 212a, the second functional layer 212c, and the opposite electrode 213. The lower surface CPVXLS1 of the first corner inorganic pattern layer CPVX1 overlapping the fourth hole HL4 and the lower surface CPVXLS2 of the second corner inorganic pattern layer CPVX2 overlapping the fourth hole HL4 may not be in contact with the first functional layer 212a, the second functional layer 212c, and the opposite electrode 213.

Therefore, in such an embodiment, infiltration of foreign matter or external moisture into the corner display area CDA through at least one of the first functional layer 212a and the second functional layer 212c may be prevented or reduced, such that the reliability of the display panel may be improved.

After the corner organic light-emitting diode COLED is formed, an encapsulation layer ENL may be formed. The encapsulation layer ENL may include at least one inorganic encapsulation layer and at least one organic encapsulation layer. In one embodiment, for example, the encapsulation layer ENL may include a first inorganic encapsulation layer 310, an organic encapsulation layer 320, and a second inorganic encapsulation layer 330. The first inorganic encapsulation layer 310 may be in contact with the protruding tips of the first corner inorganic pattern layer CPVX1 and the second corner inorganic pattern layer CPVX2. The lower surface CPVXLS1 of the first corner inorganic pattern layer CPVX1 overlapping the first hole HL1 may be in contact with the first inorganic encapsulation layer 310. The lower surface of the second corner inorganic pattern layer CPVX2 overlapping the first hole HL1 and the lower surface CVPXLS2 of the second corner inorganic pattern layer CPVX2 overlapping the fourth hole HL4 may be in contact with the first inorganic encapsulation layer 310.

According to an embodiment, the first inorganic encapsulation layer 310 may be in contact with the lower inorganic pattern layer LPVX. In such an embodiment, the first inorganic encapsulation layer 310 may be in contact with the inorganic insulating layer IIL.

According to an embodiment, the organic encapsulation layer 320 may extend to the first dam DP1. The first dam DP1 may control the flow of the organic material forming the organic encapsulation layer 320.

The second inorganic encapsulation layer 330 may be provided or formed on the organic encapsulation layer 320. The second inorganic encapsulation layer 330 may be in contact with the first inorganic encapsulation layer 310 on the first dam DP1.

Subsequently, a penetrating portion PNP may be formed to separate a plurality of neighboring extension areas LA from each other.

In embodiments of the invention, as described above, the upper inorganic pattern layer includes the protruding tip protruding toward the center of the outer groove of the insulating layer or the center of the outer through hole of the insulating layer on the insulating layer, such that the reliability of the display device may be improved.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
  a substrate;
  a display area disposed on the substrate and comprising a front display area and a corner display area bent at a corner of the substrate;
  a peripheral area outside the display area, wherein the peripheral area includes:
    a first portion outside the front display area;
    a second portion outside the corner display area; and
    a third portion between the first and second portions;
  an insulating layer disposed on the substrate and having an outer groove or an outer through hole disposed in the first to third portions;
  a first display element disposed on the insulating layer and in the front display area;
  a second display element disposed on the insulating layer and in the corner display area;
  a first and second upper inorganic pattern layers disposed on the insulating layer and spaced apart from each other in the first to third portions; and
  a first and second organic pattern layers respectively disposed on the first and second upper inorganic pattern layers and spaced apart from each other.

2. The display device of claim 1, wherein the first and second upper inorganic pattern layers extend between the front display area and the corner display area.

3. The display device of claim 1, wherein the first and second display elements respectively comprise:
  a first electrode disposed on the insulating layer;
  an intermediate layer disposed on the first electrode and including a light-emitting layer and a functional layer; and
  a second electrode disposed on the intermediate layer, and
  wherein the functional layer is disposed on upper surfaces of the first and second organic pattern layers in the third portion, and is not disposed on upper surfaces of the first and second organic pattern layers in the first portion.

4. The display device of claim 3, wherein
the functional layer is disposed in the outer groove or the outer through hole between the first and second organic pattern layers in the third portion, and
the functional layer disposed in the outer groove or the outer through hole is discontinuous with the functional layer disposed on the upper surfaces of the first and second organic pattern layers.

5. The display device of claim 3, wherein
the functional layer is not disposed on the upper surfaces of the first and second organic pattern layers in the second portion.

6. The display device of claim 3, wherein
the second electrode is disposed on the upper surfaces of the first and second organic pattern layers in the third portion, and is not disposed on the upper surfaces of the first and second organic pattern layers in the first portion.

7. The display device of claim 6, wherein
the second electrode is disposed in the outer groove or the outer through hole between the first and second organic pattern layers in the third portion, and
the second electrode disposed in the outer groove or the outer through hole is discontinuous with the second electrode disposed on the upper surfaces of the first and second organic pattern layers.

8. The display device of claim 6, wherein
the second electrode is disposed on the upper surfaces of the first and second organic pattern layers in the second portion.

9. The display device of claim 1, wherein
the first organic pattern layer is disposed farther from the front display area than the second organic pattern layer, and
a thickness of the first organic pattern layer is greater than a thickness of the second organic pattern layer.

10. The display device of claim 9, further comprising an encapsulation layer on the second electrode and covering the display area, wherein
the encapsulation layer comprises a first inorganic encapsulation layer, a second inorganic encapsulation layer, and an organic encapsulation layer between the first and second inorganic encapsulation layers, and
the first and second inorganic encapsulation layers are in direct with each other on an upper surface of the first organic pattern layer in the first to third portions.

11. The display device of claim 10, wherein
the first and second inorganic encapsulation layers extend from the upper surface of the first organic pattern layer toward an edge of the substrate.

12. The display device of claim 1, wherein the insulating layer comprises an organic material.

13. The display device of claim 12, further comprising:
an inorganic insulating layer disposed between the substrate and the insulating layer; and
a wiring disposed between the insulating layer and the inorganic insulating layer, and
wherein the wiring is electrically connected to an opposite electrodes of the first and second display elements.

14. A display device comprising:
a substrate;
a front display area disposed on the substrate;
a corner display area bent at a corner of the substrate;
a middle display area disposed between the front display area and the corner display area;
an encapsulation layer encapsulating the front display area and the middle display area;
a first dam surrounding the front display area and the middle display area and comprising a first organic pattern; and
a second dam outside the first dam, surrounding the first dam, and comprising a second organic pattern, wherein
the front display area and the middle display area comprise a first display element,
the first display element comprises a first electrode, an intermediate layer on the first electrode, and second electrode on the intermediate layer, the intermediate including a light-emitting layer and a functional layer;
the encapsulation layer comprises a first inorganic encapsulation layer, a second inorganic encapsulation layer, and an organic encapsulation layer between the first and second inorganic encapsulation layers,
the first inorganic encapsulation layer is in direct contact with upper surfaces of the first and second dams between the front display area and an edge of the substrate, the first inorganic encapsulation layer being connected to each other between the first and second dams, and
the functional layer is in direct contact with the upper surfaces of the first and second dams between the middle display area and an edge of the substrate, the functional layer being disconnected between the first and second dams.

15. The display device of claim 14, wherein
the first and second inorganic encapsulation layers contact each other on the upper surfaces of the first and second dams between the front display area and the edge of the substrate and between the middle display area and the edge of the substrate, and
the first and second inorganic encapsulation layers extend toward the edge of the substrate.

16. The display device of claim 14, wherein
the second electrode is disposed over the upper surfaces of the first and second dams between the middle display area and the edge of the substrate, and the second electrode being disconnected between the first and second dams.

17. The display device of claim 14, wherein
the functional layer is direct contact with the upper surfaces of the first and second dams between the middle display area and the corner display area, and the functional layer being disconnected between the first and second dams.

18. The display device of claim 14, further comprising;
an inorganic insulating layer disposed between the substrate and the first organic pattern and between the substrate and the second organic pattern; and
a wiring disposed between the inorganic insulating layer and the first organic pattern and between the inorganic insulating layer and the second organic pattern.

19. The display device of claim 18 wherein the wiring is electrically connected to the second electrode.

20. The display device of claim 14, wherein a thickness of the first organic pattern is greater than a thickness of the second organic pattern.

* * * * *